US012604519B2

(12) United States Patent
Lin et al.

(10) Patent No.: US 12,604,519 B2
(45) Date of Patent: Apr. 14, 2026

(54) SEMICONDUCTOR STRUCTURE HAVING MULTIPLE NANOSTRUCTURES WITH DIFFERENT WIDTHS AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Ming-Heng Tsai, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 382 days.

(21) Appl. No.: 18/317,539

(22) Filed: May 15, 2023

(65) Prior Publication Data

US 2024/0387525 A1      Nov. 21, 2024

(51) Int. Cl.
*H10D 84/83* (2025.01)
*H10D 84/01* (2025.01)
*H10D 84/03* (2025.01)

(52) U.S. Cl.
CPC ..... *H10D 84/8311* (2025.01); *H10D 84/0128* (2025.01); *H10D 84/038* (2025.01); *H10D 84/83* (2025.01)

(58) Field of Classification Search
CPC ................ H10D 30/01; H10D 30/014; H10D 30/019–0198; H10D 30/43; H10D 30/435; H10D 30/501–509; H10D 30/62; H10D 62/119; H10D 62/121; H10D 84/01; H10D 84/0128; H10D 84/0158;

H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Cheung Lee

(74) *Attorney, Agent, or Firm* — Birch, Stewart, Kolasch & Birch, LLP

(57) ABSTRACT

Semiconductor structures and methods for manufacturing the same are provided. The semiconductor structure includes first nanostructures formed over a substrate along a first direction, and second nanostructures formed over the substrate along the first direction. The semiconductor structure includes a first gate structure formed over the first nanostructures and the second nanostructures along a second direction. Each of the first nanostructures has a first width along the second direction, each of the second nanostructures has a second width along the second direction, and the first width is smaller than the second width. The semiconductor structure includes a first base fin structure below the first nanostructures, and the first base fin structure has a first base width. The first base width is greater than the first width.

20 Claims, 65 Drawing Sheets

(56)                    References Cited

U.S. PATENT DOCUMENTS

| | | | |
|---|---|---|---|
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0043926 A1* | 2/2020 | Ohtou ................ | H10D 84/0179 |

* cited by examiner

100a

166

164

162

152

150

156

154

140

136a

136b

128'

138

116

116

102

A                                                                    A'

11                                              12

100a

168

142a

164

162

152

104a　　　104b

150

142a-1　　142a-2

SW₁　　　SW₂

148a　　　148b

108'　　　146

108'　　　108'

144

116　　　116

102

105a　　105b
BW₁　　　BW₂

B　　　　　　　　　　B'

11　　　　12

100c

168

164
162
152

142a 104a     104b

150

142a-1     142a-2

SW₁     SW₂

148a     148b

108'

146
108'
144

108'

116     116
102

105a     105b
BW₁     BW₂

B     B'

11     12

100d

168

164
162
152
150

142a 104a                                        104b 142a-1                                                                  142a-2

SW₁                                              SW₂

148a                                                                    148b

108'

146
108'                                                                    108'
144

116                                                                     116

102

105a                                          105b
BW₁                                             BW₂

B                                                                        B'

I1                                    I2

100f

168

164
162
142a
104a     104b
152
150
142a-1     142a-2

$SW_1$     $SW_2$ 148a     148b

108'

108'     146
    108'
    144

116     116
102

105a     105b
$BW_1$     $BW_2$

B     B'

11     12

SEMICONDUCTOR STRUCTURE HAVING MULTIPLE NANOSTRUCTURES WITH DIFFERENT WIDTHS AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 3A-2 to 3M-2 illustrate cross-sectional representations of various stages of manufacturing the semiconductor structure shown along line B-B' in FIG. 1E and in FIG. 2, in accordance with some embodiments.

FIGS. 3A-3 to 3M-3 illustrate cross-sectional representations of various stages of manufacturing the semiconductor structure shown along lines $C_1$-$C_1'$ and $C_2$-$C_2'$ in FIG. 1E and in FIG. 2, in accordance with some embodiments.

FIG. 3L-2' illustrate cross-sectional representations of various stages of manufacturing a semiconductor structure, in accordance with some embodiments.

DETAILED DESCRIPTION

Figure 1A:
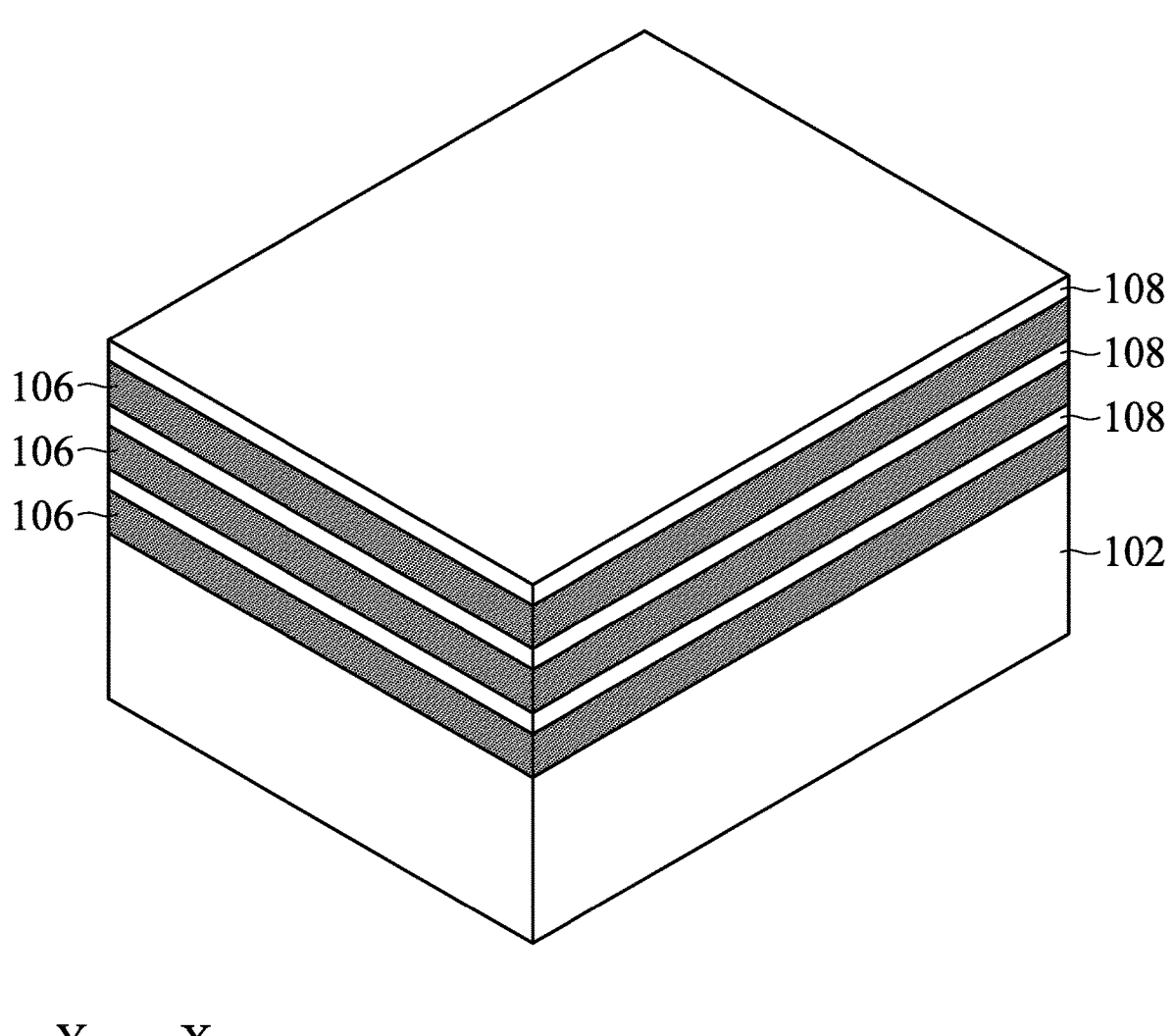
FIGS. 1A to 1H illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a first fin structure and a second fin structure formed over a substrate. The first fin structure includes first nanostructures, and the second fin structure includes second nanostructures along a first direction (e.g. x-axis). A first gate structure formed over the first nanostructures and a first S/D structure adjacent to the first gate structure. For power saving or power efficiency, the portion of the first fin structure is removed to reduce the width of the first nanostructures. The width of each of the first nanostructures is smaller width than that of the second nanostructures. The reduced width of the first nanostructures can applied to low power device for power saving. Therefore, the performance of the semiconductor structure is improved. The source/drain (S/D) structure or region(s) may refer to a source or a drain, individually or collectively dependent upon the context.

FIGS. 1A to 1H illustrate perspective views of intermediate stages of manufacturing a semiconductor structure 100a, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
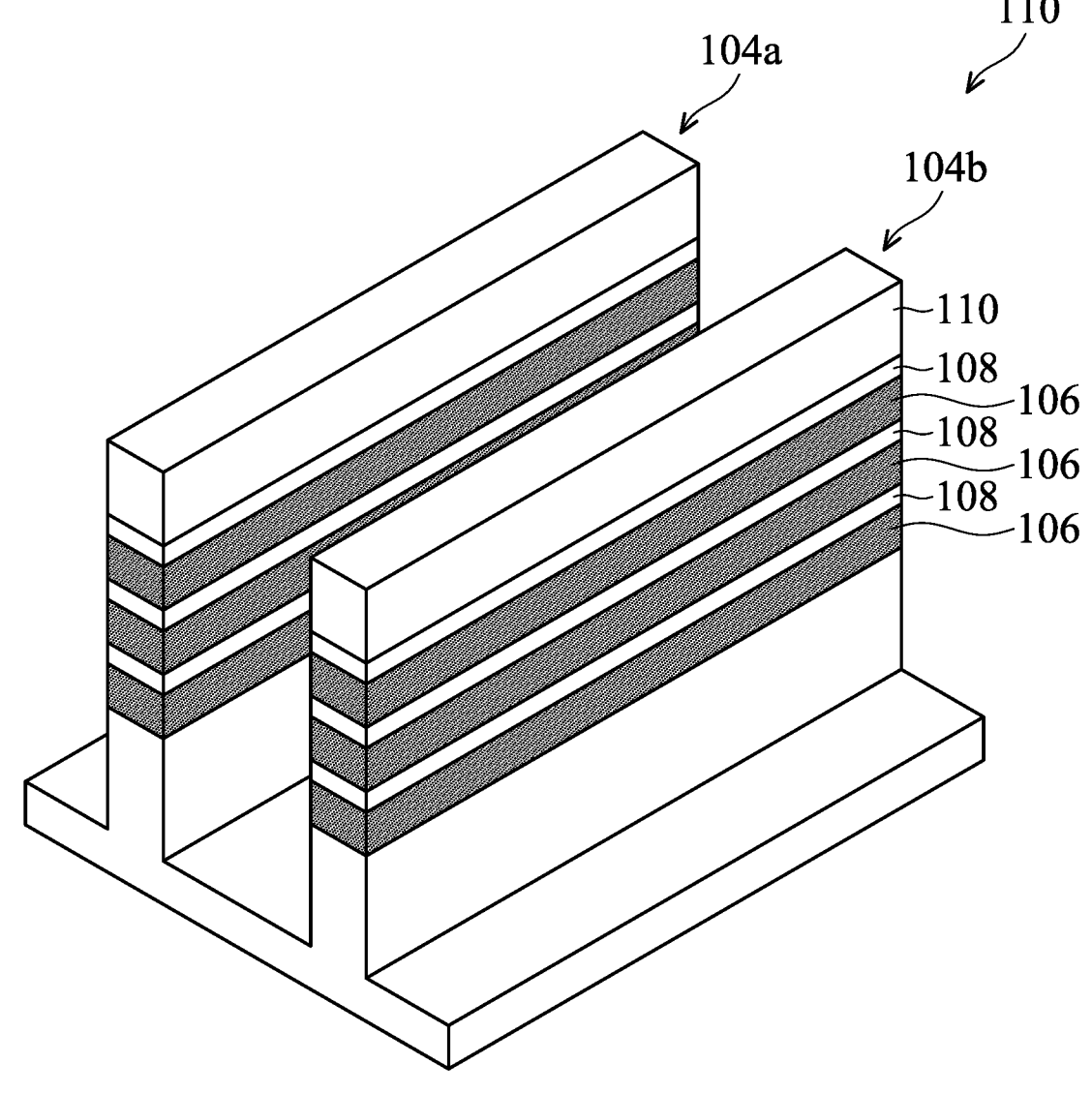

Afterwards, as shown in FIG. 1B, after the first semiconductor material layers 106 and the second semiconductor material layers 108 are formed as a semiconductor material stack over the substrate 102, the semiconductor material stack is patterned to form a first fin structure 104a and a second fin structure 104b, in accordance with some embodiments. In some embodiments, each of the first fin structure 104a and a second fin structure 104b includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer and a nitride layer formed over the pad oxide layer. The pad oxide layer may be made of silicon oxide, which is formed by thermal oxidation or chemical vapor deposition (CVD), and the nitride layer may be made of silicon nitride, which is formed by chemical vapor deposition (CVD), such as low-temperature chemical vapor deposition (LPCVD) or plasma-enhanced CVD (PECVD).

Figure 1C:
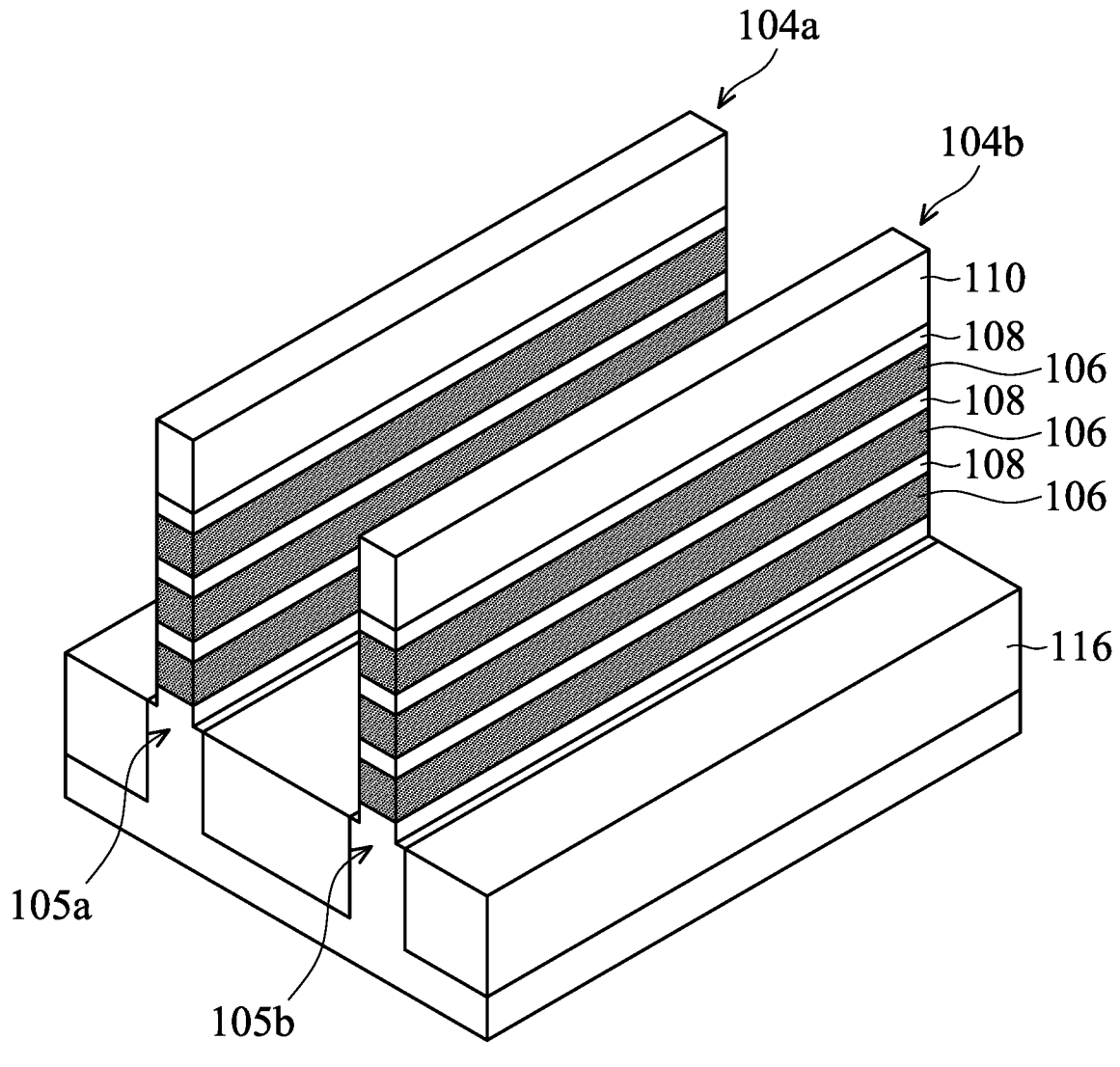

Next, as shown in FIG. 1C, after the first fin structure 104a and the second fin structure 104b is formed, an isolation structure 116 is formed around first fin structure 104a and the second fin structure 104b, in accordance with some embodiments. The isolation structure 116 is configured to electrically isolate active regions (e.g. the first fin structure 104a and the second fin structure 104b) of the semiconductor structure 100a and is also referred to as shallow trench isolation (STI) feature in accordance with some embodiments.

The isolation structure 116 may be formed by depositing an insulating layer over the substrate 102 and recessing the insulating layer so that the first fin structure 104a and the second fin structure 104b is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
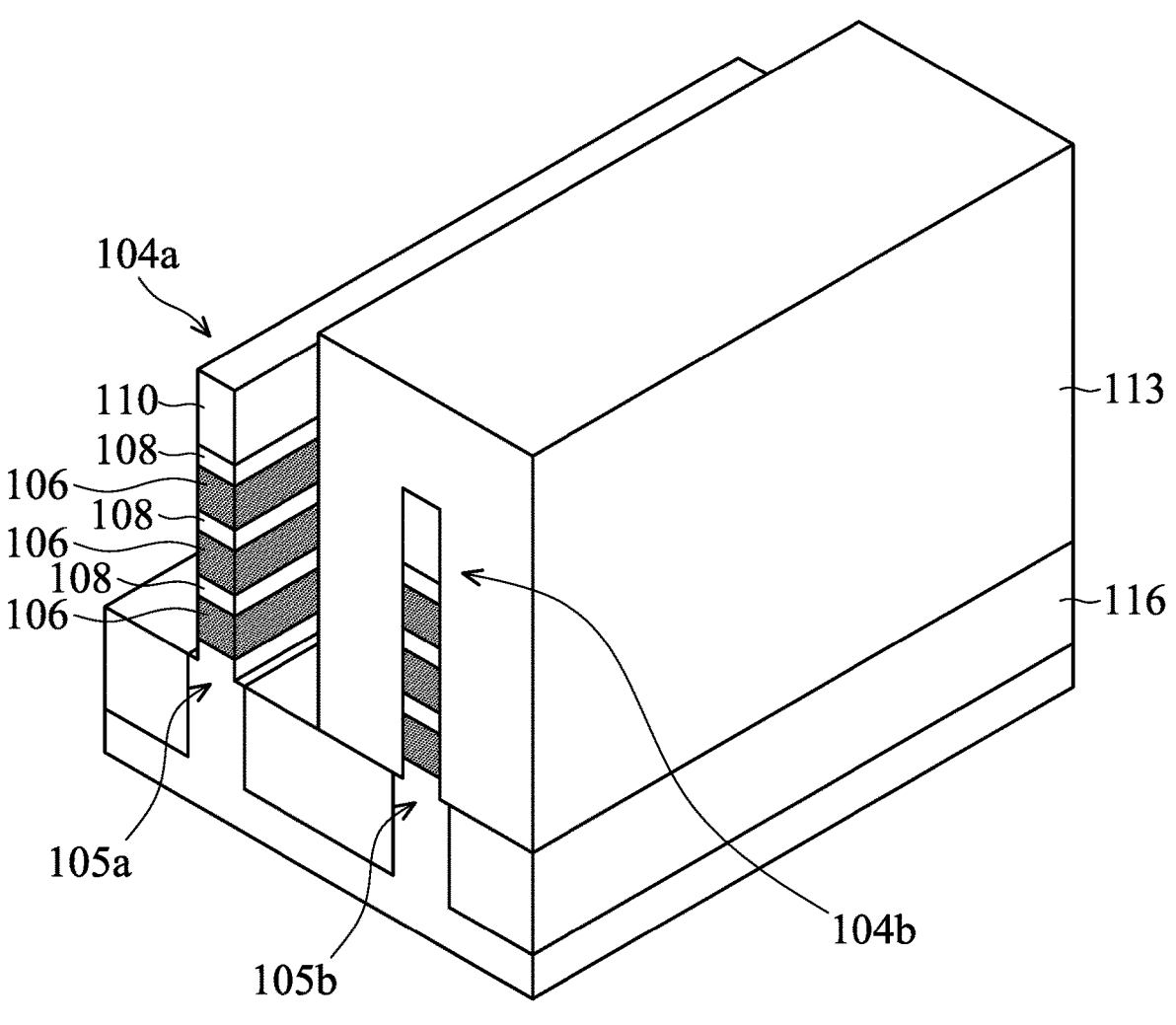

Afterwards, as shown in FIG. 1D, after the isolation structure 116 is formed, a mask layer 113 is formed over the second fin structure 104b, and the sidewall surfaces of the first fin structure 104a is exposed, in accordance with some embodiments. The mask layer 113 is used to protect the underlying layers in the subsequent etching process.

In some other embodiments, the mask layer 113 is made of photoresist layer. In some other embodiments, the mask layer 113 is a hard mask layer made of aluminum oxide ($Al_2O_3$), and another photoresist layer is formed over the mask layer 113.

Figure 1E:
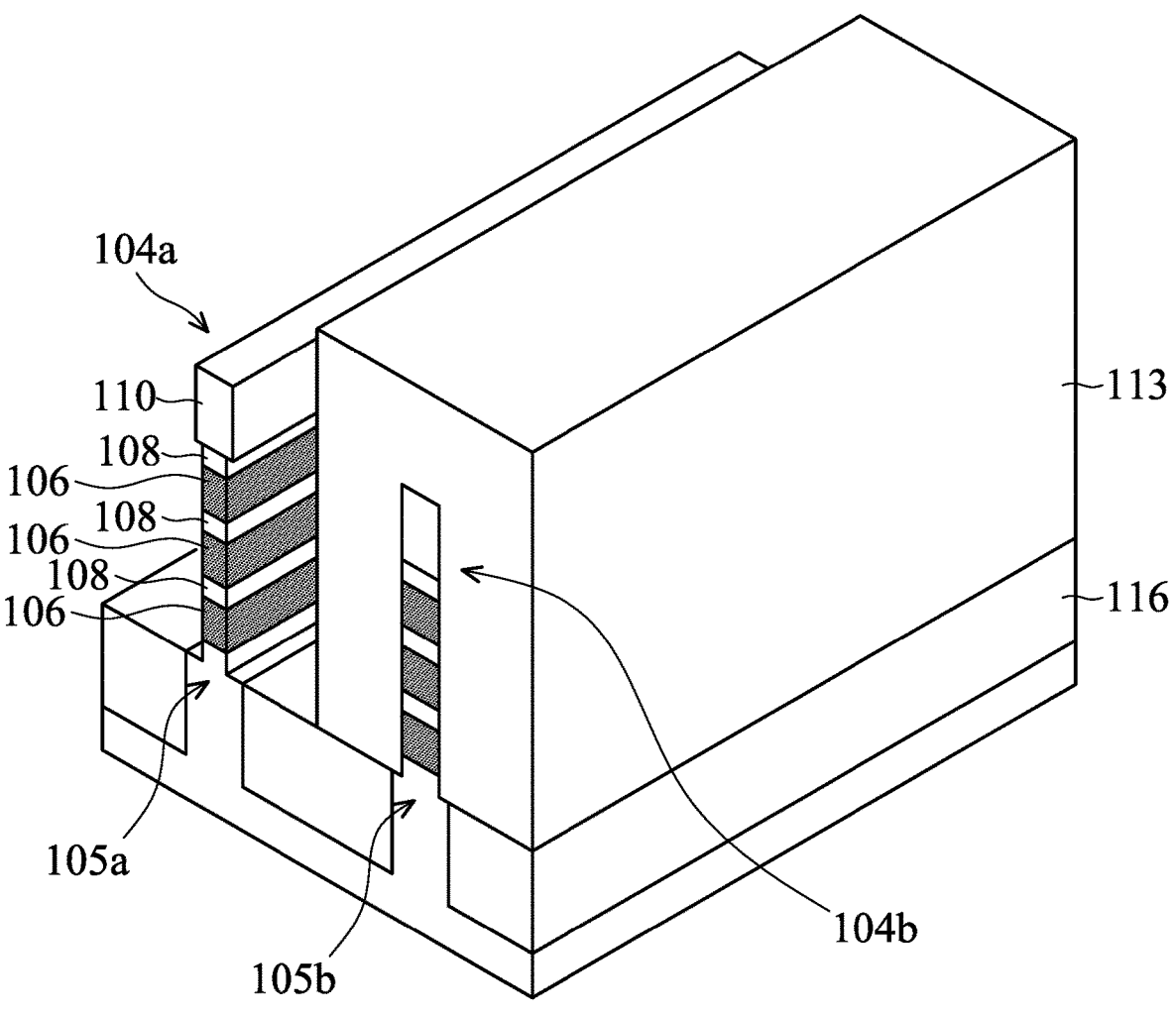

Next, as shown in FIG. 1E, a portion of the first fin structure 104a is removed by an etching process, in accordance with some embodiments. The portion of the first fin structure 104a is removed to reduce the width of the nanostructures 108' (formed later, or called as channel layers) to use as the channel layers of the low power device.

More specifically, the exposed sidewall portions of the first semiconductor material layers 106 and the exposed sidewall portions of the second first semiconductor material layers 108 are removed. In addition, the mask structure 110 may be slightly removed.

In some embodiments, the portion of the first fin structure 104a is removed by a wet etching process. In some embodiments, the wet etchant used in the etching process includes ammonium hydroxide ($NH_4OH$), and hydrogen peroxide ($H_2O_2$) and water.

Figure 1F:
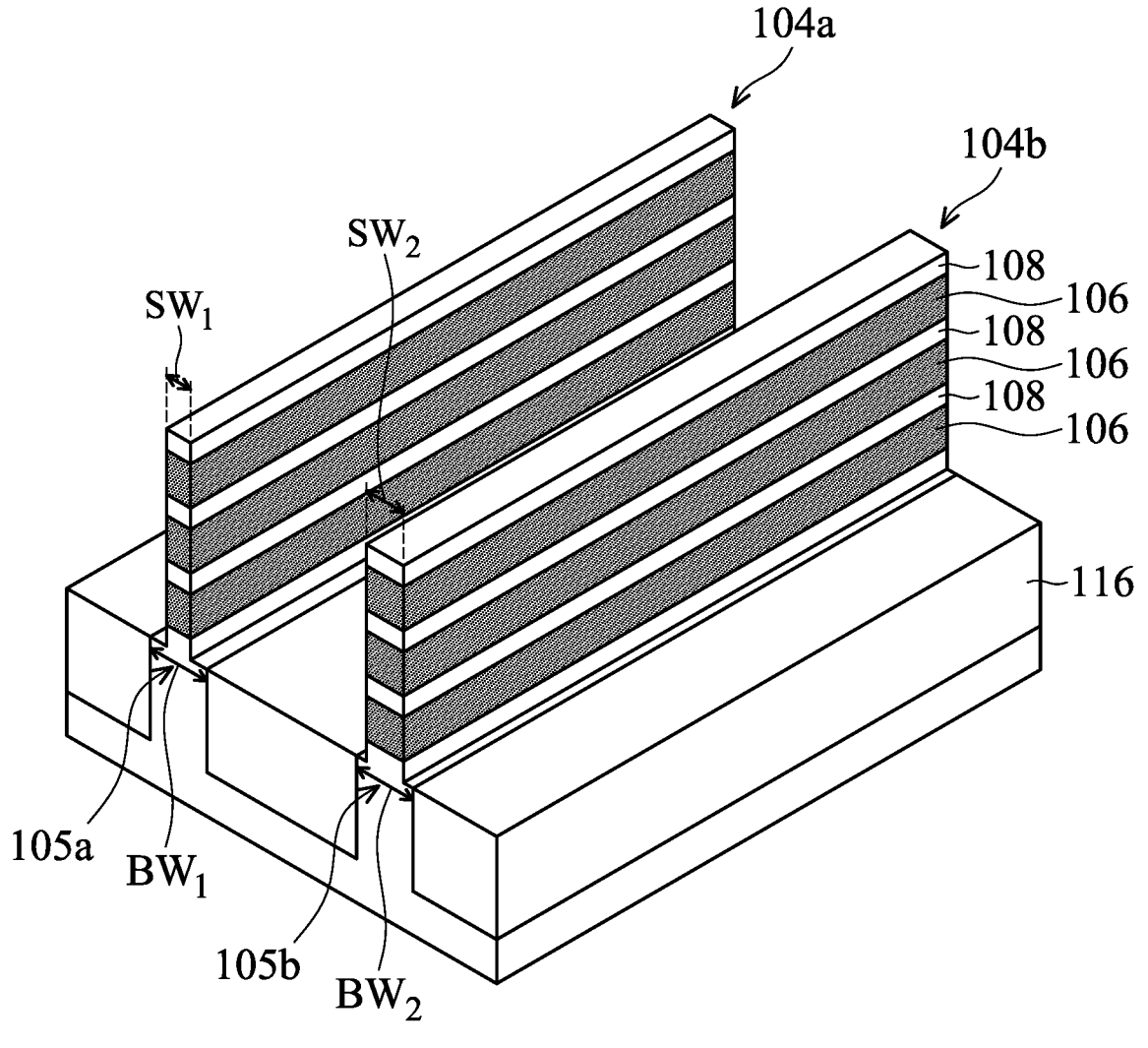

Afterwards, as shown in FIG. 1F, the mask layer 113 is removed, and then the mask structure 110 is removed, in accordance with some embodiments. As a result, the width of the first fin structure 104a is reduced.

The first fin structure 104a including the stack of the first semiconductor material layers 106 and the second semiconductor material layers 108 is formed over a first base fin structure 105a. The first base fin structure 105a has a first base width $BW_1$, and the first fin structure 104a has a first sheet width $SW_1$. The first base width $BW_1$ is greater than the first sheet width $SW_1$. The first base width $BW_1$ greater than the first sheet width $SW_1$ to provide robust support to prevent the collapse or being issue.

The second fin structure 104b including the stack of the first semiconductor material layers 106 and the second semiconductor material layers 108 is formed over a second base fin structure 105b. The second base fin structure 105b has a base width $BW_2$, and the second fin structure 104b has a second sheet width $SW_2$. The second base width $BW_2$ is greater than the second sheet width $SW_2$. In addition, the first sheet width $SW_1$ is smaller than the second sheet width $SW_2$. In some embodiments, the first sheet width $SW_1$ is in a range from about 3 nm to about 8 nm. In some embodiments, the second sheet width $SW_2$ is in a range from about 6 nm to about 20 nm. If the first sheet width $SW_1$ is greater than 8 nm, the power of the semiconductor layer may be not low enough. If the first sheet width $SW_1$ is lower than 3 nm, the first fin structure 104a does not have enough area for forming the S/D structure.

In some embodiments, the difference ($\Delta=BW_1-SW_1$) between the first base width $BW_1$ and the first sheet width $SW_1$ is greater than the difference ($\Delta=BW_2-SW_2$) between the second base width $BW_2$ and the second sheet width $SW_2$. In some embodiments, the difference ($\Delta=BW_1-SW_1$) between the first base width $BW_1$ and the first sheet width $SW_1$ is in a range from about 4 nm to about 16 nm.

Figure 1G:
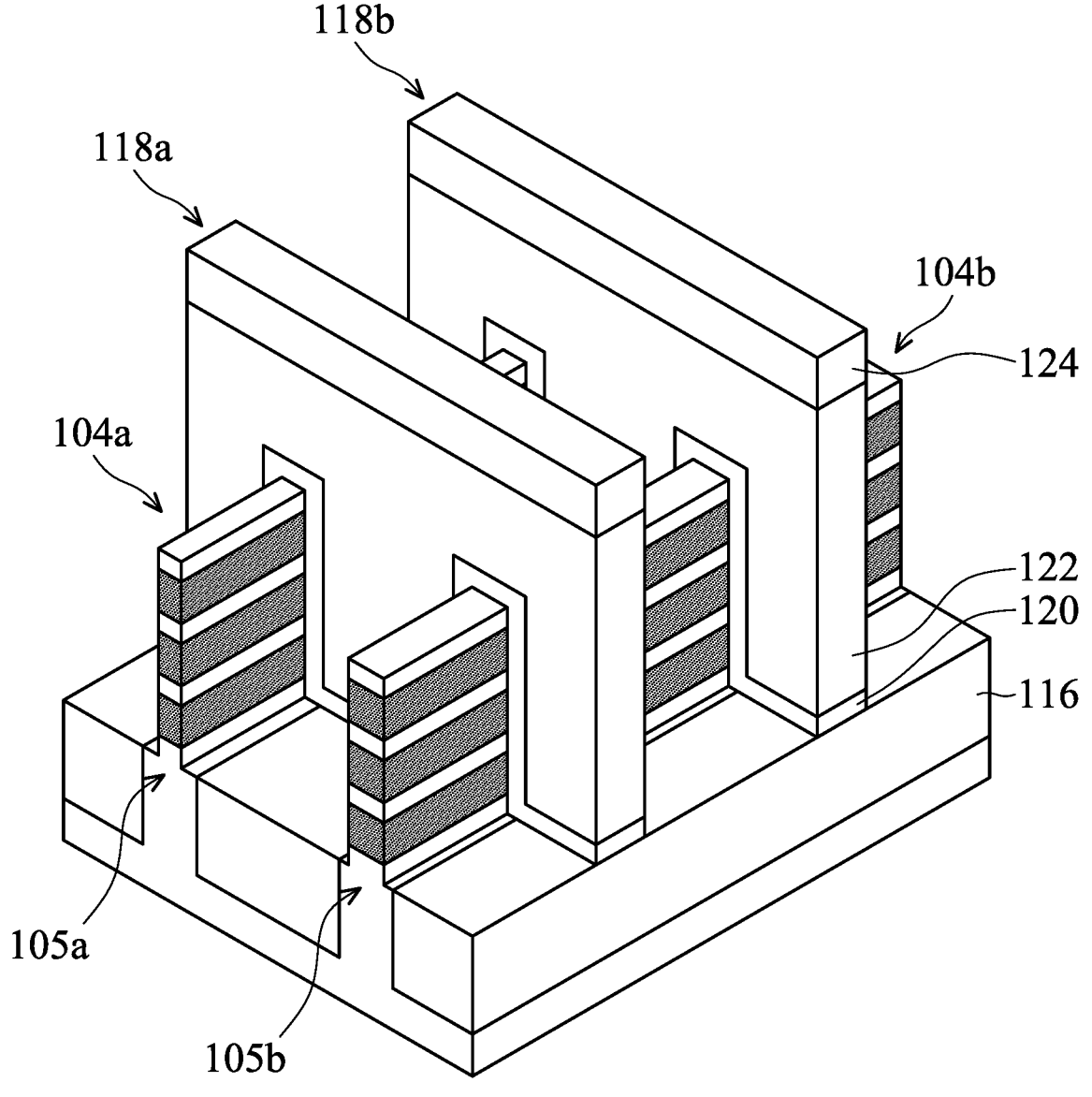

Next, as shown in FIG. 1G, a first dummy gate structure 118a and a second dummy gate structure 118b are formed across the first fin structure 104a and the second fin structure 104b and extend over the isolation structure 116, in accordance with some embodiments. The first dummy gate structures 118a and the second dummy gate structures 118b may be used to define the source/drain (S/D) regions and the channel regions of the resulting semiconductor structure 100a.

In some embodiments, each of the first dummy gate structures 118a and each of the second dummy gate structures 118b includes dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1H:
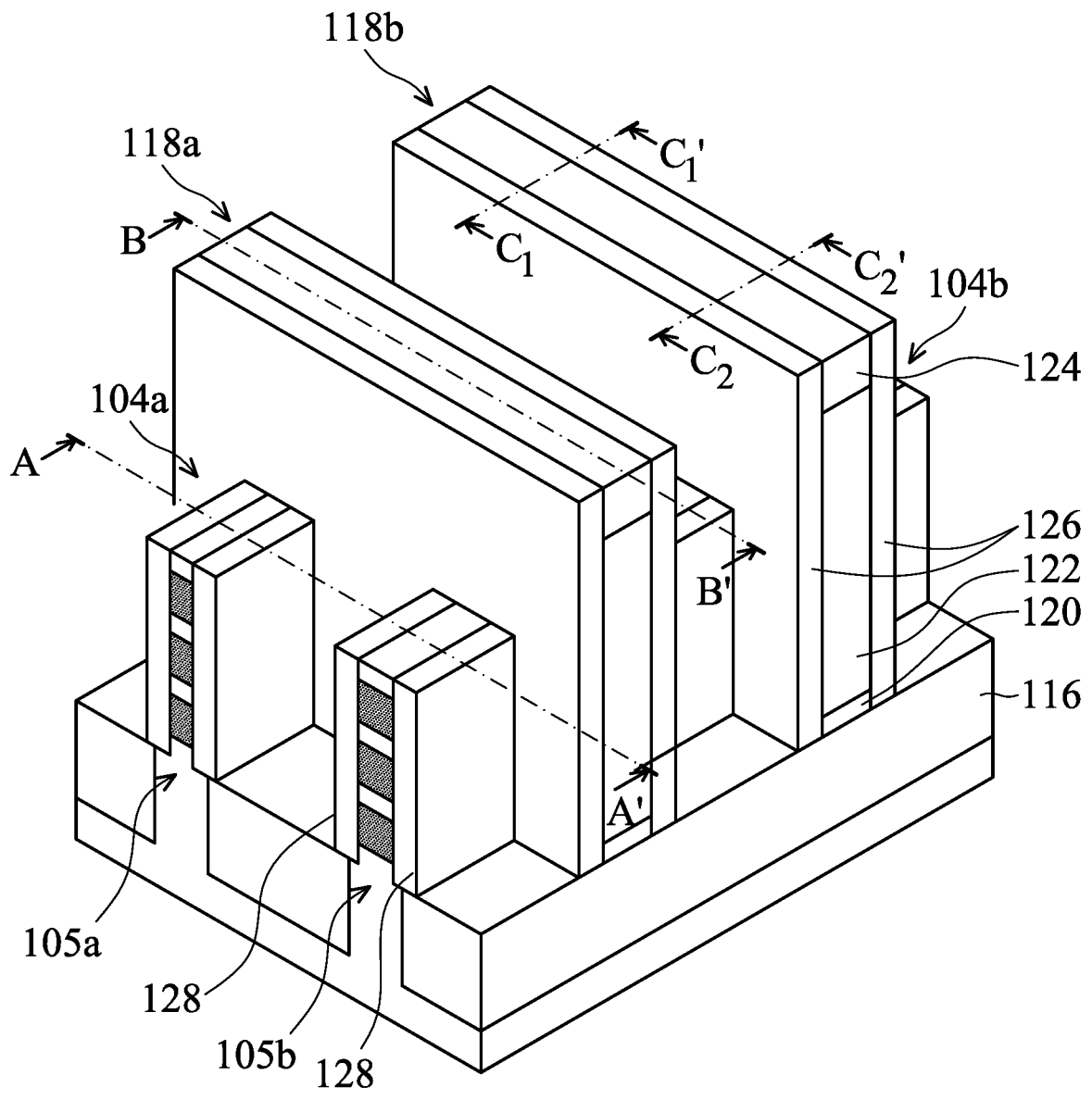

Next, as shown in FIG. 1H, after the dummy gate structures 118 are formed, gate spacer layers 126 are formed along and covering opposite sidewalls of the dummy gate structure 118 and fin spacer layers 128 are formed along and covering opposite sidewalls of the source/drain regions of the fin structure 104, in accordance with some embodiments.

The gate spacer layers 126 may be configured to separate source/drain (S/D) structures from the first dummy gate structure 118a, the second dummy gate structures 118b and support the first dummy gate structure 118a, the second dummy gate structure 118b, and the fin space layers 128 may be configured to constrain a lateral growth of subsequently formed source/drain structure and support the first fin structure 104a and the second fin structure 104b.

In some embodiments, the gate spacer layers 126 and the fin spacer layers 128 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 and the fin spacer layers 128 may include conformally depositing a dielectric material covering the first dummy gate structure 118a, the second dummy gate structure 118b, the first fin structure 104a, the second fin structure 104b and the isolation structure 116 over the substrate 102, and performing an anisotropic etching process, such as dry plasma etching, to remove the dielectric layer covering the top surfaces of the first dummy gate structure 118a, the second dummy gate structure 118b, the first fin structure 104a, the second fin structure 104b, and portions of the isolation structure 116.

Figure 2:
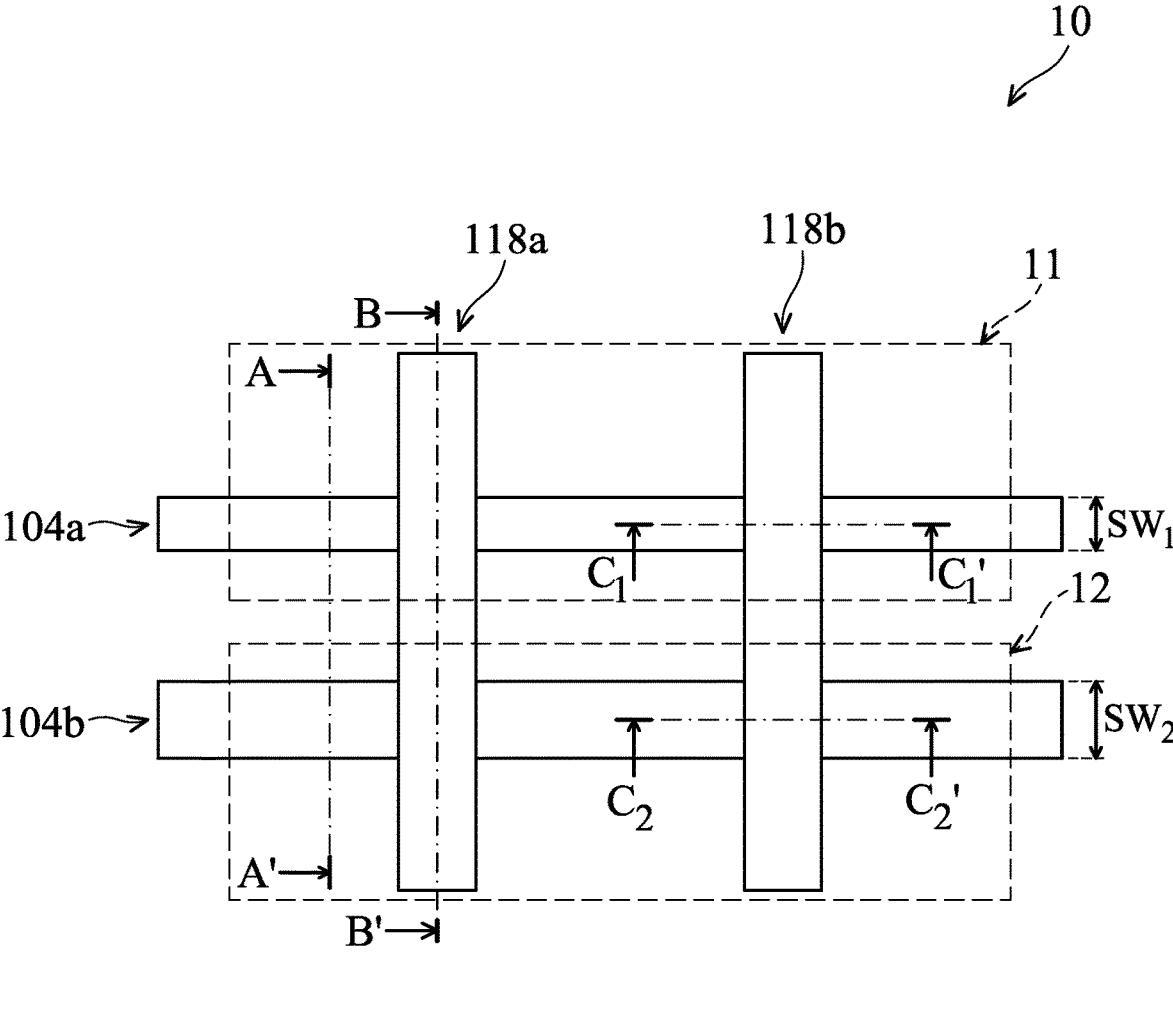
FIG. 2 shows a top-view representation of the semiconductor structure, in accordance with some embodiments.

FIG. 2 shows a top-view representation of the semiconductor structure 100a, in accordance with some embodiments. As shown in FIG. 2, the substrate 102 includes a first region 10, and the first region 10 includes a first sub-region 11 and a second sub-region 12. The first fin structure 104a is formed in the first sub-region 11 along a first direction (e.g. X-axis), and the second fin structure 104b is formed in the second sub-region 12 along the first direction (e.g. X-axis). The first fin structure 104a is parallel to the second fin structure 104b.

The first dummy gate structure 118a and the second dummy gate structure 118b are formed along a second direction (e.g. Y-axis). The first dummy gate structure 118a is parallel to the second dummy gate structure 118b. The first dummy gate structure 118a and the second dummy gate structure 118b are formed across the first fin structure 104a and the second fin structure 104b.

Figures 1, 3A:
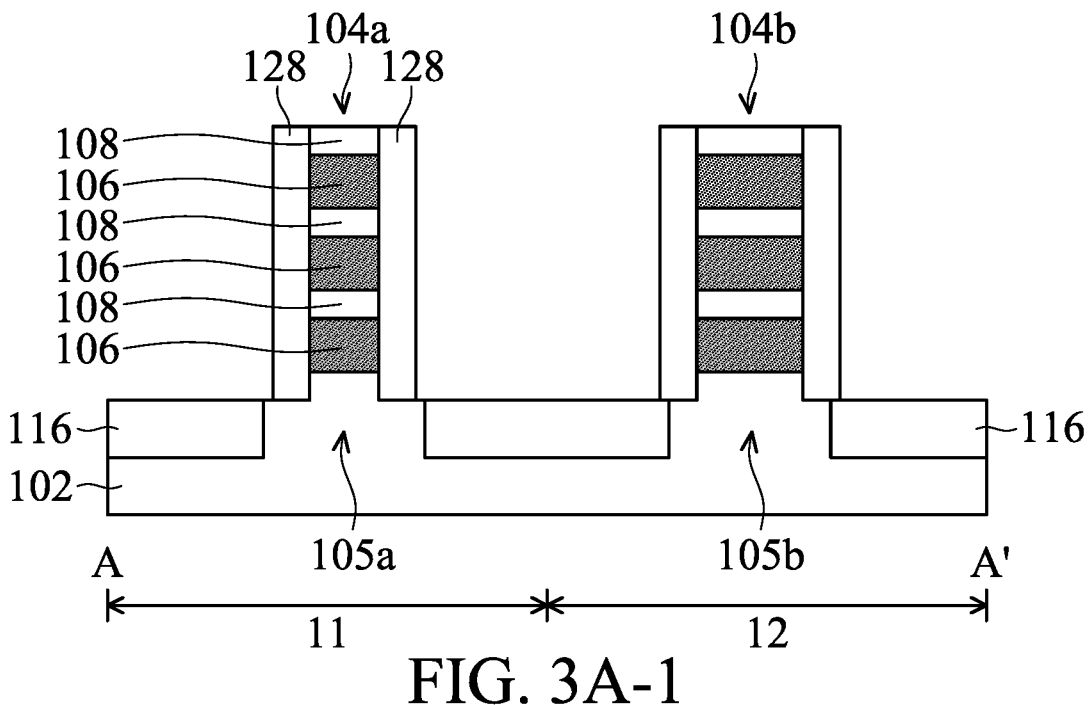
FIGS. 3A-1 to 3M-1 illustrate cross-sectional representations of various stages of manufacturing the semiconductor structure shown along line A-A' in FIG. 1E and in FIG. 2, in accordance with some embodiments.
Figures 2, 3A:
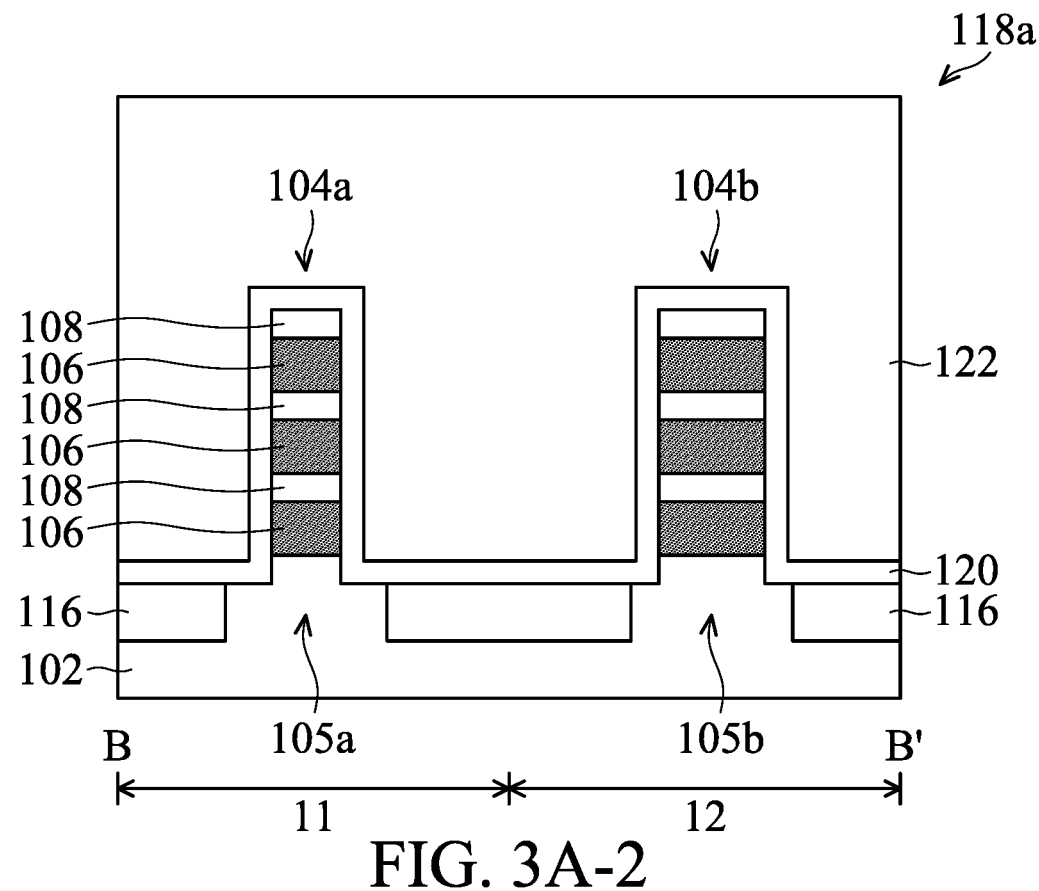
Figures 3, 3A:
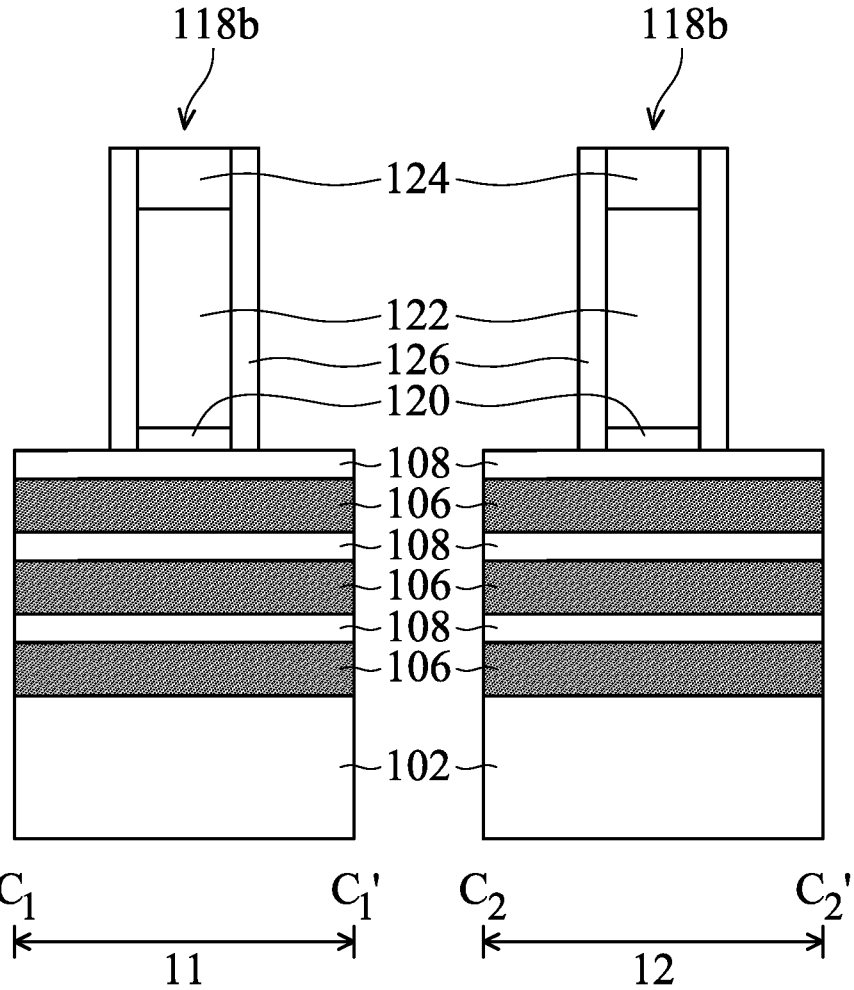
Figures 1, 3B:
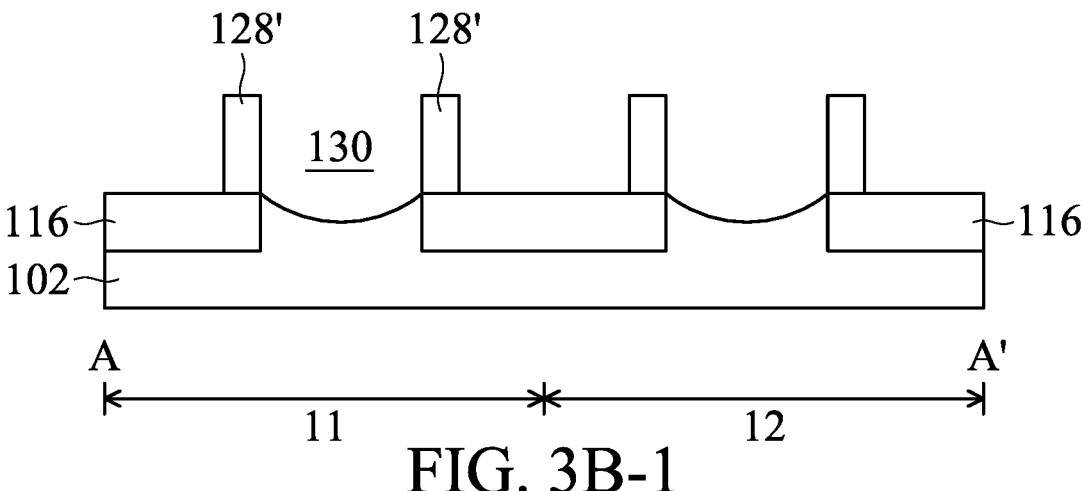
Figures 2, 3B:
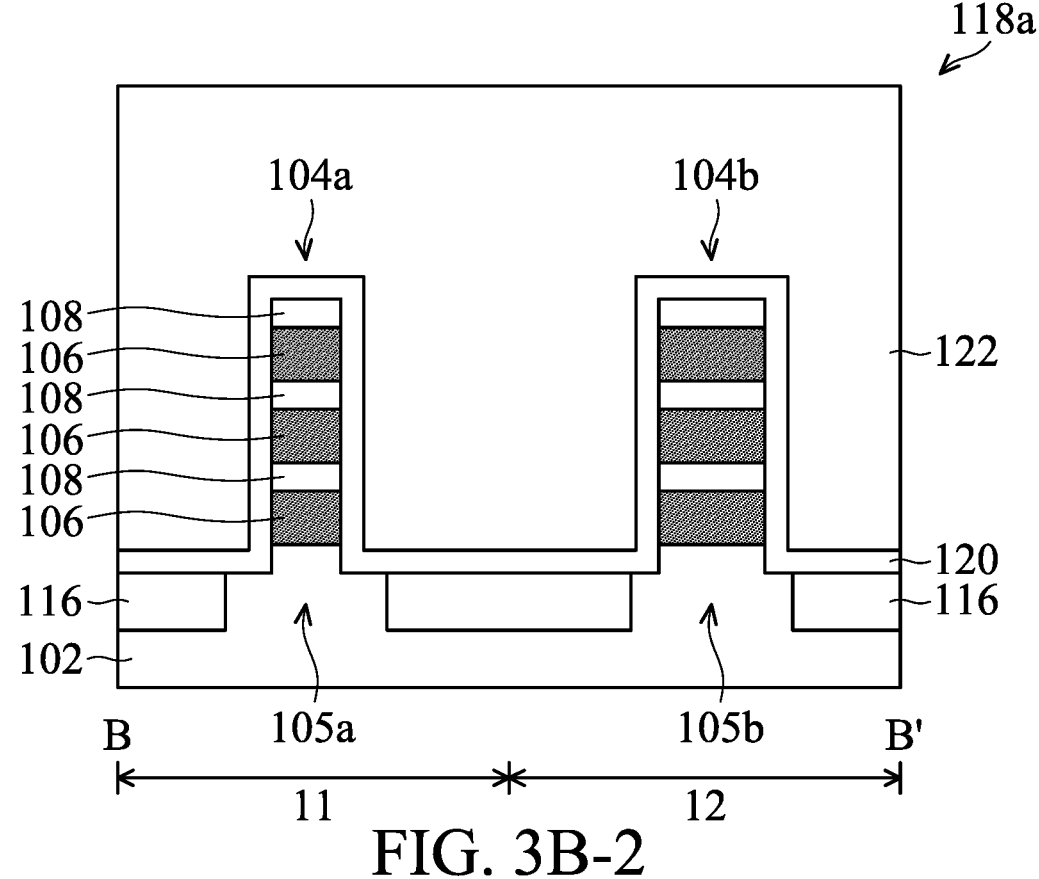
Figures 3, 3B:
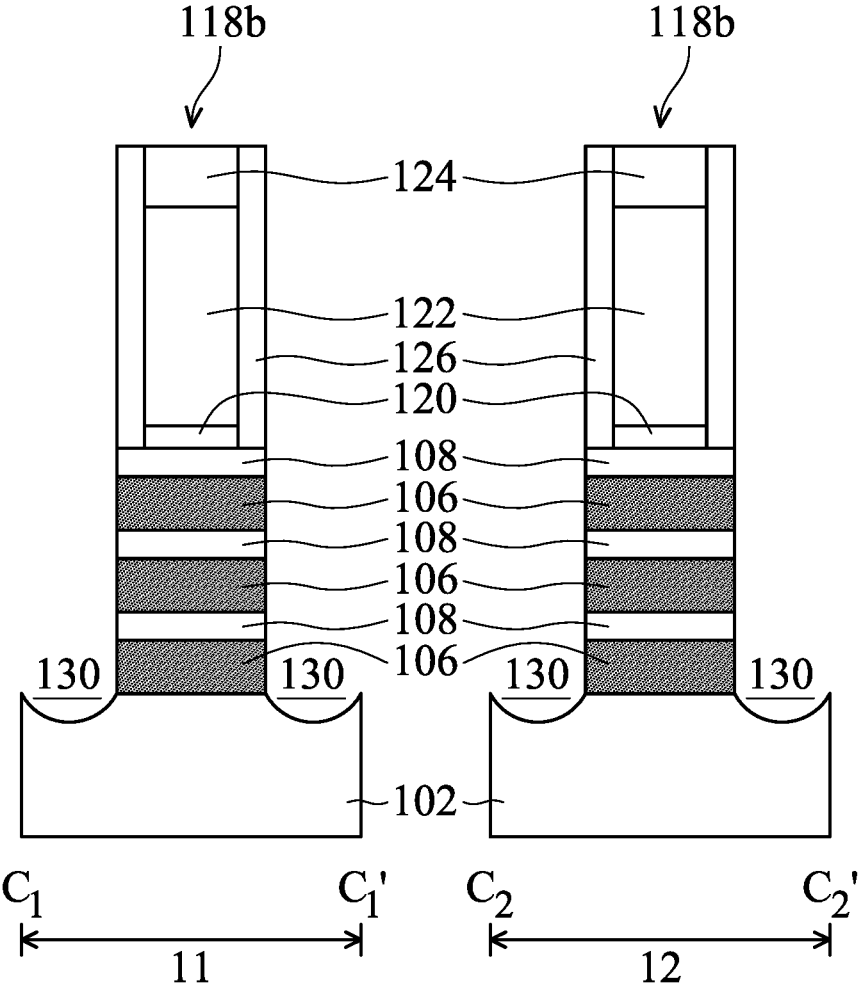
Figures 1, 3C:
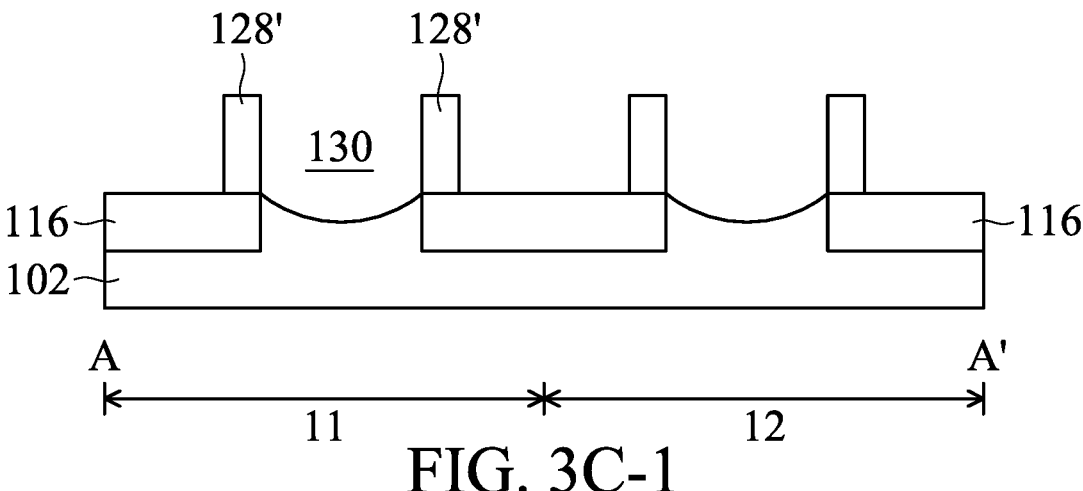
Figures 2, 3C:
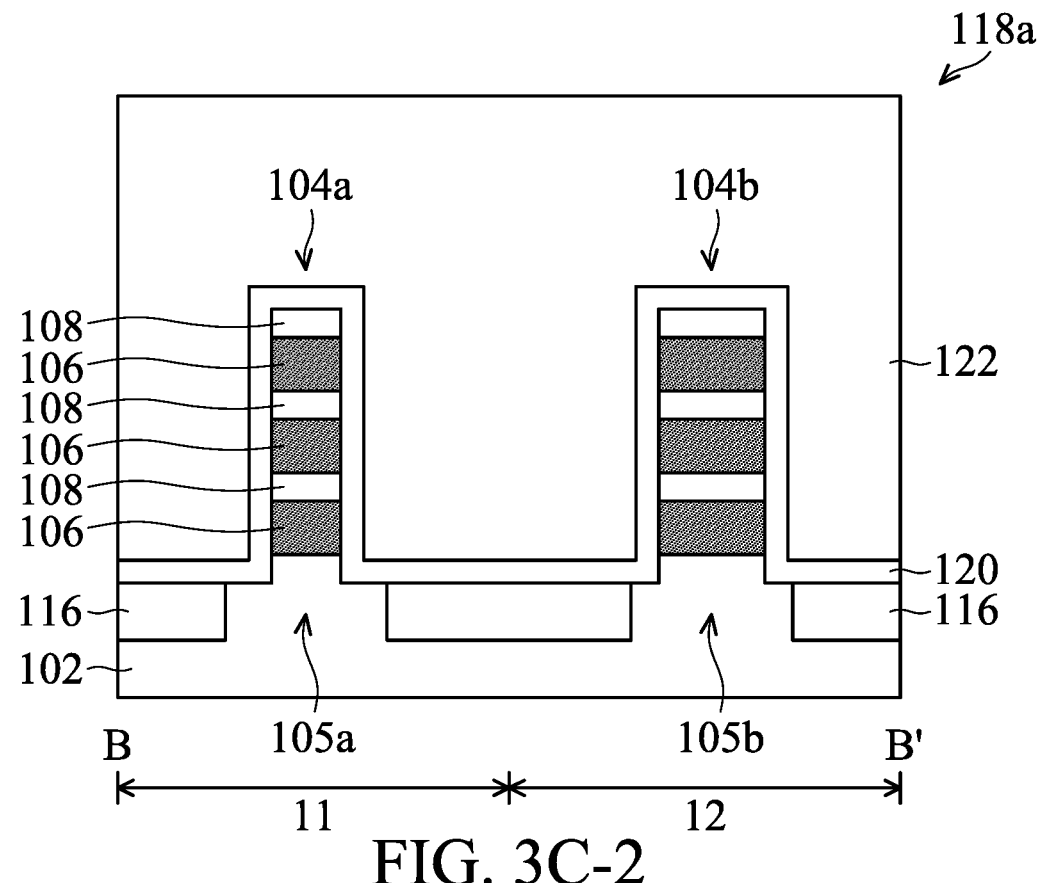
Figures 3, 3C:
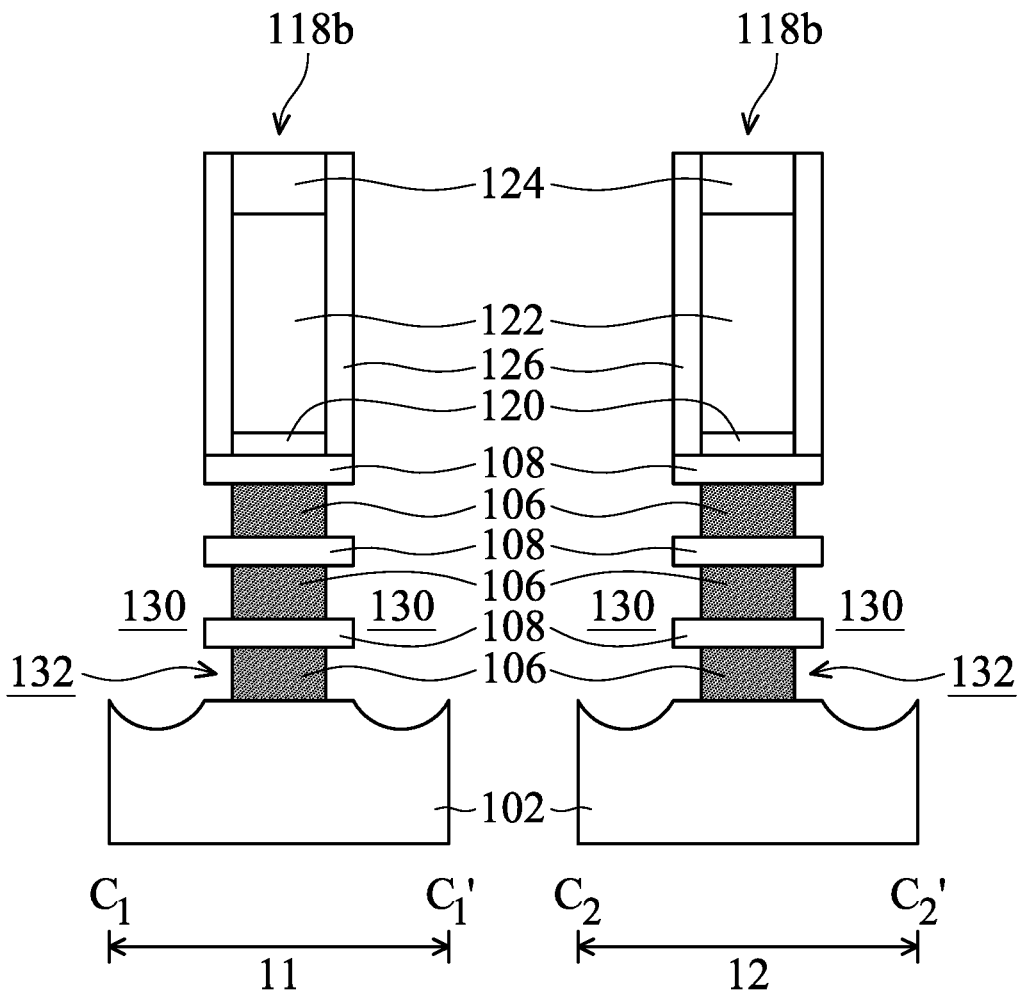
Figures 1, 3D:
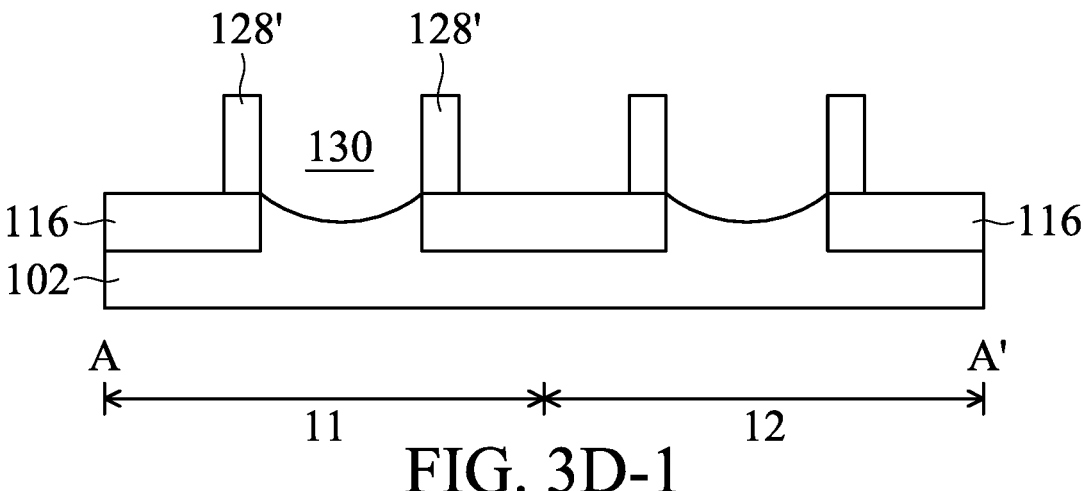
Figures 2, 3D:
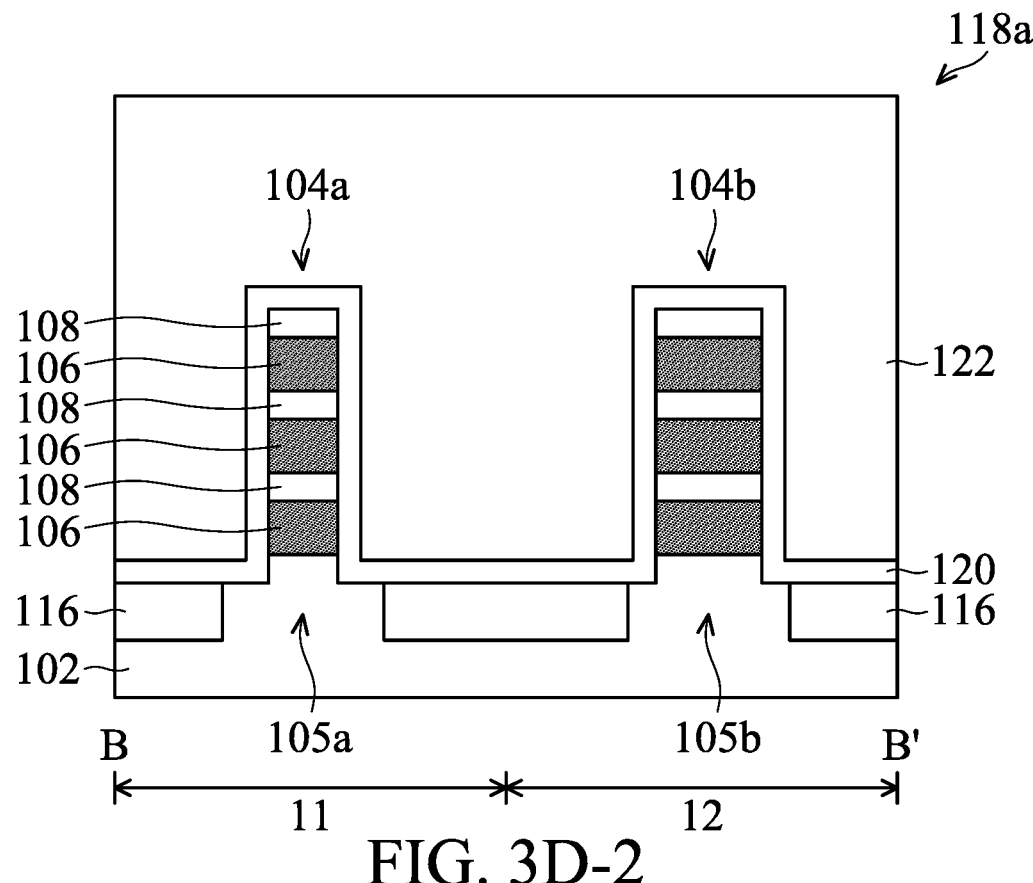
Figures 3, 3D:
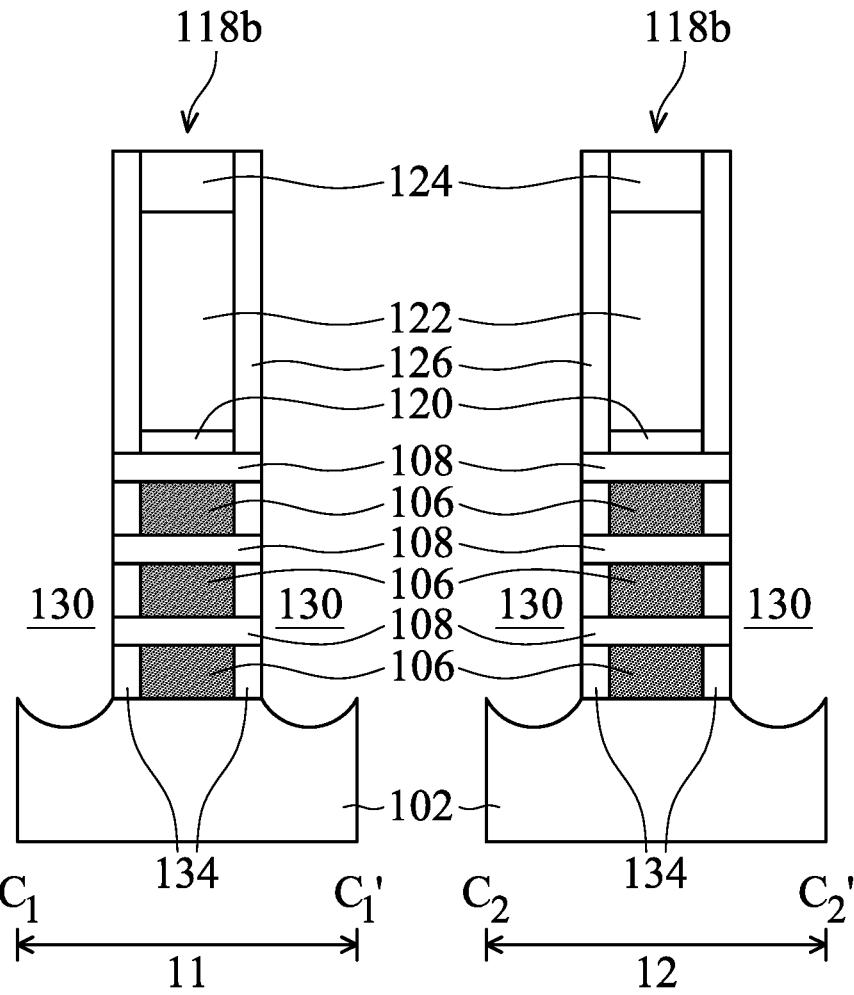
Figures 1, 3E:
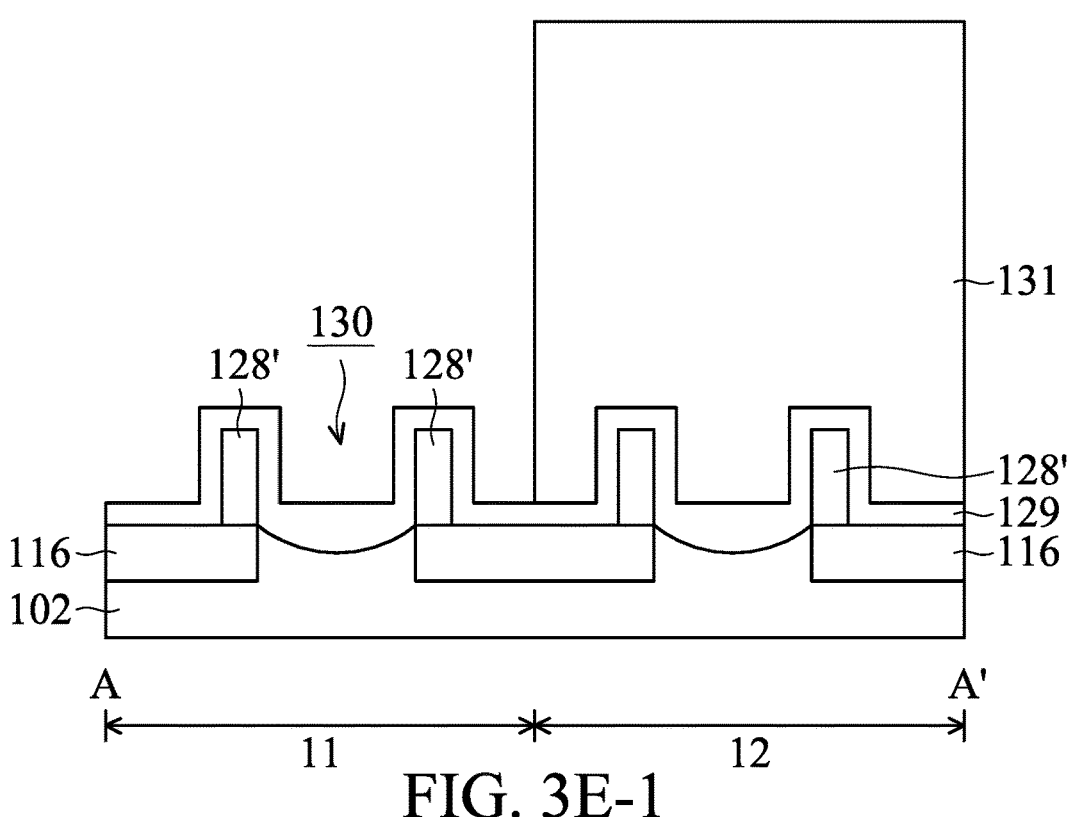
Figures 2, 3E:
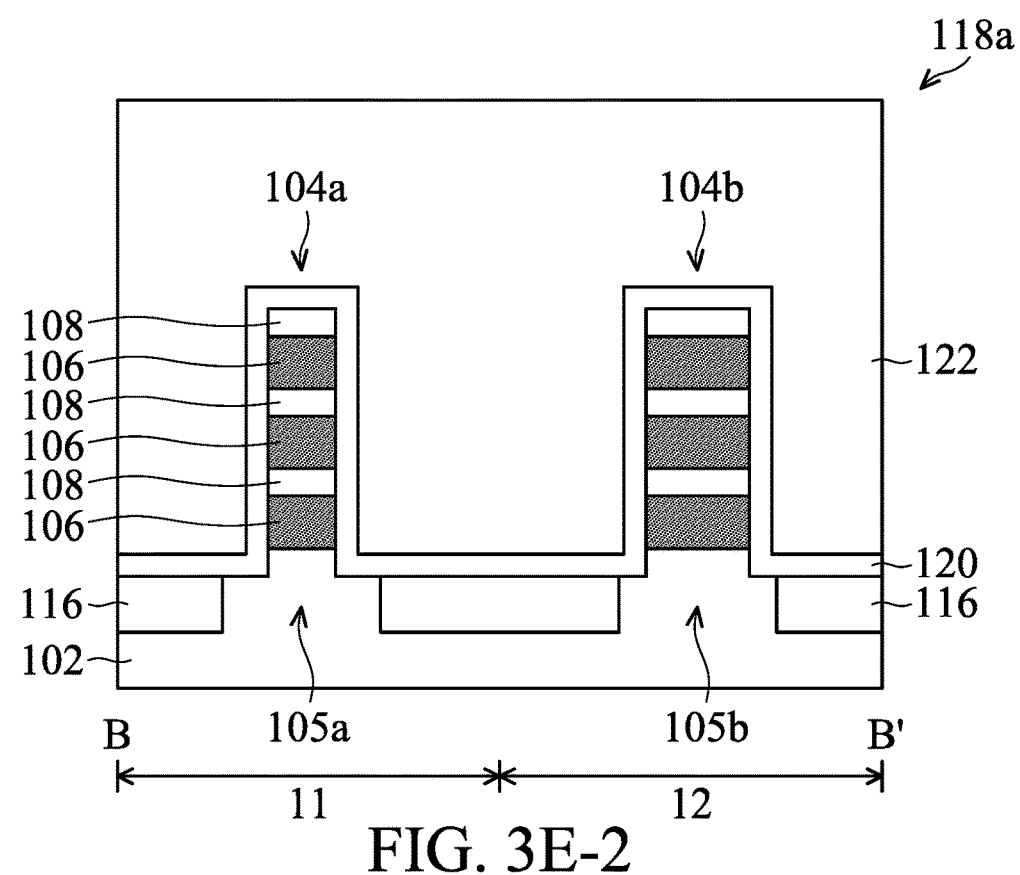
Figures 3, 3E:
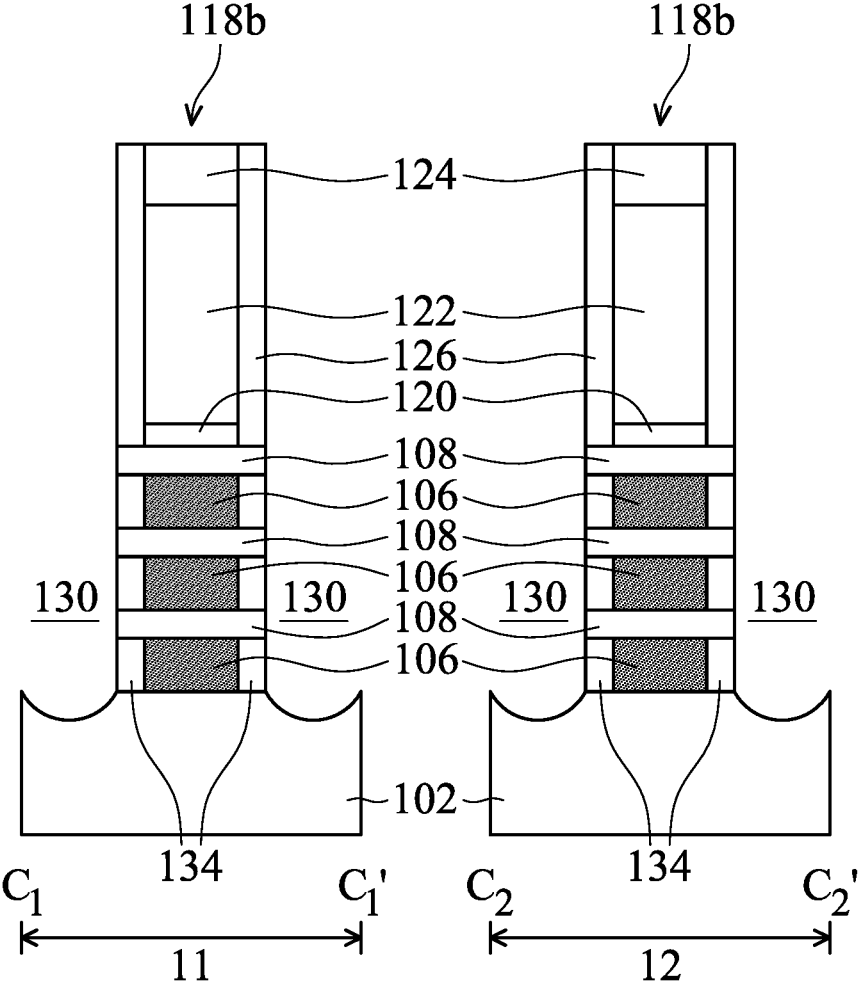
Figures 1, 3F:
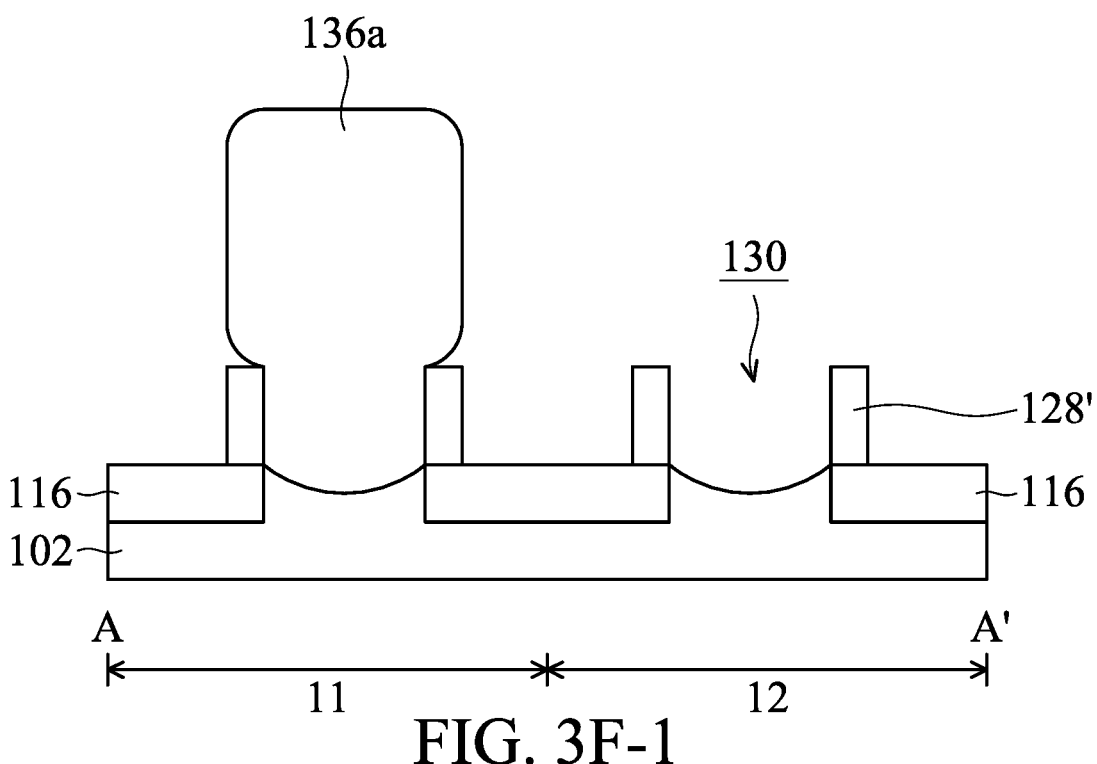
Figures 2, 3F:
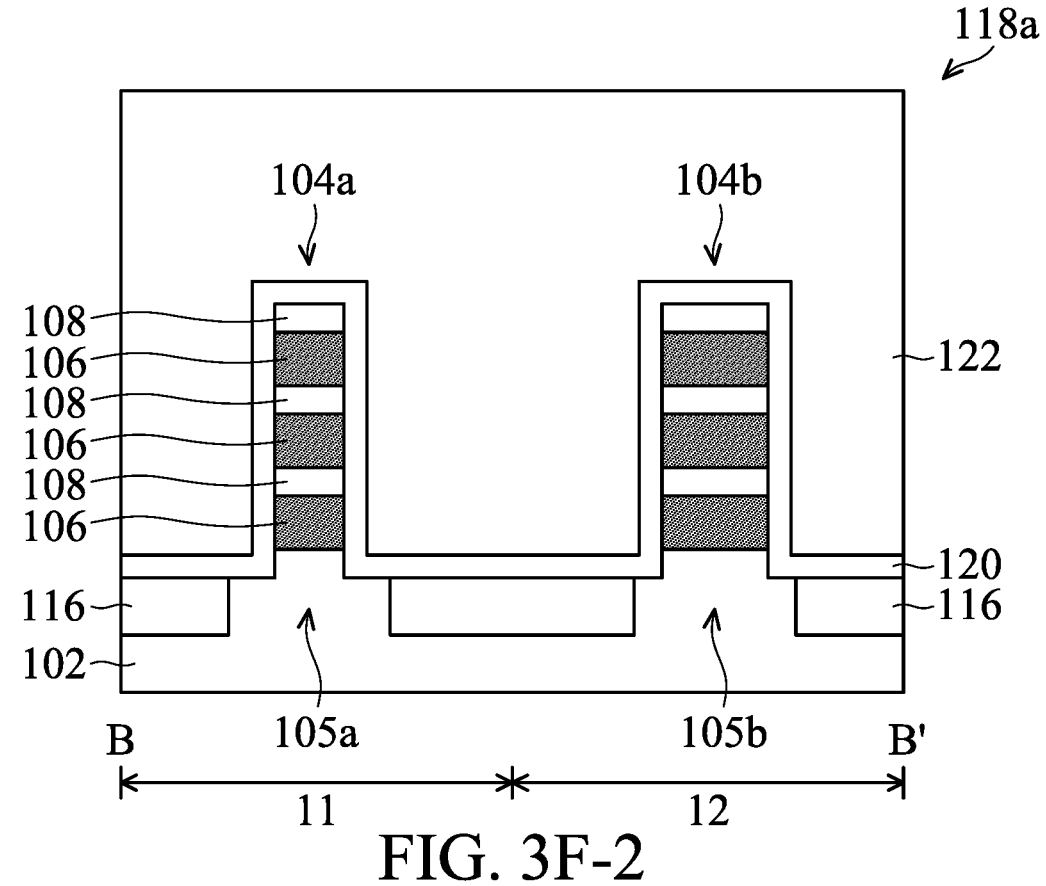
Figures 3, 3F:
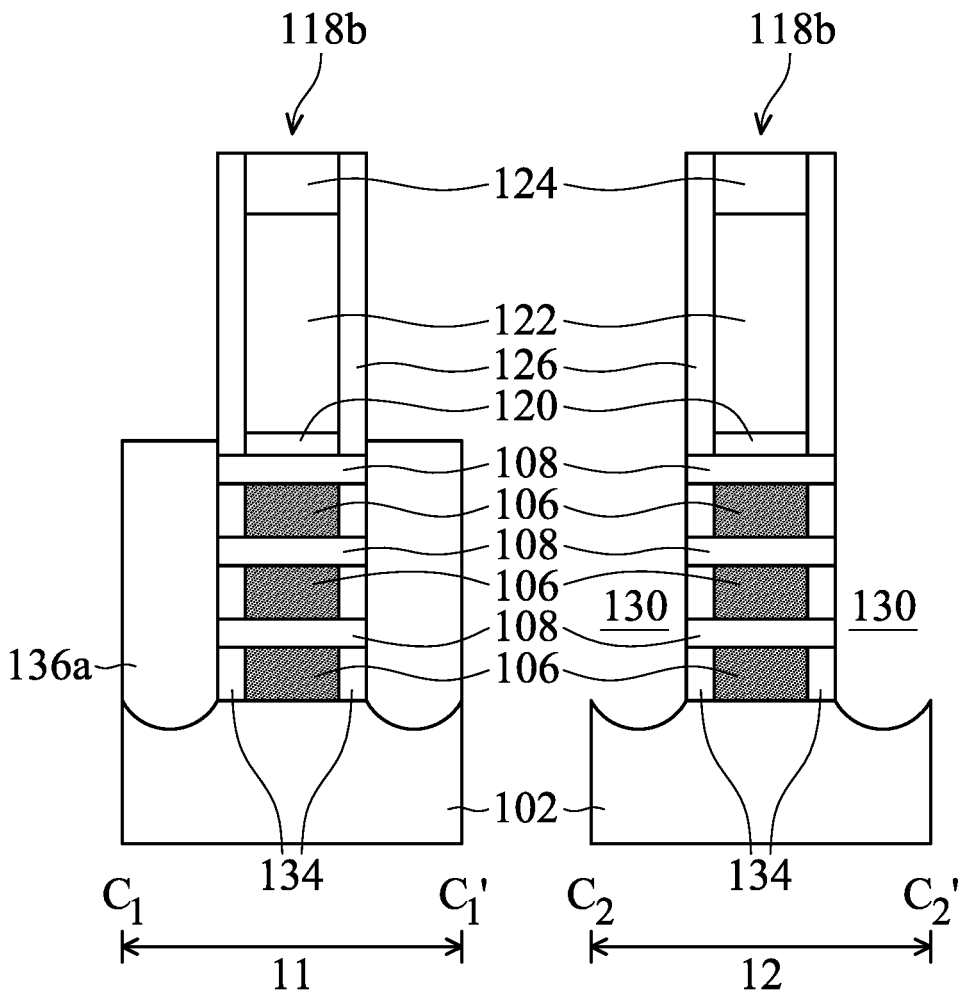
Figures 1, 3G:
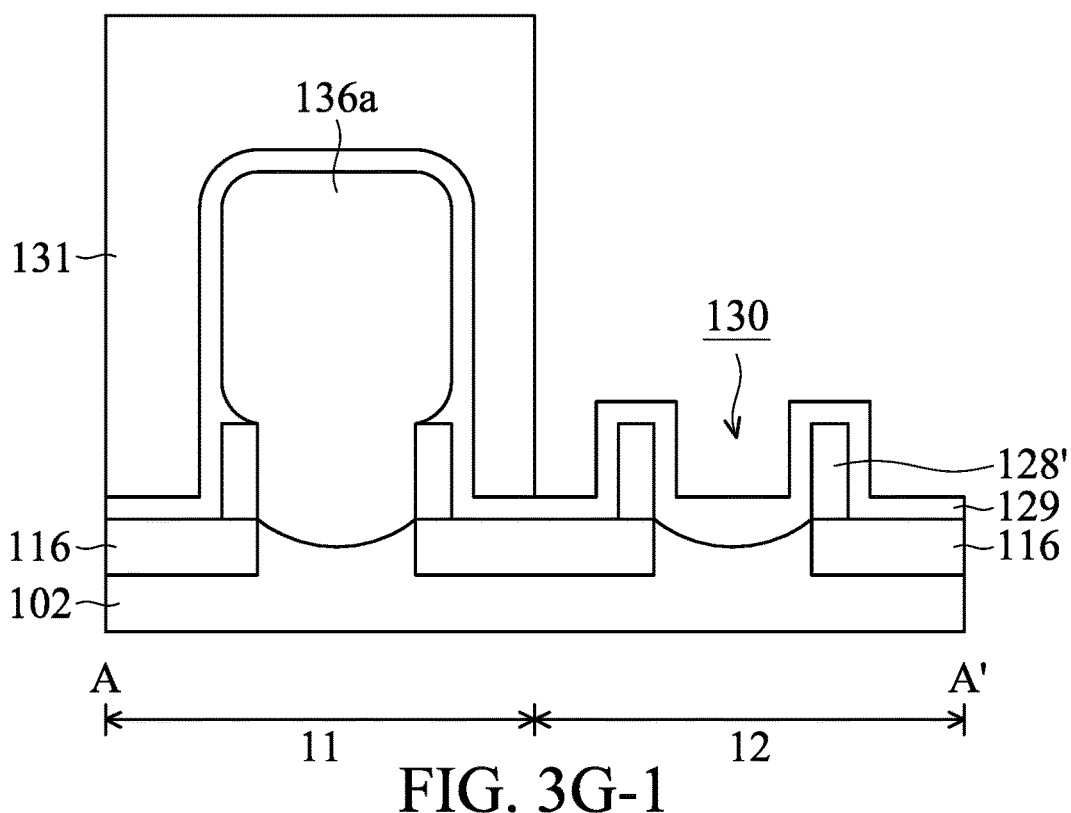
Figures 2, 3G:
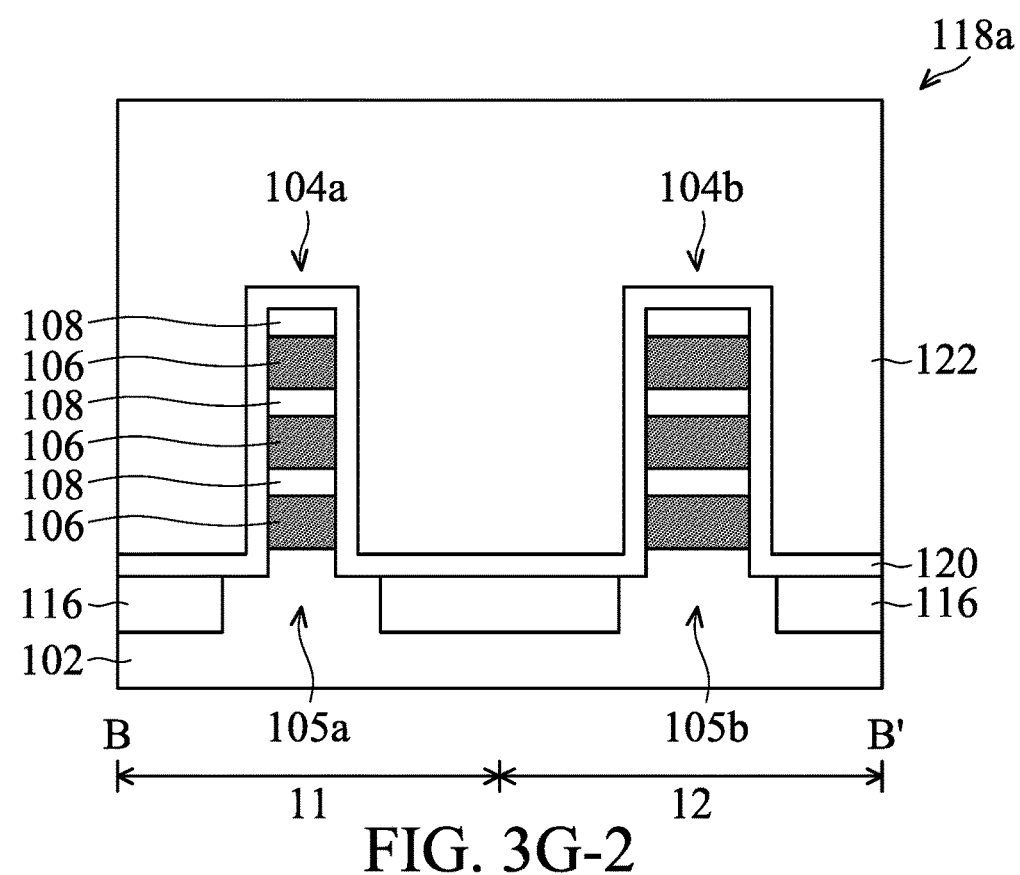
Figures 3, 3G:
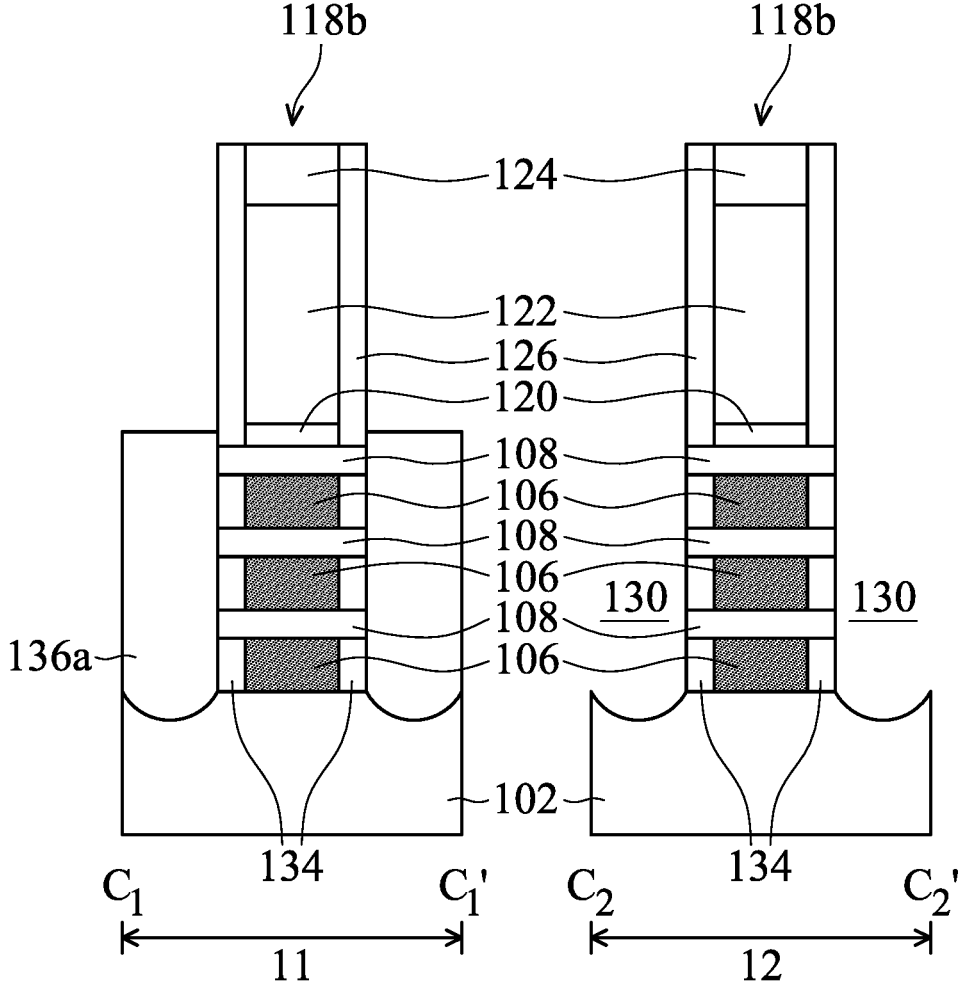
Figures 1, 3H:
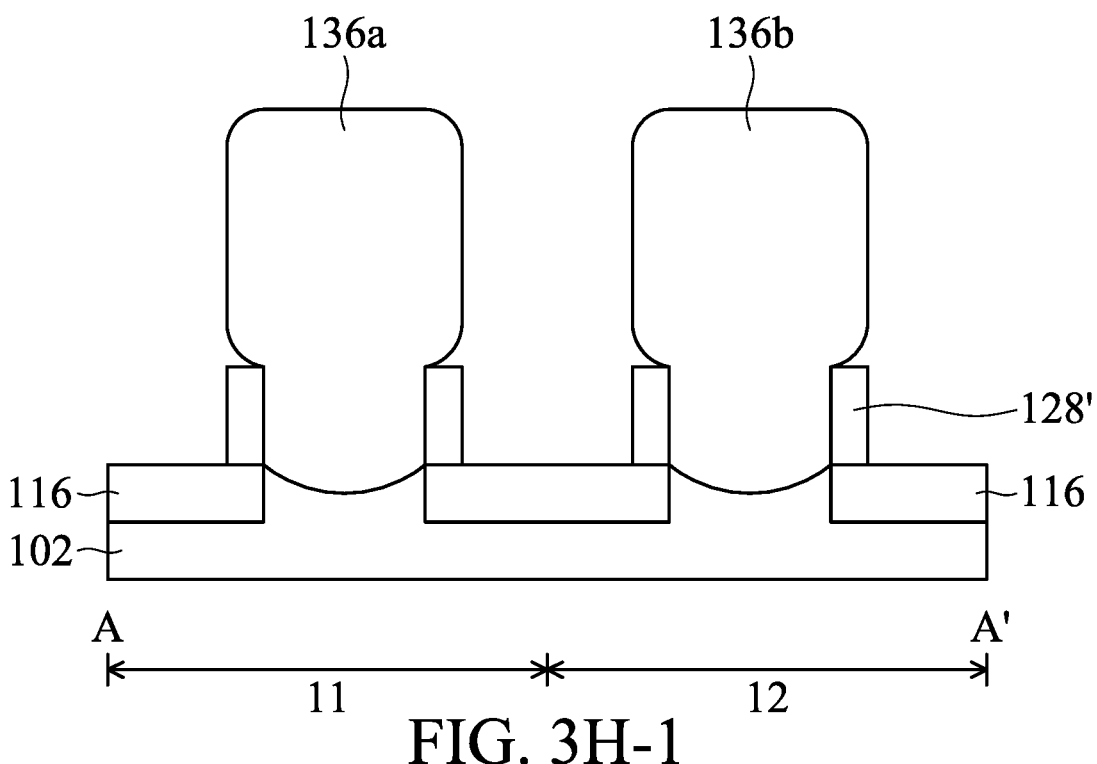
Figures 2, 3H:
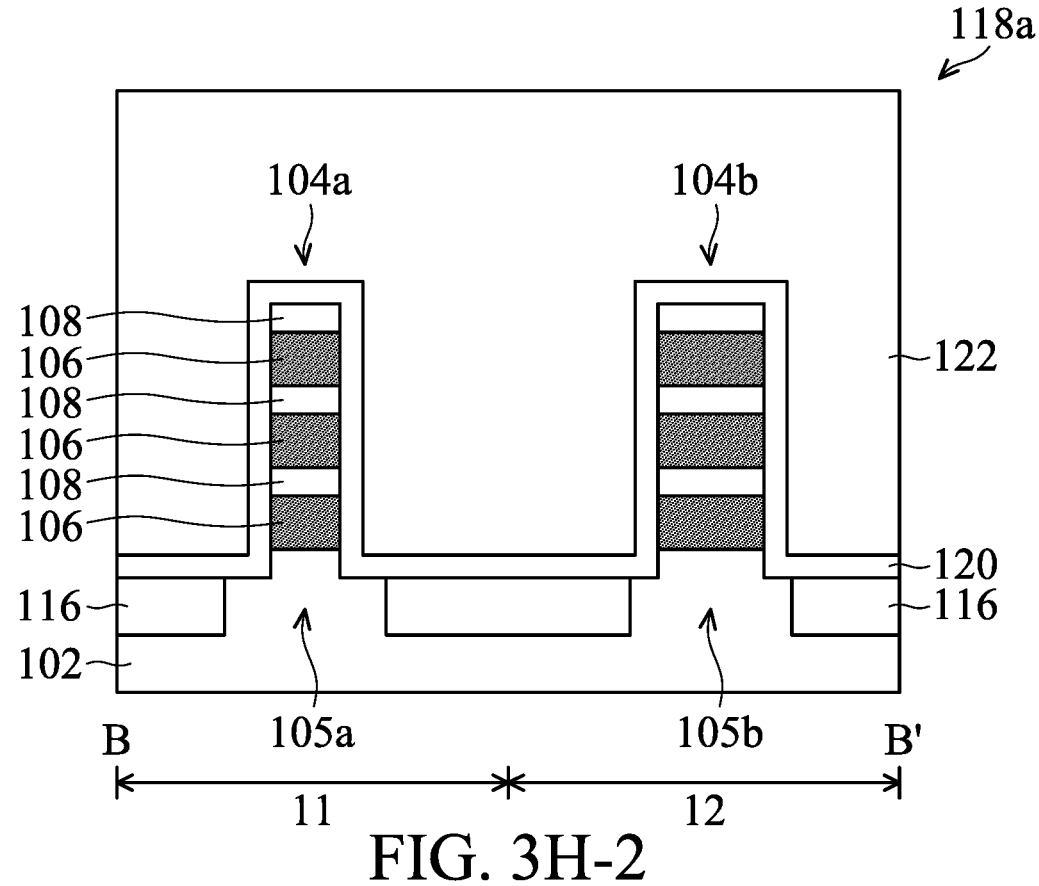
Figures 3, 3H:
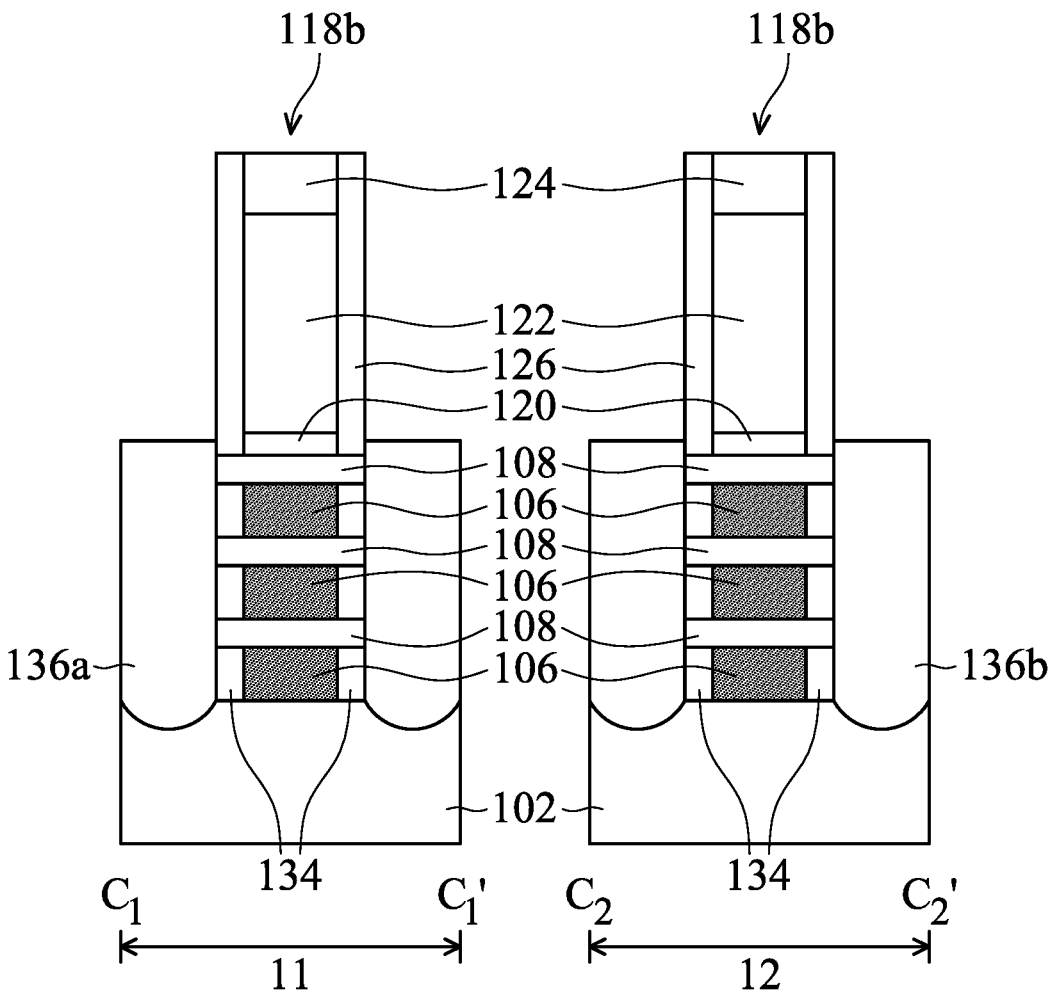
Figures 1, 3I:
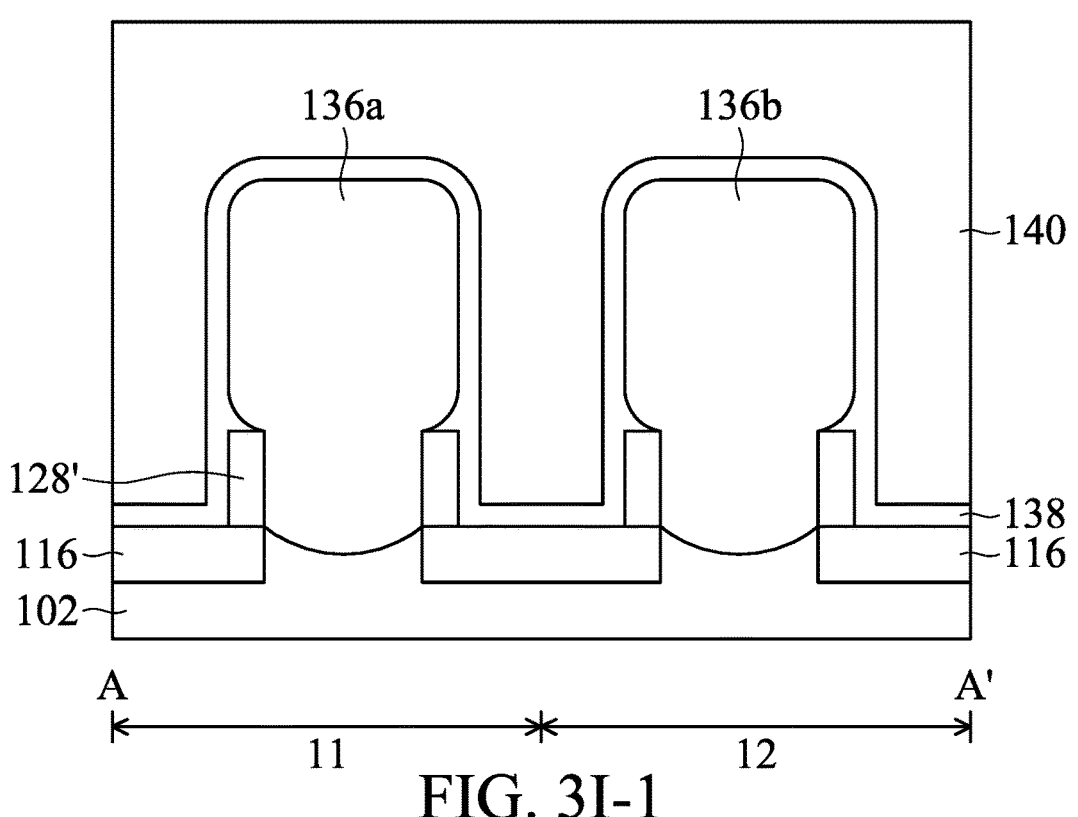
Figures 2, 3I:
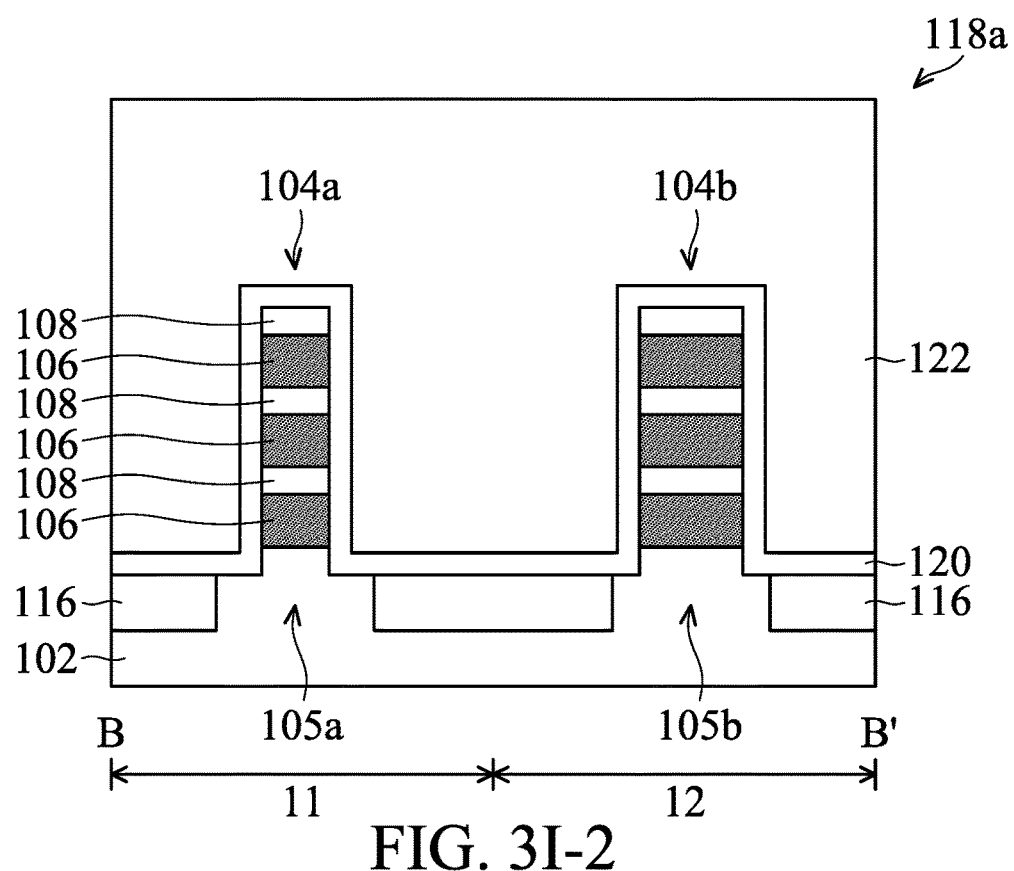
Figures 3, 3I:
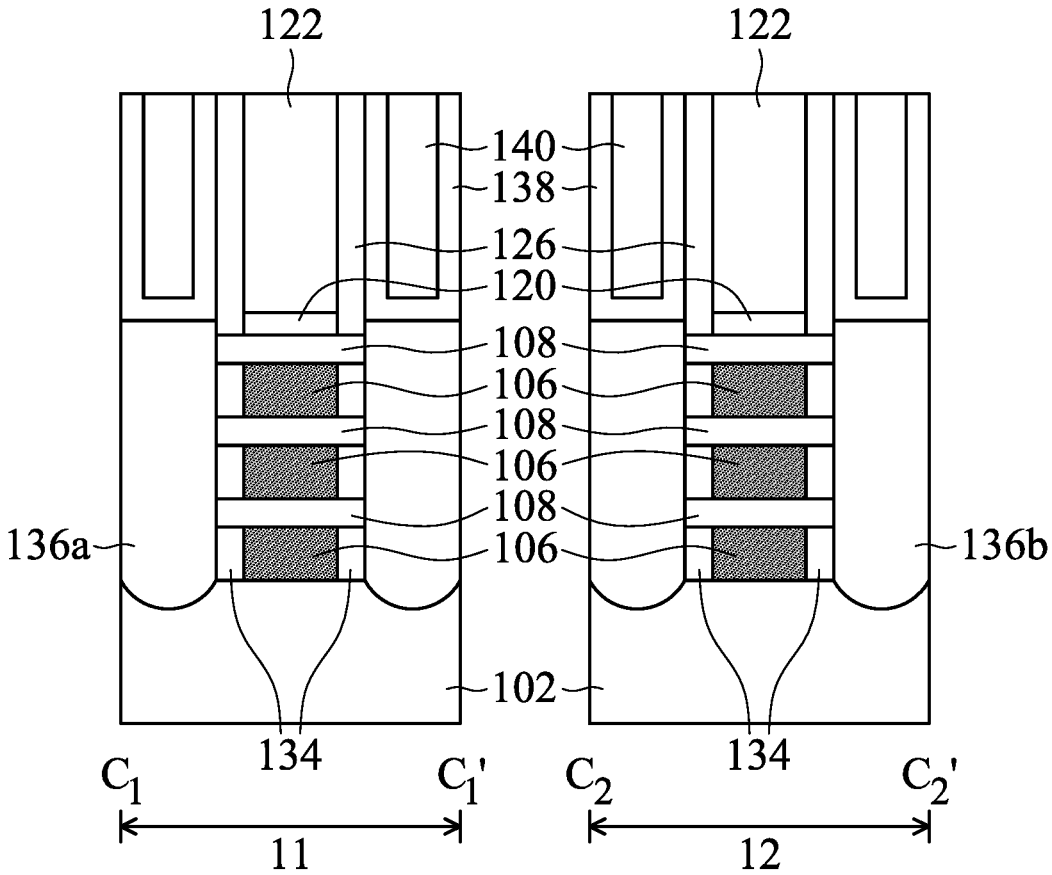
Figures 1, 3J:
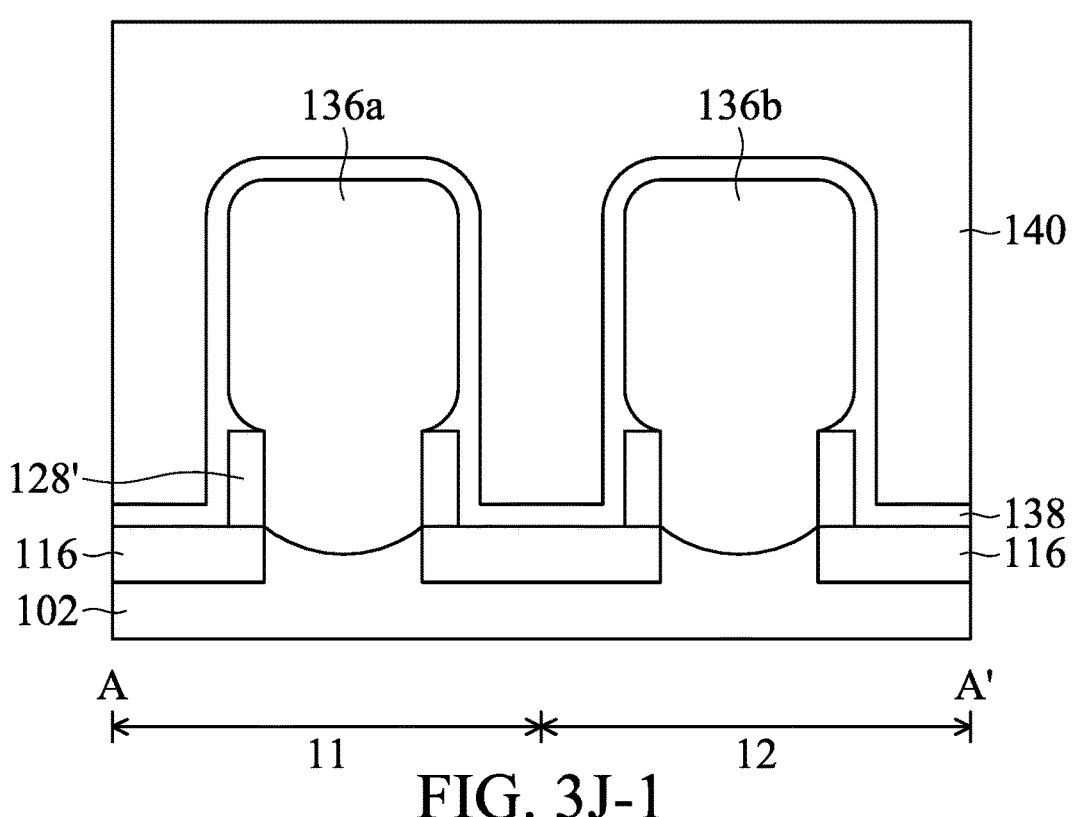
Figures 2, 3J:
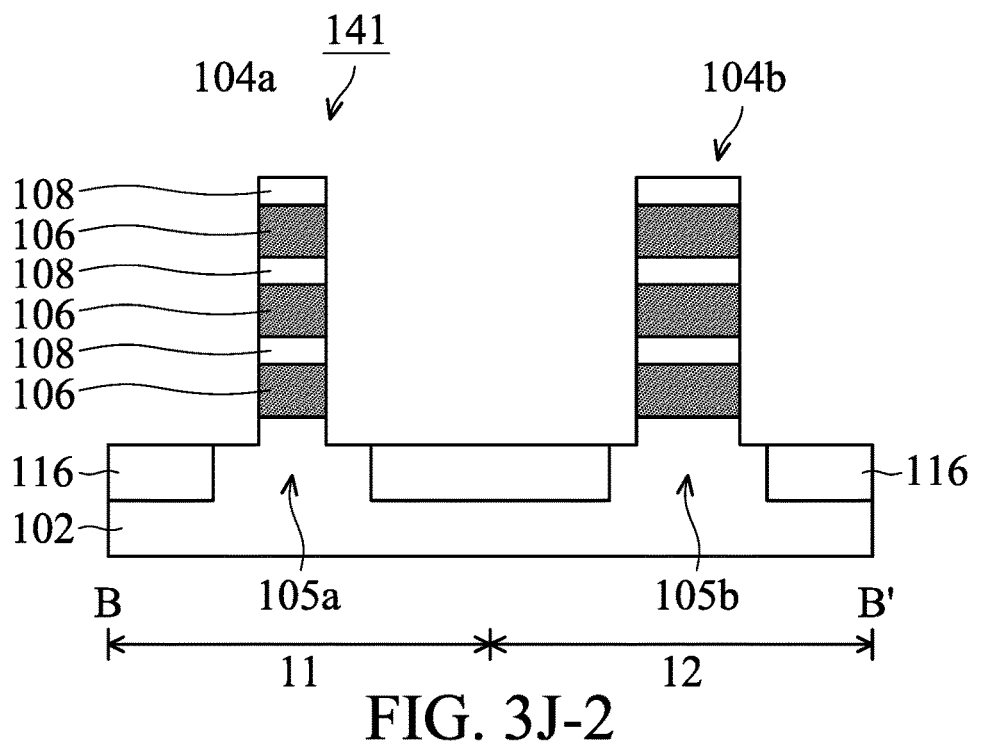
Figures 3, 3J:
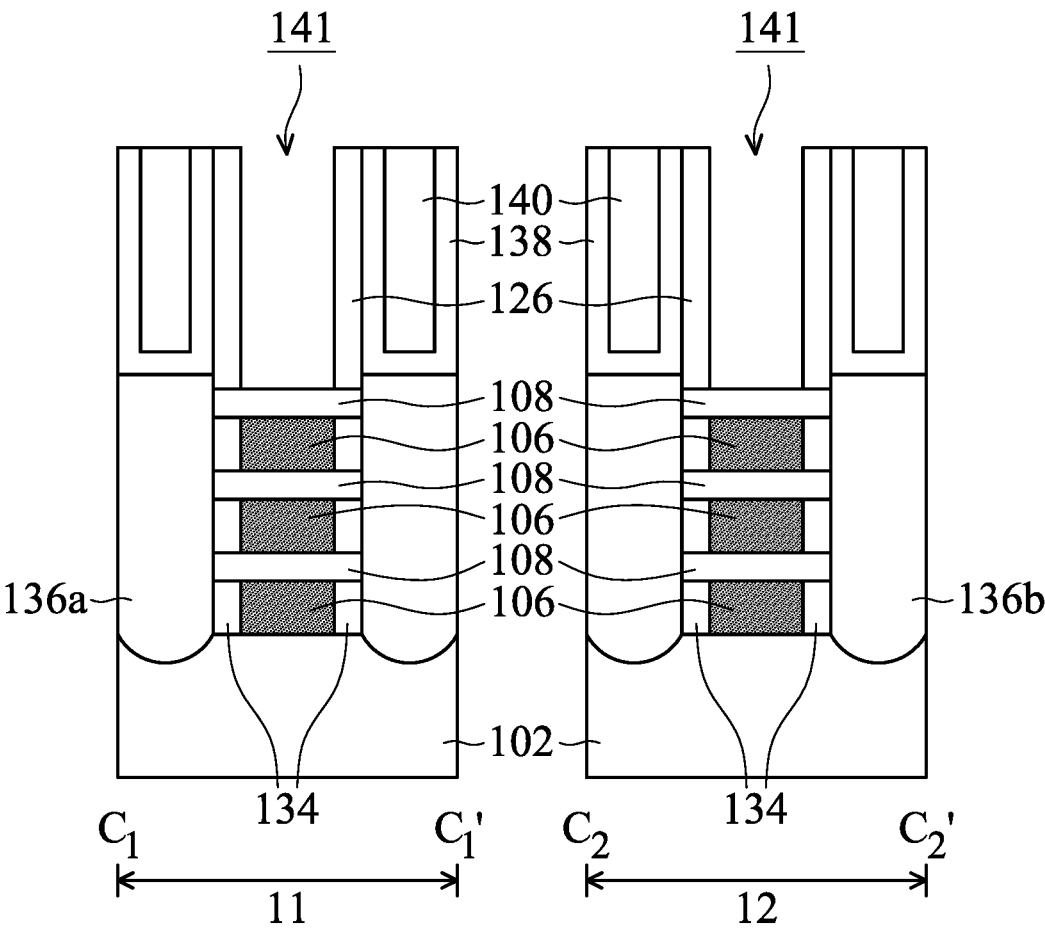
Figures 1, 3K:
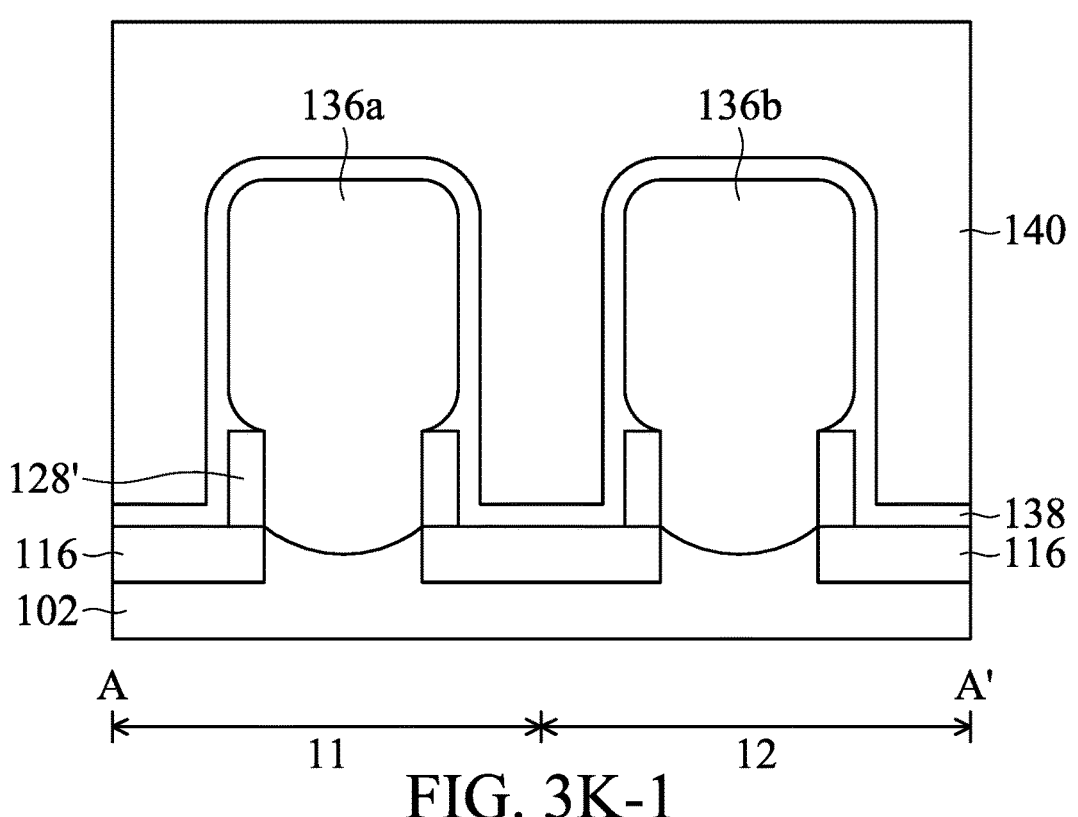
Figures 2, 3K:
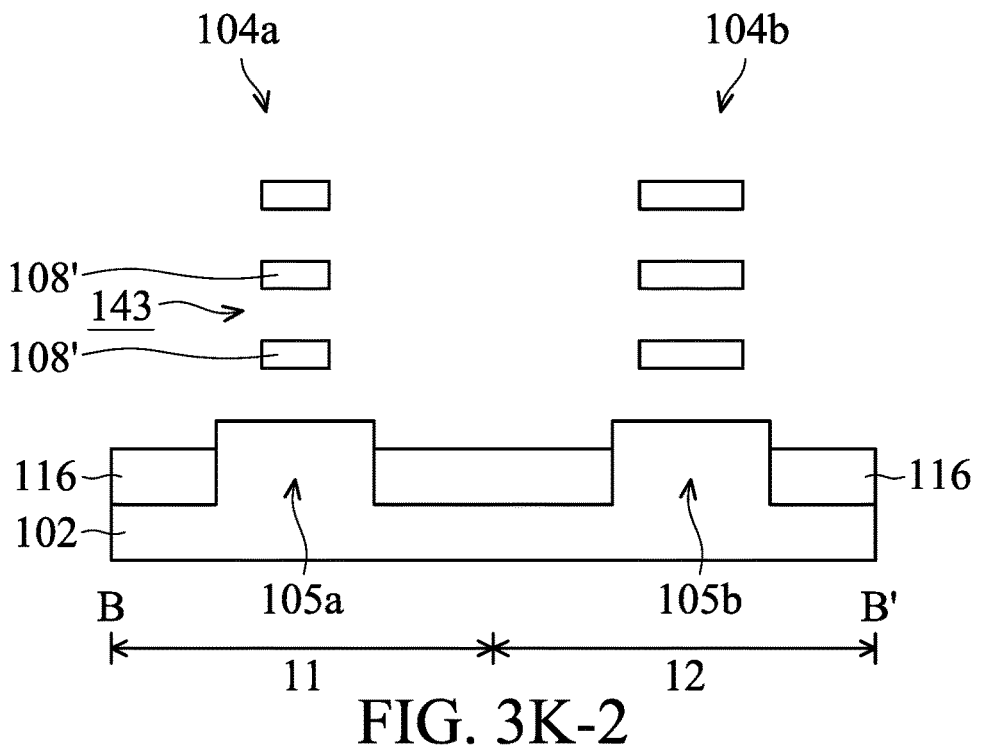
Figures 3, 3K:
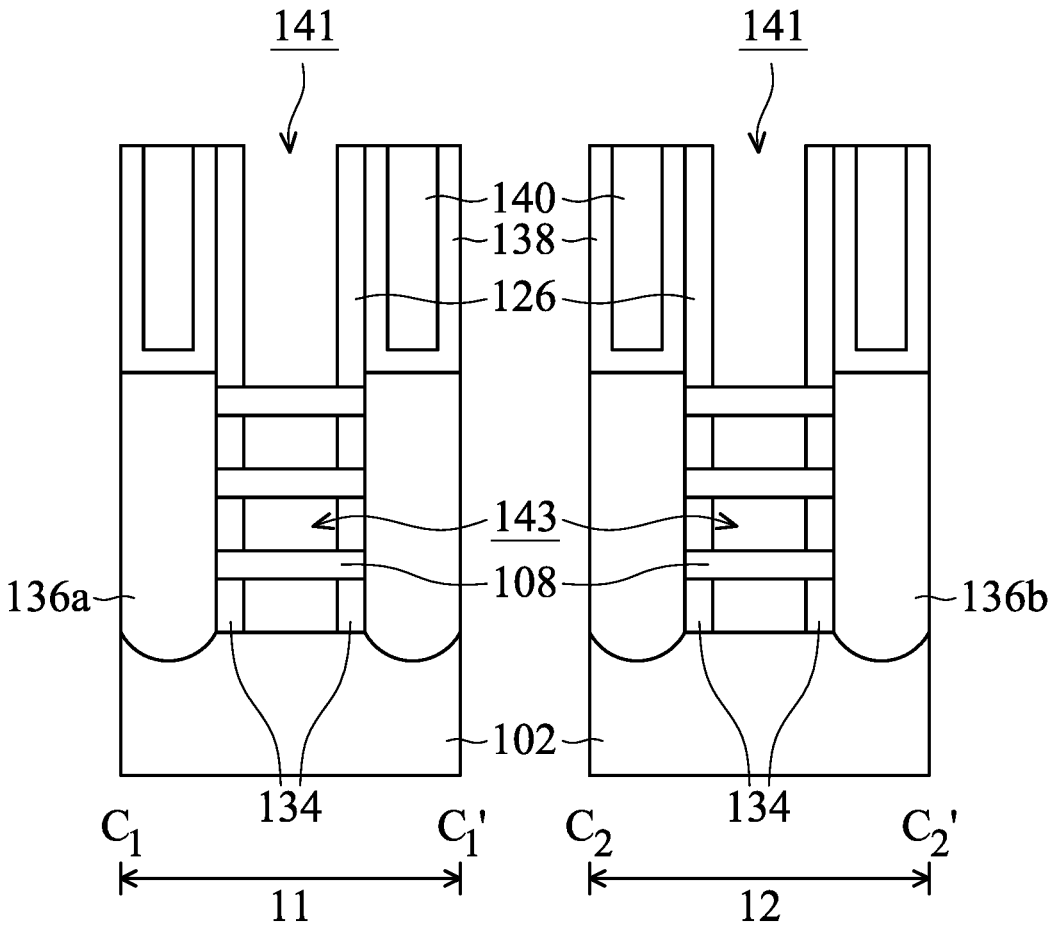
Figures 1, 2, 3L:
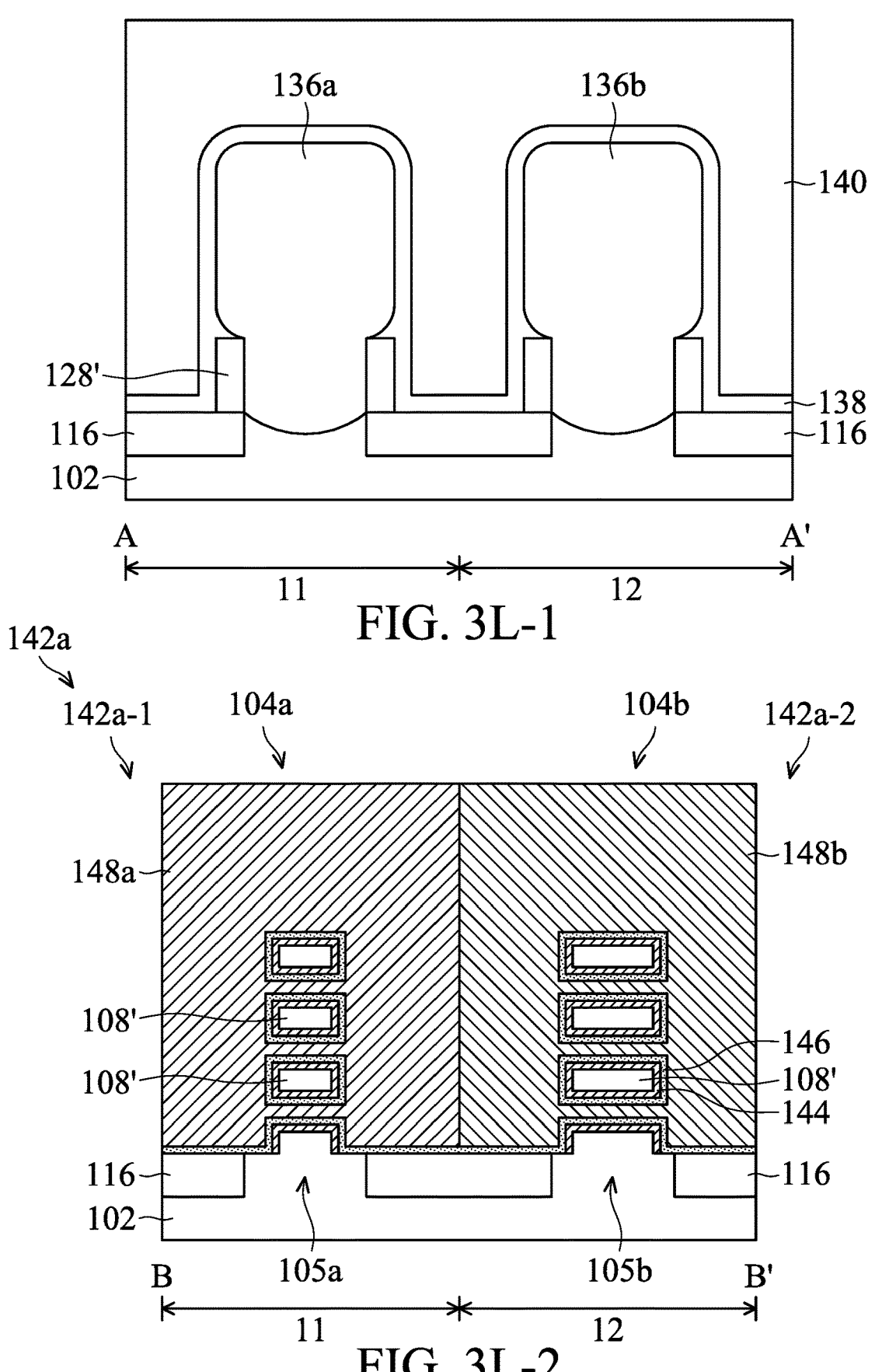
Figures 3, 3L:
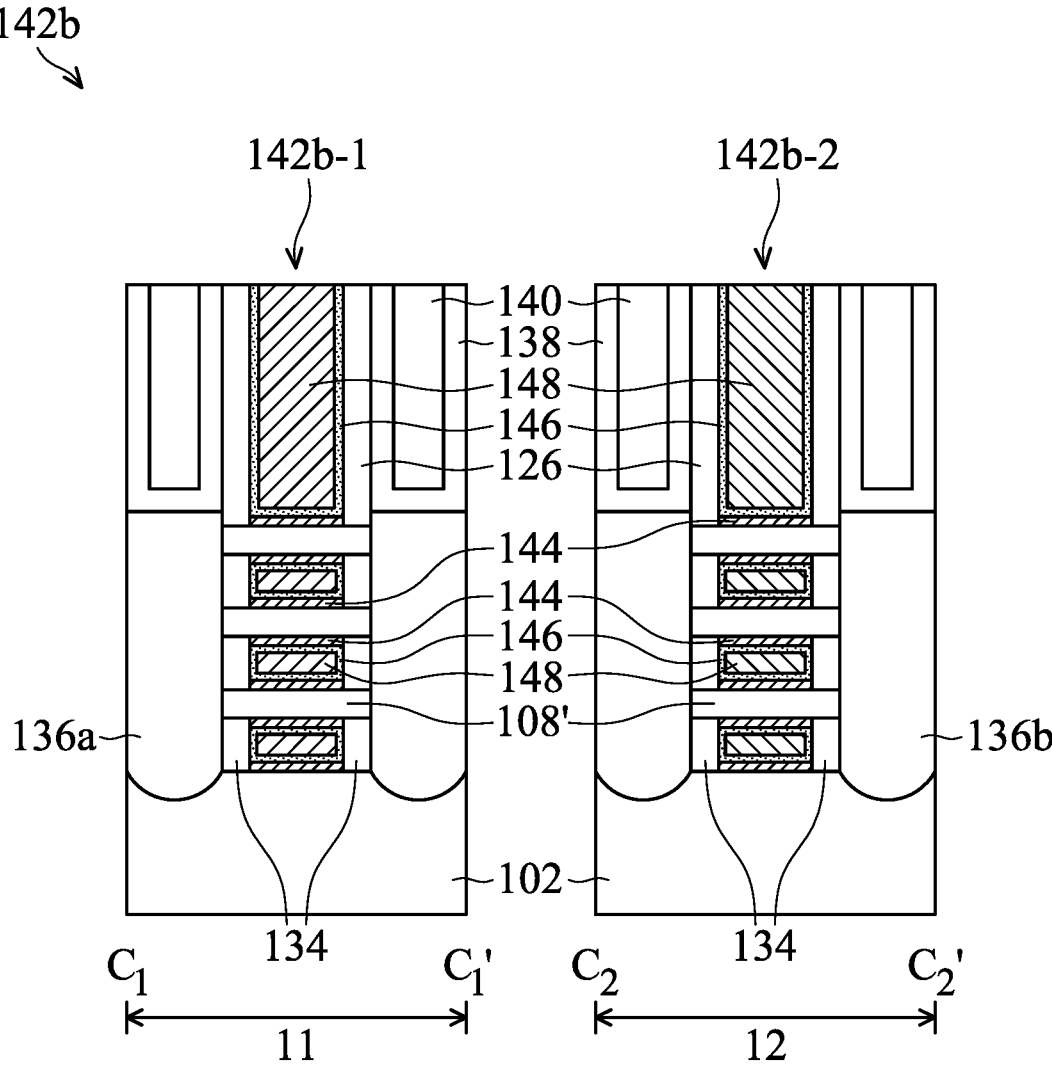
Figures 2, 3L:
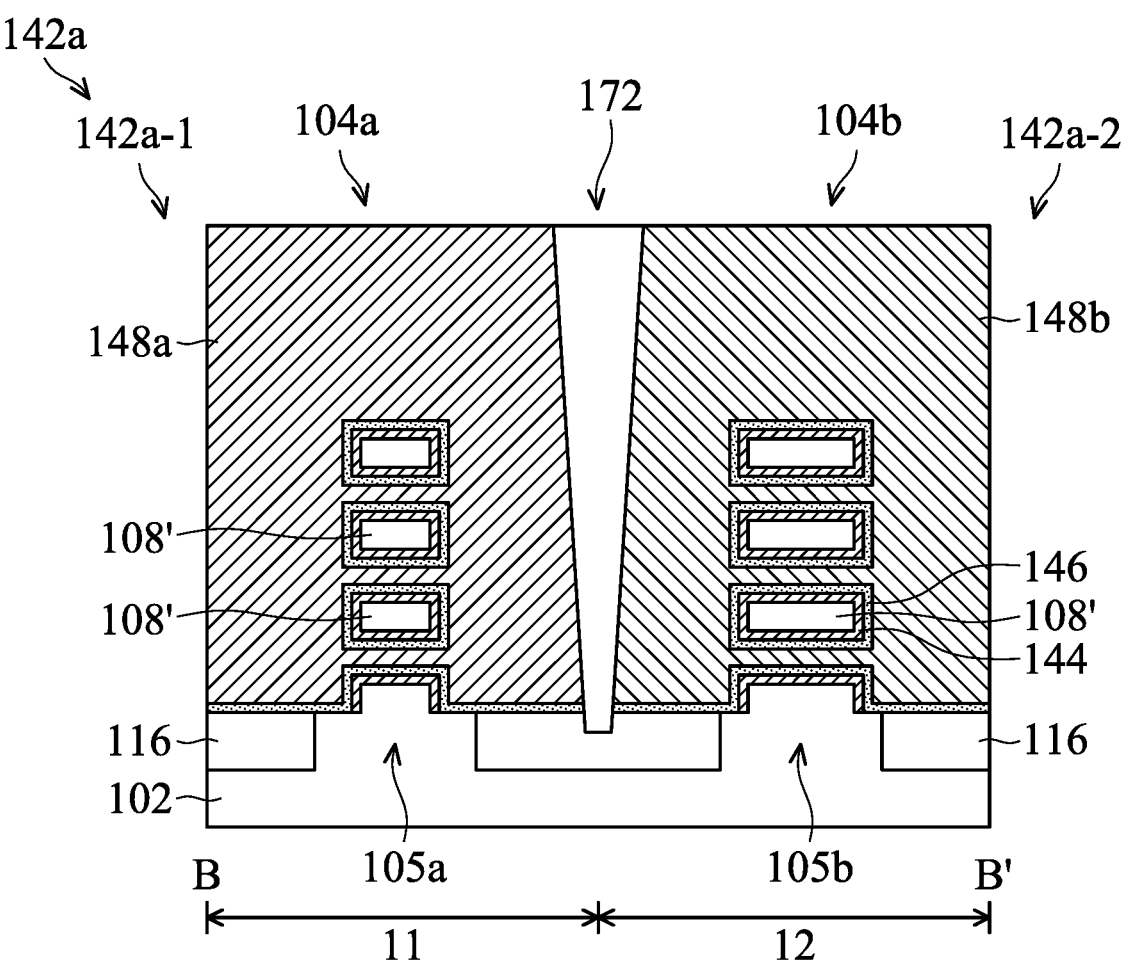
Figures 1, 3M:
Figures 2, 3M:
Figures 3, 3M:
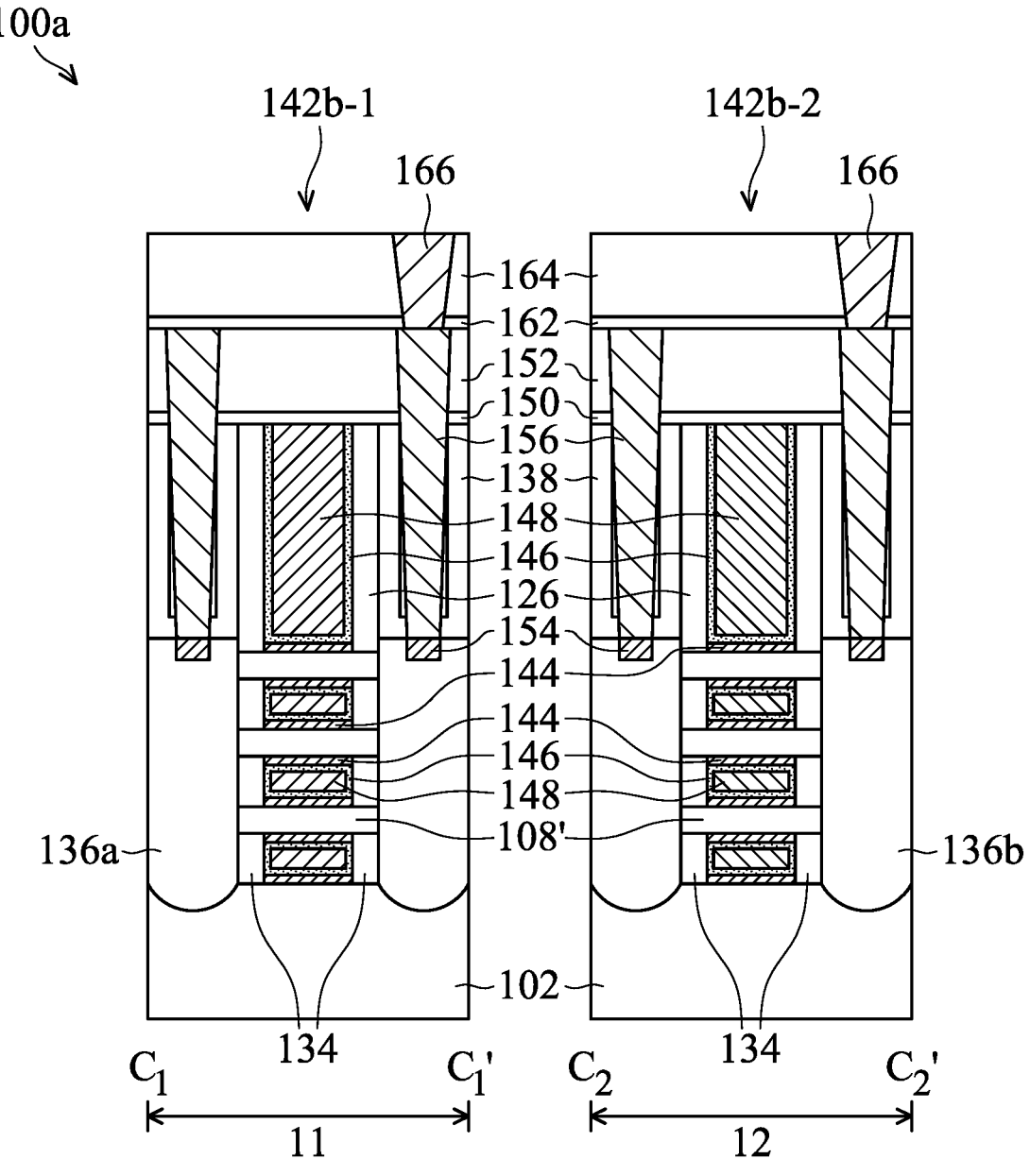

FIGS. 3A-1 to 3M-1 illustrate cross-sectional representations of various stages of manufacturing the semiconductor structure 100a shown along line A-A' in FIG. 1H and in FIG. 2, in accordance with some embodiments. FIGS. 3A-2 to 3M-2 illustrate cross-sectional representations of various stages of manufacturing the semiconductor structure 100a shown along line B-B' in FIG. 1H and in FIG. 2, in accordance with some embodiments. FIGS. 3A-3 to 3M-3 illustrate cross-sectional representations of various stages of manufacturing the semiconductor structure 100a shown along lines C$_1$-C$_1$' and C$_2$-C$_2$' in FIG. 1H and in FIG. 2, in accordance with some embodiments.

More specifically, FIG. 3A-1 illustrates the cross-sectional representation shown along line A-A' 'in FIG. 1H and FIG. 2. FIG. 3A-2 illustrates the cross-sectional representation shown along line B-B' in FIG. 1H and FIG. 2 in accordance with some embodiments. FIG. 3A-3 illustrates the cross-sectional representation shown along lines C$_1$-C$_1$' and C$_2$-C$_2$' in FIG. 1H and in FIG. 2.

Next, as shown in FIGS. 3B-1, 3B-2 and 3B-3, after the gate spacer layers 126 and the fin spacer layers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacer layers 126 are removed, in accordance with some embodiments. In addition, some portions of the base fin structure 105 are also recessed to form curved top surfaces, as shown in FIG. 3B-1 in accordance with some embodiments.

In some embodiments, the first fin structure 104a and the second fin structure 104b are recessed by performing an etching process. The etching process may be an anisotropic etching process, such as dry plasma etching, and the first dummy gate structure 118a, the second dummy gate structure 118b and the gate spacer layers 126 are used as etching masks during the etching process. In some embodiments, the fin spacer layers 128 are also recessed to form lowered fin spacer layers 128'.

Afterwards, as shown in FIGS. 3C-1, 3C-2 and 3C-3, after the source/drain (S/D) recesses 130 are formed, the first semiconductor material layers 106 exposed by the source/drain recesses 130 are laterally recessed to form notches 132, in accordance with some embodiments.

In some embodiments, an etching process is performed on the semiconductor structure 100a to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIGS. 3D-1, 3D-2 and 3D-3, inner spacers 134 are formed in the notches 132 between the second semiconductor material layers 108, in accordance with some embodiments. The inner spacers 134 are configured to separate the source/drain (S/D) structures and the gate structures formed in subsequent manufacturing processes in accordance with some embodiments. In some embodiments, the inner spacers 134 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 3E-1, 3E-2 and 3E-3, after the inner spacers 134 are formed, a hard mask layer 129 is formed on the lowered fin spacer layers 128', the first fin structure 104a, the second fin structure 104b, and isolation structure 116, in accordance with some embodiments. Next, a photoresist layer 131 is formed over a portion of the hard mask layer 129. The photoresist layer 131 is patterned to form a patterned photoresist layer 131 to transfer the pattern to the hard mask layer 129. The patterned photoresist layer 131 is formed in the second sub-region 12.

The lowered fin spacer layers 128 have a high etching selectivity with respect to the hard mask layer 129. When the hard mask layer 129 is removed, the lowered fin spacer layers 128 are rarely removed. In some embodiments, the hard mask layer 129 is made of nitride or oxide, such as silicon nitride or aluminum oxide (Al$_2$O$_3$) or another applicable material. In some embodiments, the hard mask layer 129 is formed by chemical vapor deposition (CVD), atomic vapor deposition (ALD), physical vapor deposition (PVD), another suitable method, or a combination thereof.

Afterwards, as shown in FIGS. 3F-1, 3F-2 and 3F-3, a portion of the hard mask layer 129 in the first sub-region 11 which is not coved by the photoresist layer 131 is removed to expose the first S/D recess 130, and then the photoresist layer 131 is removed, and a first source/drain (S/D) structure 136a is formed in the S/D recesses 130, in accordance with some embodiments.

In some embodiments, the first source/drain (S/D) structure 136a is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the first source/drain (S/D) structure 136a is made of any applicable material, such as Ge, Si, GaAs, AlGaAs, SiGe, GaAsP, SiP, SiC, SiCP, or a combination thereof.

In some embodiments, the first source/drain (S/D) structure 136a is in-situ doped during the epitaxial growth process. For example, the first source/drain (S/D) structure 136a may be the epitaxially grown SiGe doped with boron (B). For example, the first source/drain (S/D) structure 136a may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first source/drain (S/D) structure 136a is doped in one or more implantation processes after the epitaxial growth process.

Next, as shown in FIGS. 3G-1, 3G-2 and 3G-3, after the first source/drain (S/D) structure 136a formed, the hard mask layer 129 is again formed on the lowered fin spacer layers 128', the isolation structure 116 and the first S/D structure 136a, in accordance with some embodiments. Next, the photoresist layer 131 is formed over a portion of the hard mask layer 129 in the first sub-region 11, and the photoresist layer 131 is patterned to form a patterned photoresist layer 131. The patterned photoresist layer 131 is in the first sub-region 11.

Next, a portion of the hard mask layer 129 is removed to expose the second S/D recess 130 in the second sub-region 12. The remaining hard mask layer 129 is used to protect the first S/D structure 136a. Next, the photoresist layer 131 is removed.

Afterwards, as shown in FIGS. 3H-1, 3H-2 and 3H-3, a second S/D structure 136b is formed in the second S/D recess 130 in the second sub-region 12. Next, the hard mask layer 129 is removed after the second S/D structure 136b is formed.

In some embodiments, the second S/D structures 136b is made of any applicable material, such as Ge, Si, GaAs, AlGaAs, SiGe, GaAsP, SiP, SiC, SiCP, or a combination thereof. In some embodiments, the second S/D structure 136b is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the second S/D structure 136b is in-situ doped during the epitaxial growth process. For example, the second S/D structure 136b may be the epitaxially grown SiGe doped with boron (B). For example, the second S/D structure 136b may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the second S/D structures 136b are doped in one or more implantation processes after the epitaxial growth process.

Afterwards, as shown in FIGS. 3I-1, 3I-2 and 3I-3, a contact etch stop layer (CESL) 138 is conformally formed to cover the first S/D structures 136a, the second S/D structure 136b and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 3I-3 in accordance with some embodiments.

Afterwards, as shown in FIGS. 3J-1, 3J-2 and 3J-3, the first dummy gate structure 118a and the second dummy gate structure 118b are removed to form a trench 141, in accordance with some embodiments. As a result, the fin structure 104a and the second fin structure 104b are exposed by the trench 141.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 3K-1, 3K-2 and 3K-3, the first semiconductor material layers 106 are removed to form nanostructures 108' (or channel layers 108') with the second semiconductor material layers 108, in accordance with some embodiments.

The first S/D structure 136a and the second S/D structure 136b are attached to the nanostructures 108'. The first fin structure 104a and the second fin structure 104b include the nanostructures 108'.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide (NH₄OH), TMAH, ethylenediamine pyrocatechol (EDP), and/or potassium hydroxide (KOH) solutions.

Next, as shown in FIGS. 3L-1, 3L-2 and 3L-3, after the nanostructures 108' are formed, a first gate structure 142a is formed to surround the nanostructures 108' and over the isolation structure 116, in accordance with some embodiments. The first gate structure 142a includes a first portion 142a-1 and a second portion 142a-2.

After the nanostructures 108' are formed, the first portion 142a-1 of the first gate structure 142a and the second portion 142a-2 of the first gate structure 142a are formed wrapped around the nanostructures 108'. The first portion 142a-1 and the second portion 142a-2 of the first gate structure 142 wrap around the nanostructures 108' to form gate-all-around transistor structures in accordance with some embodiments. In some embodiments, the first portion 142a-1 of the first gate structure 142a includes an interfacial layer 144, a gate dielectric layer 146, and a first gate electrode layer 148a. In some embodiments, the second portion 142a-2 of the first gate structure 142a includes an interfacial layer 144, a gate dielectric layer 146, and a second gate electrode layer 148b.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the first gate structure 142a is formed on the gate dielectric layer 146. In some embodiments, the first gate structure 142a is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate structure is formed using chemical vapor deposition (CVD), atomic layer deposition (ALD), electroplating, another applicable method, or a combination thereof. Other conductive layers, such as work function metal layers, may also be formed in the first gate structure 142a, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the first portion 142a-1 of the first gate structure 142a and the second portion 142a-2 of the first gate structure 142a are formed, a planarization process such as CMP or an etch-back process may be performed until the ILD layer 140 is exposed.

FIG. 3L-2' illustrate cross-sectional representations of various stages of manufacturing a semiconductor structure 100b, in accordance with some embodiments. The semiconductor structure 100b of FIG. 3L-2' includes elements that are similar to, or the same as, elements of the semiconductor structure 100a of FIG. 3L-2. The difference between the FIG. 3L-2' and FIG. 3L-2 is that a dielectric structure 172 is between the first portion 142a-1 of the first gate structure 142a and the second portion 142a-2 of the first gate structure 142a.

The bottom surface of the dielectric structure 172 is lower than the bottommost nanostructure 108' of the first fin structure 104a and the bottommost nanostructure 108' of the second fin structure 104b. The first gate structure 142a is isolated from the second gate structure 142b by the dielectric structure 172.

Afterwards, as shown in FIGS. 3M-1, 3M-2 and 3M-3, an etch stop layer 150 is formed over the gate structure 142, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, a silicide layer 154 and an S/D contact structure 156 are formed over the first S/D structure 136a and the second S/D structure 136b, in accordance with some embodiments.

In some embodiments, the contact openings may be formed through the contact etch stop layer 138, the interlayer dielectric layer 140, the etch stop layer 150 and the dielectric layer 152 to expose the top surfaces of the first S/D structures 136a and the second S/D structure 136b, and then the silicide layers 154 and the S/D contact structure 156 may be formed in the contact openings. The contact openings may be formed using a photolithography process and an etching process. In addition, some portions of the first S/D structure 136a and second S/D structure 136b exposed by the contact openings may also be etched during the etching process.

The silicide layers 154 may be formed by forming a metal layer over the top surfaces of the first S/D structure 136a and the second S/D structure 136b and annealing the metal layer so the metal layer reacts with the first S/D structure 136a and the second S/D structure 136b to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

After the S/D contact structure 156 are formed, an etch stop layer 162 is formed over the S/D contact structure 156, and a dielectric layer 164 is formed over the etch stop layer 162, in accordance with some embodiments. Next, a S/D conductive via 166 is formed over the S/D contact structure 156, and a gate conductive plug 168 is formed over the first gate structure 142*a* and the second gate structure 142*b*.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing chemical vapor deposition (CVD), atomic layer deposition (ALD), other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

In some embodiments, the S/D conductive via 166 is made of conductive material, such as tungsten (W), ruthenium (Ru), molybdenum (Mo), or the like. In some embodiments, the S/D conductive via 166 is formed by performing a deposition process, such as chemical vapor deposition (CVD), physical vapor deposition, (PVD), atomic layer deposition (ALD), or other applicable processes.

In some embodiments, the gate conductive plug 168 is made of conductive material, such as tungsten (W), ruthenium (Ru), molybdenum (Mo), or the like. In some embodiments, the gate conductive plug 168 is formed by performing a deposition process, such as chemical vapor deposition (CVD), physical vapor deposition, (PVD), atomic layer deposition (ALD), or other applicable processes.

In some embodiments, the second area of the S/D contact structure 156 in the second sub-region 12 is greater than the first area of the S/D contact structure 156 in the first sub-region 11. In some embodiments, the area ratio of the second area of the S/D contact structure 156 to the first area of the S/D contact structure 156 is in a range from about 1.1 to about 1.4.

In some embodiments, the second area of the S/D conductive via structure 166 in the second sub-region 12 is greater than the first area of the S/D conductive via structure 166 in the first sub-region 11. In some embodiments, the area ratio of the second area of the S/D conductive via structure 166 to the first area of the S/D conductive via structure 166 is in a range from about 1.1 to about 2.5.

For power saving or power efficiency, the portion of the first fin structure 104*a* is removed to reduce the first sheet width SW$_1$ of the first nanostructures 108'. The first sheet width SW$_1$ of each of the nanostructures 108' of the first fin structure 104*a* is smaller width than the second sheet width SW$_2$ of the nanostructures 108' of the second fin structure 104*b*. The reduced first sheet width SW$_1$ of the nanostructures 108' of the first fin structure 104*a* can applied to low power device for power saving. In order to fulfill different needs in a region, the first portion 142*a*-1 of the first gate structure 142*a* is formed for power efficiency, and the second portion 142*a*-2 of the first gate structure 142*a* is formed for high speed performance. The first portion 142*a*-1 of the first gate structure 142*a* and second portion 142*a*-2 of the first gate structure 142*a* co-exist to achieve multi-nanostructures for speed performance and power efficiency. Therefore, the performance of the semiconductor structure is improved.

Figure 4A:
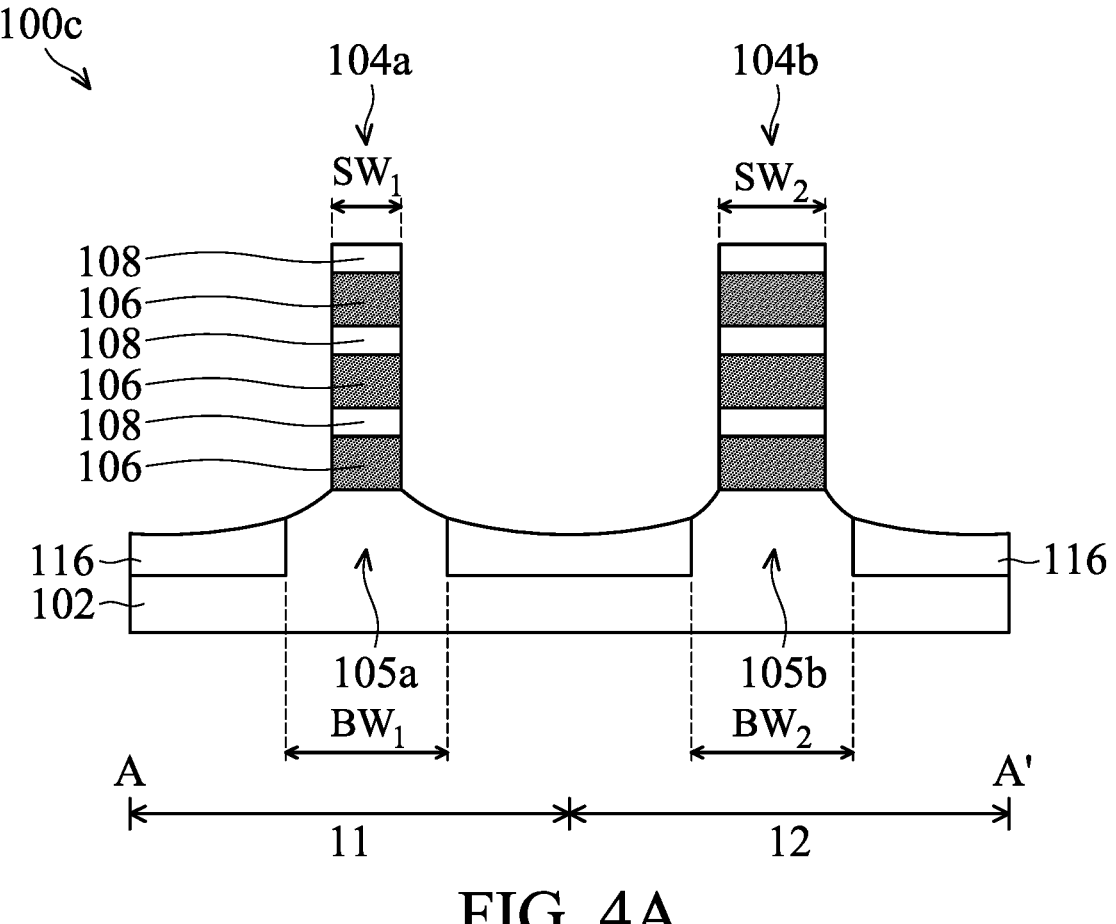
FIGS. 4A to 4B illustrate cross-sectional representations of various stages of manufacturing a semiconductor structure, in accordance with some embodiments.
Figure 4B:
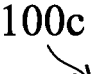

FIGS. 4A to 4B illustrate cross-sectional representations of various stages of manufacturing a semiconductor structure 100*c*, in accordance with some embodiments.

The semiconductor structure 100*c* of FIG. 4A includes elements that are similar to, or the same as, elements of the semiconductor structure 100*a* of FIG. 1F. The difference between the FIG. 4A and FIG. 1F is that the top surface of the isolation structure 116 is recessed. The top surface of the isolation structure 116 is concave. The first base fin structure 105*a* has sloped sidewall surfaces, and the second base fin structure 105*b* has sloped sidewall surfaces.

Next, as shown in FIG. 4B, the first portion 142*a*-1 of the first gate structure 142*a* is formed over the nanostructures 108' of the first fin structure 104*a*, and the second portion 142*a*-2 of the first gate structure 142*a* is formed over the nanostructures 108' of the second fin structure 104*b*.

Figure 5A:
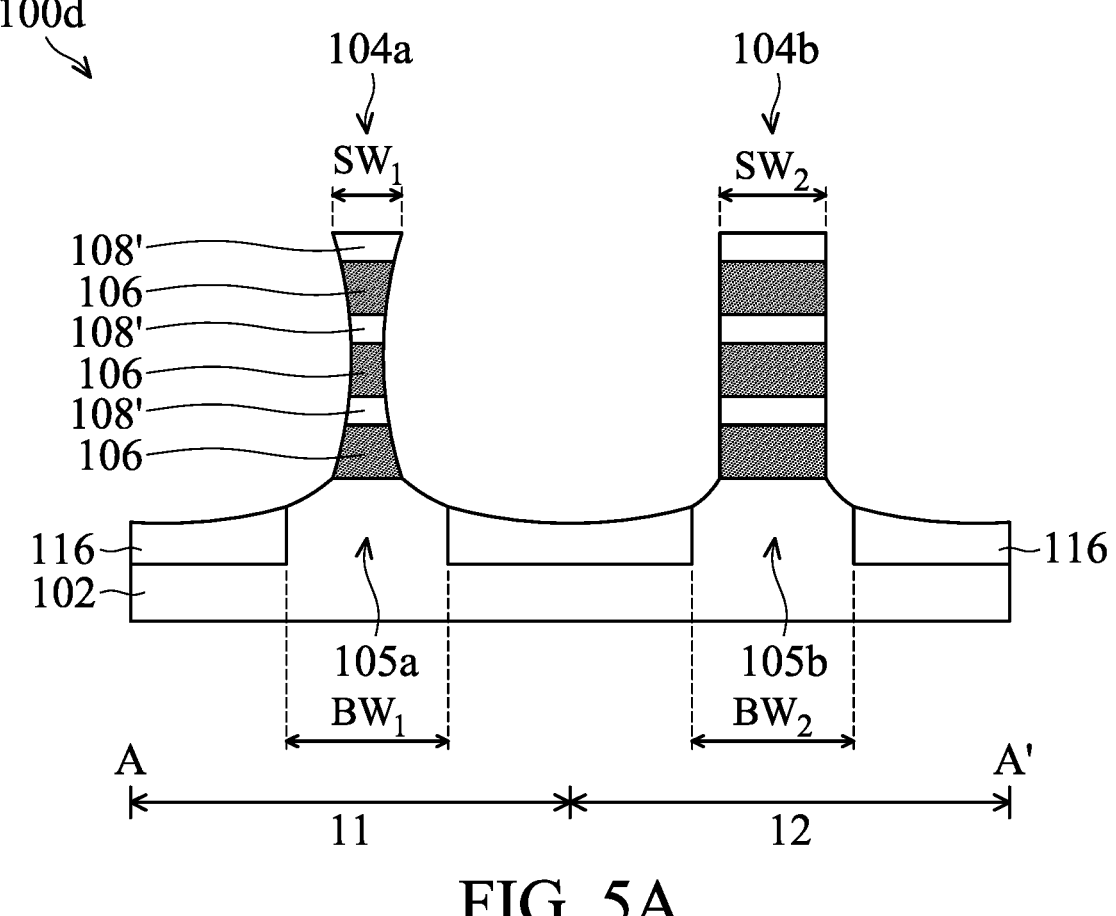
FIGS. 5A to 5B illustrate cross-sectional representations of various stages of manufacturing a semiconductor structure, in accordance with some embodiments.
Figure 5B:

FIGS. 5A to 5B illustrate cross-sectional representations of various stages of manufacturing a semiconductor structure 100*d*, in accordance with some embodiments.

The semiconductor structure 100*d* of FIG. 5A includes elements that are similar to, or the same as, elements of the semiconductor structure 100*c* of FIG. 4A. The difference between the FIG. 5A and FIG. 4A is that the sidewall surfaces of the first fin structure 104*a* is not vertical. The middle portion is narrower than the top portion and the bottom portion of the first fin structure 104*a*. As shown in FIG. 5A, the nanostructure 108' has curved sidewall surface.

Next, as shown in FIG. 5B, the first portion 142*a*-1 of the first gate structure 142*a* is formed over the nanostructures 108' of the first fin structure 104*a*, and the second portion 142*a*-2 of the first gate structure 142*a* is formed over the nanostructures 108' of the second fin structure 104*b*.

Figure 6A:
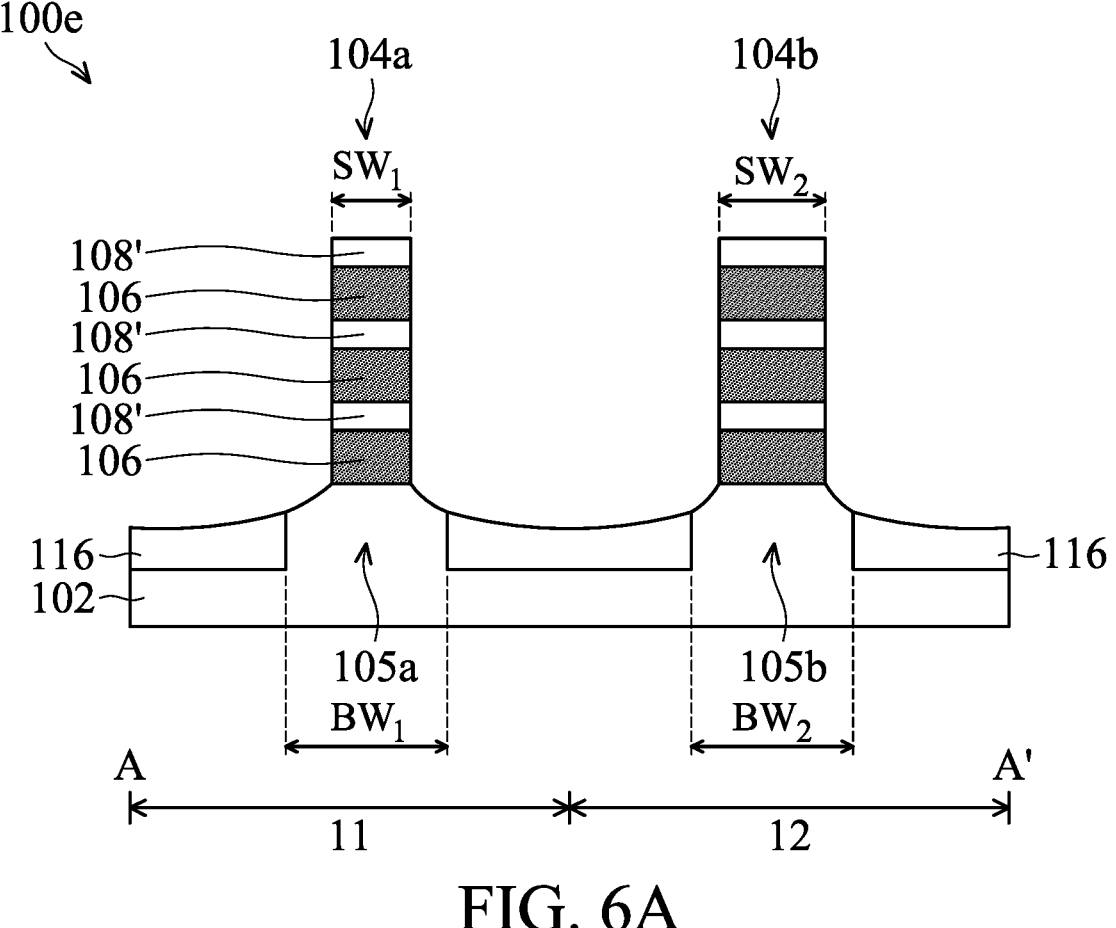
FIGS. 6A to 6B illustrate cross-sectional representations of various stages of manufacturing a semiconductor structure, in accordance with some embodiments.
Figure 6B:
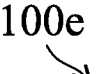

FIGS. 6A to 6B illustrate cross-sectional representations of various stages of manufacturing a semiconductor structure 100*e*, in accordance with some embodiments.

The semiconductor structure 100*e* of FIG. 6A includes elements that are similar to, or the same as, elements of the semiconductor structure 100*c* of FIG. 4A. The difference between the FIG. 6A and FIG. 4A is that the right sidewall portion and the left sidewall portion are not etched equally. Therefore, right sidewall surface of the first base fin structure 105*a* and the left sidewall surface of the first base fin structure 105*b* are asymmetric.

Next, as shown in FIG. 6B, the first portion 142*a*-1 of the first gate structure 142*a* is formed over the nanostructures 108' of the first fin structure 104*a*, and the second portion 142*a*-2 of the first gate structure 142*a* is formed over the nanostructures 108' of the second fin structure 104*b*.

FIGS. 7A to 7D illustrate cross-sectional representations of various stages of manufacturing a semiconductor structure 100*f* after the step of FIG. 3J-2, in accordance with some embodiments. The semiconductor structure 100*e* of FIG. 7D includes elements that are similar to, or the same as, elements of the semiconductor structure 100*a* of FIG. 3M-2.

Figure 7A:
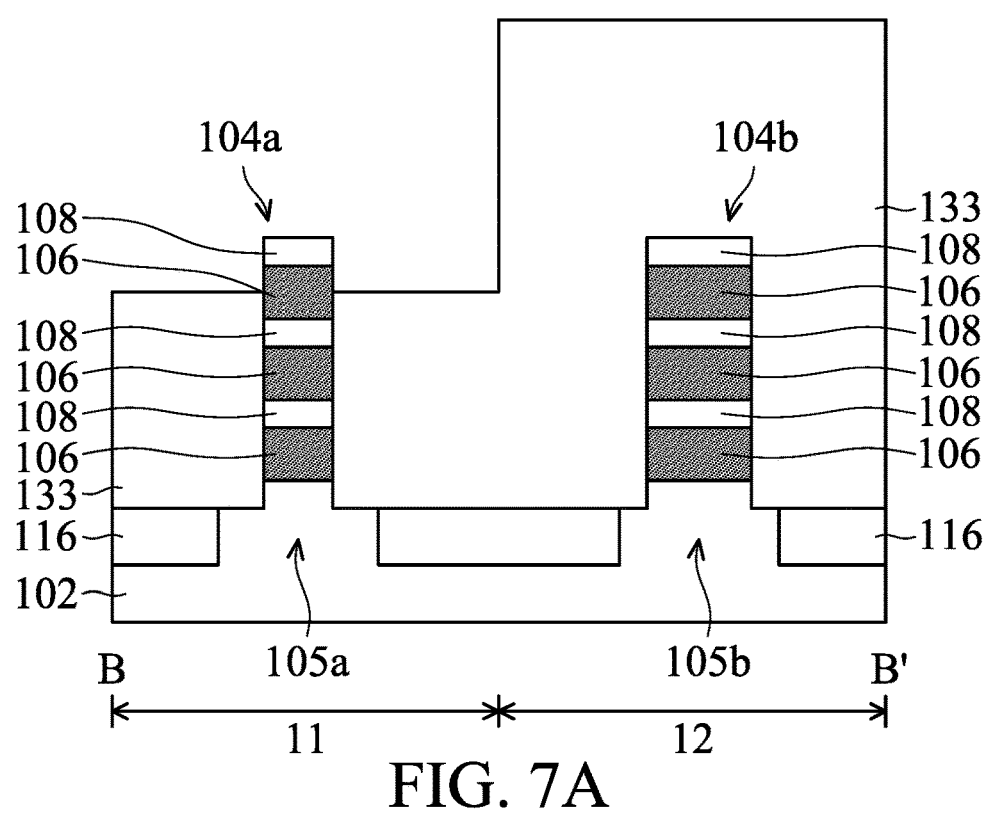
FIGS. 7A to 7D illustrate cross-sectional representations of various stages of manufacturing a semiconductor structure 100f after the step of FIG. 3J-2, in accordance with some embodiments.

As shown in FIG. 7A, the nanostructures 108' (or channel layers 108') in the first sub-region 11 and the second sub-region 12 are covered by a mask layer 133, in accordance with some embodiments. The top portion of the mask layer 133 is removed to expose the topmost nanostructures 108' in the first sub-region 11.

Figure 7B:
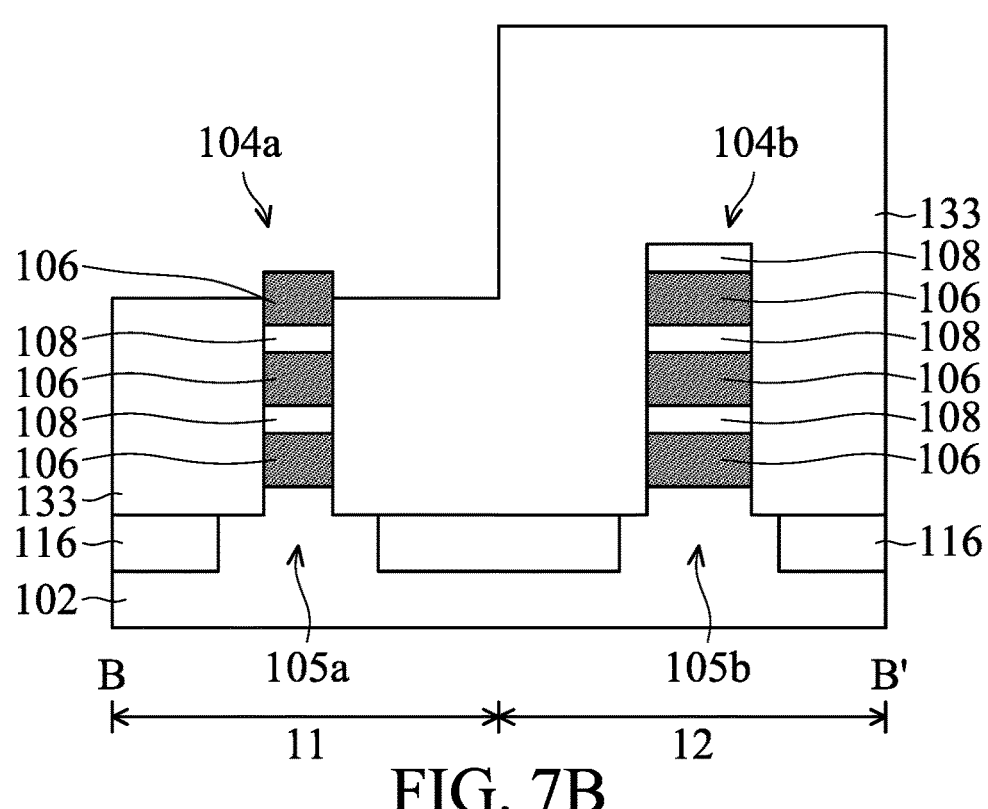

Next, as shown in FIG. 7B, the exposed topmost nanostructures 108' in the first sub-region 11 is removed, in accordance with some embodiments.

Figure 7C:
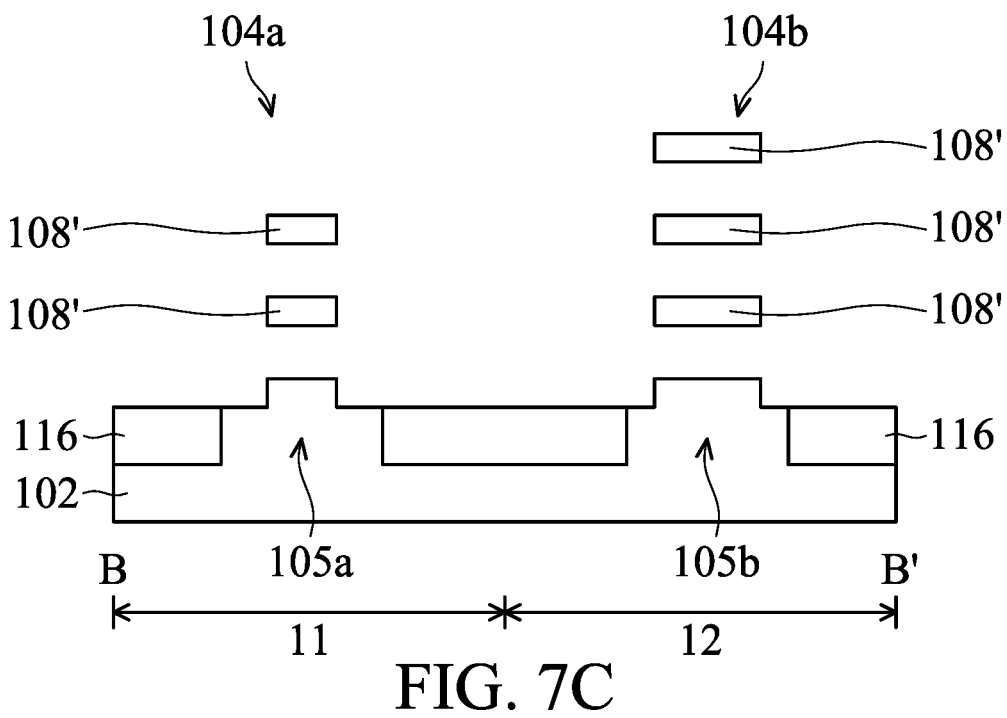
Figure 7D:

Afterwards, as shown in FIG. 7C, all of the mask layer 133 are removed, in accordance with some embodiments. As a result, the number of nanostructures 108' (or channel layers 108') in the first sub-region 11 become two, and the number of nanostructures 108' (or channel layers 108') in the second sub-region 12 is still three. All of the nanostructures 108' or the first semiconductor material layers 108 in the second sub-region 12 is not removed and is protected by the mask layer 133.

Figure 8:
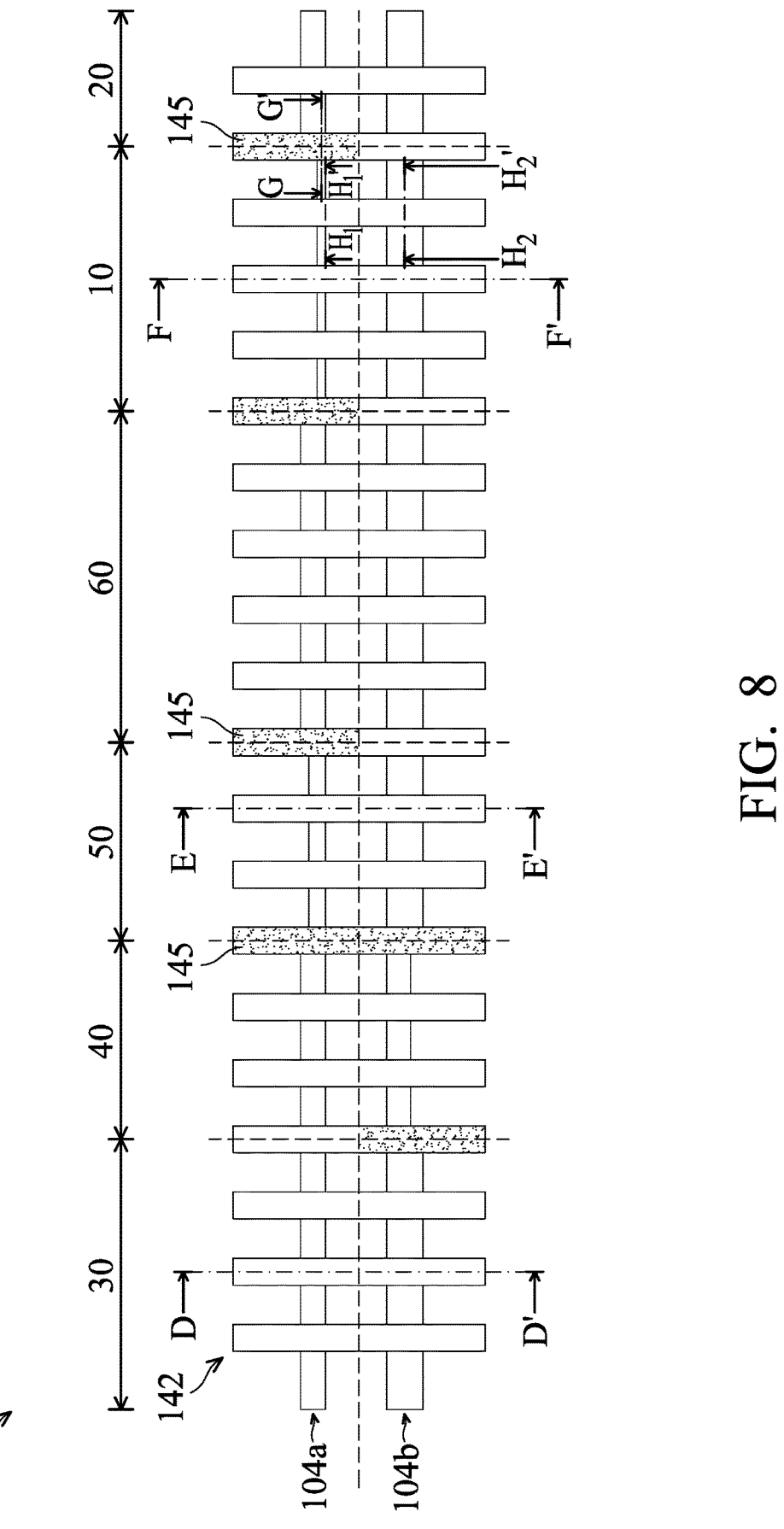
FIG. 8 shows a top-view representation of a semiconductor structure, in accordance with some embodiments.

FIG. 8 shows a top-view representation of a semiconductor structure 200, in accordance with some embodiments. The semiconductor structure 200 includes the first region 10, a second region 20, a third region 30, a fourth region 40, a fifth region 50 and a sixth region 60. A dielectric structure 145 is used to define different regions. The first fin structure 104a has different widths in different regions. The second fin structure 104b also has different widths in different regions. The width of the first fin structure 104a at the right side of the dielectric structure 145 is different from the width of the first fin structure 104a at the left side of the dielectric structure 145. The width of the second fin structure 104b at the right side of the dielectric structure 145 is different from the width of the second fin structure 104b at the left side of the dielectric structure 145.

Figure 9A:
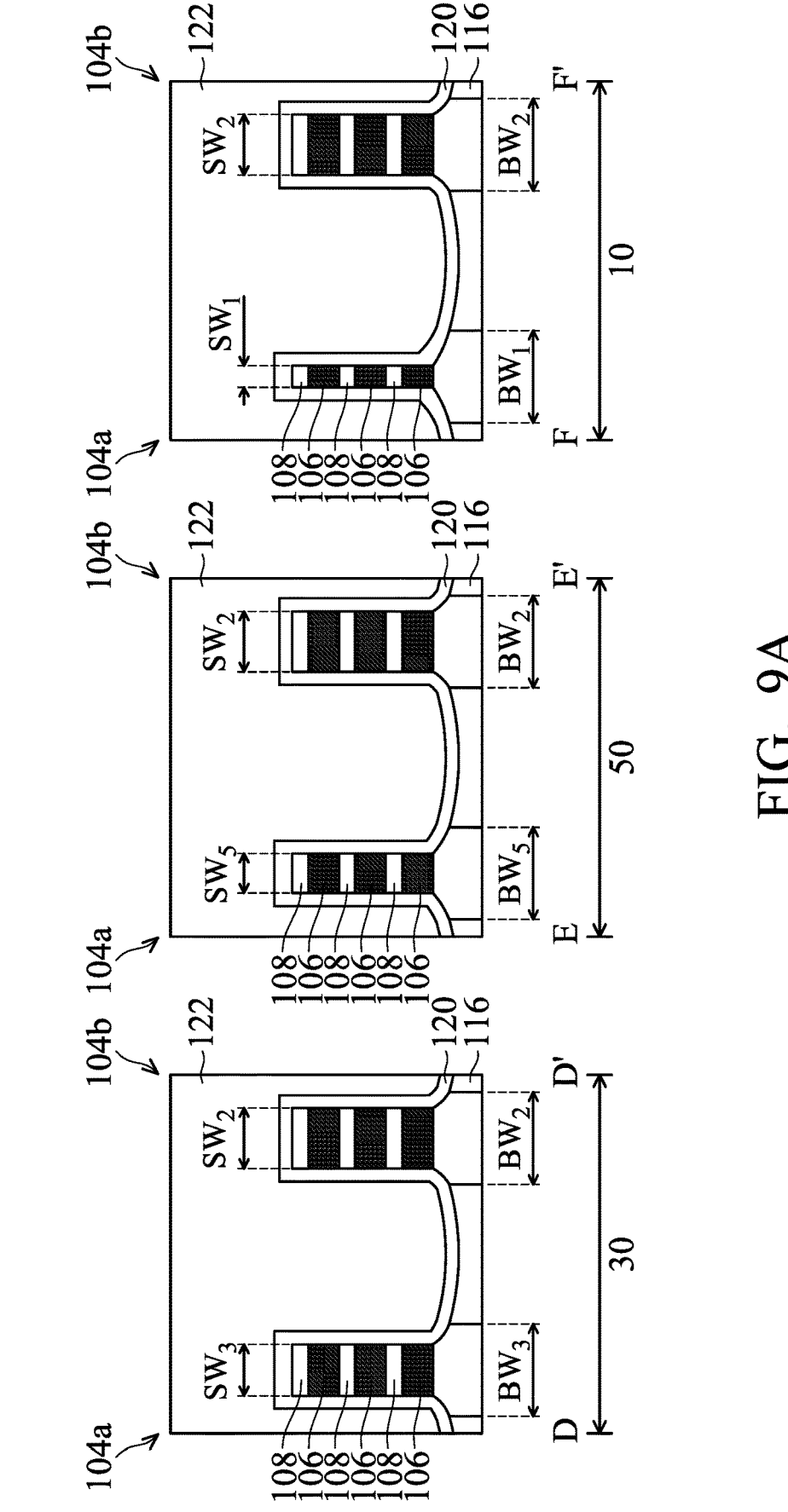
FIGS. 9A to 9B illustrate cross-sectional representations of various stages of manufacturing of a semiconductor shown along lines D-D', E-E' and F-F' in FIG. 8, in accordance with some embodiments.
Figure 9B:
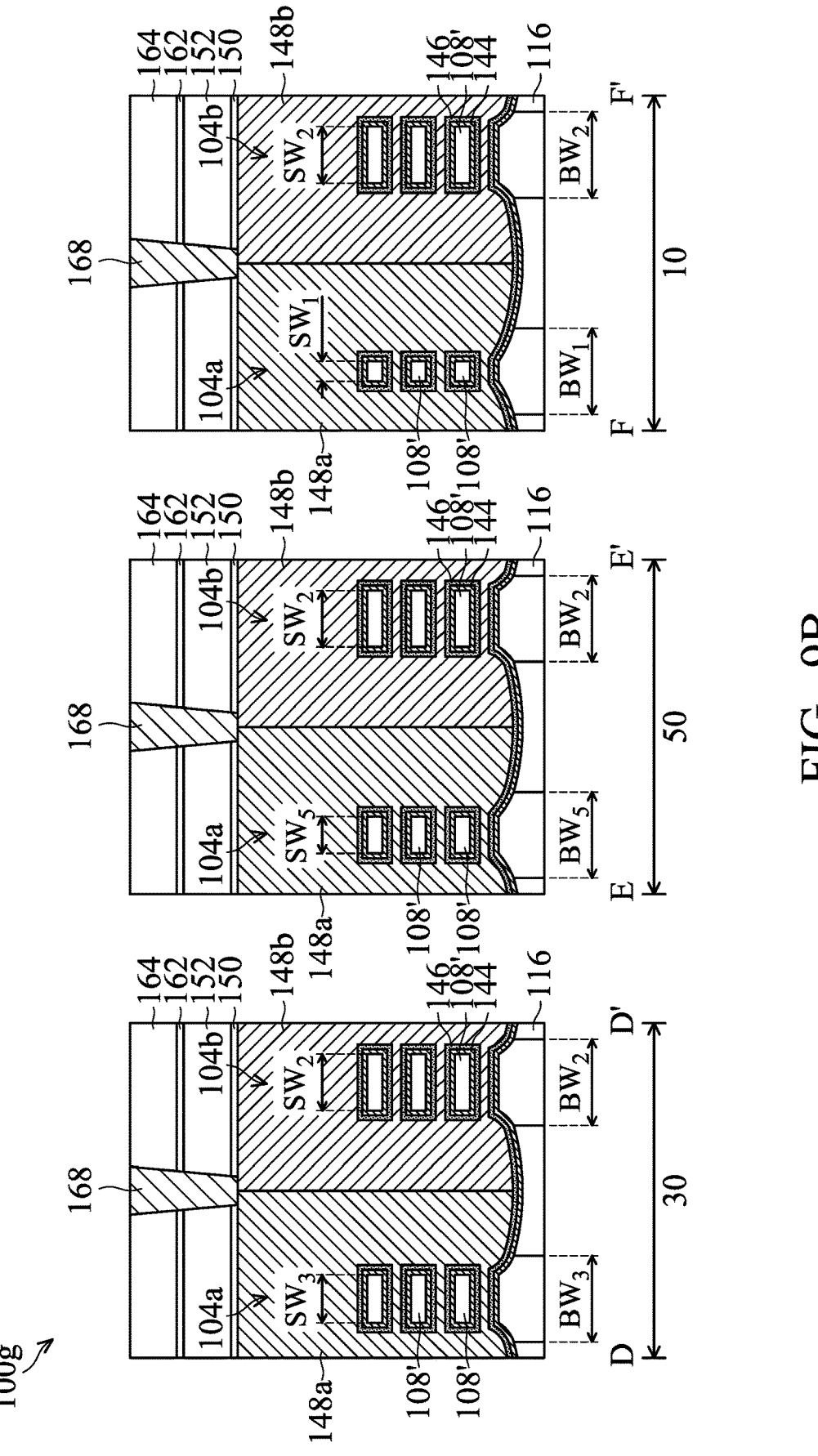

FIGS. 9A to 9B illustrate cross-sectional representations of various stages of manufacturing of a semiconductor 100g shown along lines D-D', E-E' and F-F' in FIG. 8, in accordance with some embodiments.

As shown in FIG. 9A, in the first region 10, the first fin structure 104a has the first sheet width $SW_1$, and the first base fin structure 105a has the first base width $BW_1$. The first base width $BW_1$ is greater than the first sheet width $SW_1$.

In the third region 30, the first fin structure 104a has a third sheet width $SW_3$, and the first base fin structure 105a has a third base width $BW_3$. The third base width $BW_3$ is greater than the third sheet width $SW_3$.

In the fifth region 50, the first fin structure 104a has a fifth sheet width $SW_5$, and the first base fin structure 105a has a fifth base width $BW_5$. The fifth base width $BW_5$ is greater than the fifth sheet width $SW_5$.

In some embodiments, the third sheet width $SW_3$ is greater than the fifth sheet width $SW_5$, and the fifth sheet width $SW_5$ is greater than the first sheet width $SW_1$. In some embodiments, the third base width $BW_3$ is greater than the fifth base width $BW_5$, and the fifth base width $BW_5$ is substantially equal to the first base width $BW_1$.

In some embodiments, the difference $(\Delta=BW_1-SW_1)$ between the first base width $BW_1$ and the first sheet width $SW_1$ is greater than the difference $(\Delta=BW_2-SW_2)$ between the second base width $BW_2$ and the second sheet width $SW_2$. In some embodiments, the difference $(\Delta=BW_1-SW_1)$ between the first base width $BW_1$ and the first sheet width $SW_1$ is greater than the difference $(\Delta=BW_3-SW_3)$ between the third base width $BW_3$ and the third sheet width $SW_3$. In some embodiments, the difference $(\Delta=BW_1-SW_1)$ between the first base width $BW_1$ and the first sheet width $SW_1$ is greater than the difference $(\Delta=BW_5-SW_5)$ between the fifth base width $BW_5$ and the fifth sheet width $SW_5$.

In some embodiments, the difference $(\Delta=BW_1-SW_1)$ between the first base width $BW_1$ and the first sheet width $SW_1$ is in a range from about 4 nm to about 16 nm. In some embodiments, the difference $(\Delta=BW_3-SW_3)$ between the third base width $BW_3$ and the third sheet width $SW_3$ is substantially equal to the difference $(\Delta=BW_5-SW_5)$ between the fifth base width $BW_5$ and the fifth sheet width $SW_5$. In some embodiments, the difference $(\Delta=BW_3-SW_3)$ between the third base width $BW_3$ and the third sheet width $SW_3$ is in a range from about 2 nm to about 10 nm. In some embodiments, the difference $(\Delta=BW_5-SW_5)$ between the fifth base width $BW_5$ and the fifth sheet width $SW_5$ is in a range from about 2 nm to about 10 nm.

Next, as shown in FIG. 9B, the first portion 142a-2 of first gate structure 142a is formed over the nanostructures 108' of the first fin structure 104a, and the second portion 142a-2 of the first gate structure 142a is formed over the nanostructures 108' of the second fin structure 104b.

Figure 10:
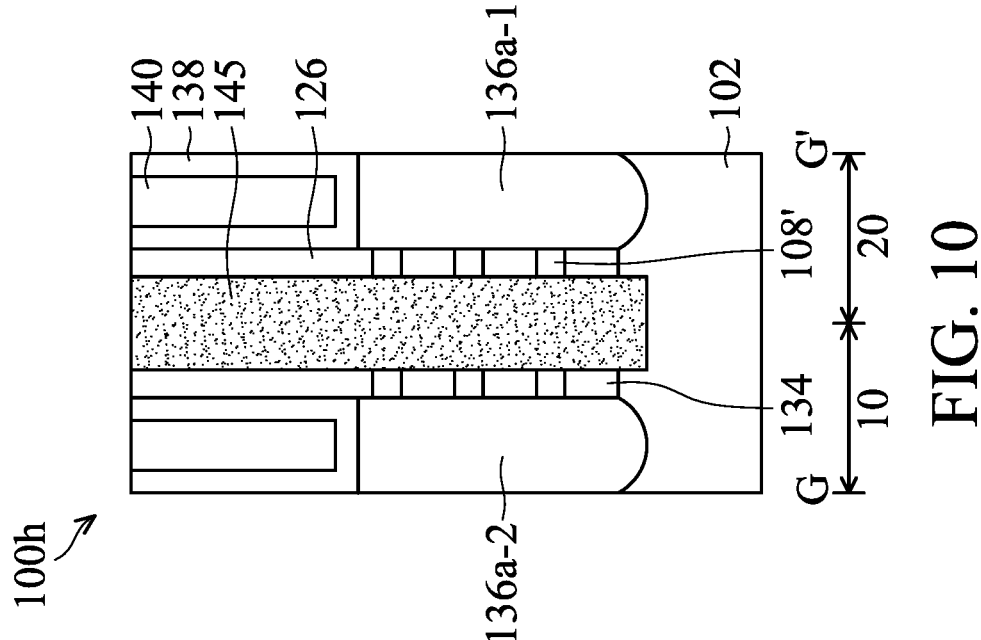
FIG. 10 illustrates a cross-sectional representation of various stages of manufacturing of a semiconductor shown along line G-G' in FIG. 8, in accordance with some embodiments.

FIG. 10 illustrates a cross-sectional representation of various stages of manufacturing of a semiconductor 100h shown along line G-G' in FIG. 8, in accordance with some embodiments.

As shown in FIG. 10, the dielectric structure 145 is between the first region 10 and the second region 20. The dielectric structure 145 is used to reduce the leakage of two adjacent semiconductor devices. The dielectric structure 145 is between the first S/D structure 136a-1 and the second S/D structure 136a-2. In some embodiments, the bottom surface of the dielectric structure 145 is lower than the bottom surface of the first S/D structure 136a-1.

Figure 11A:
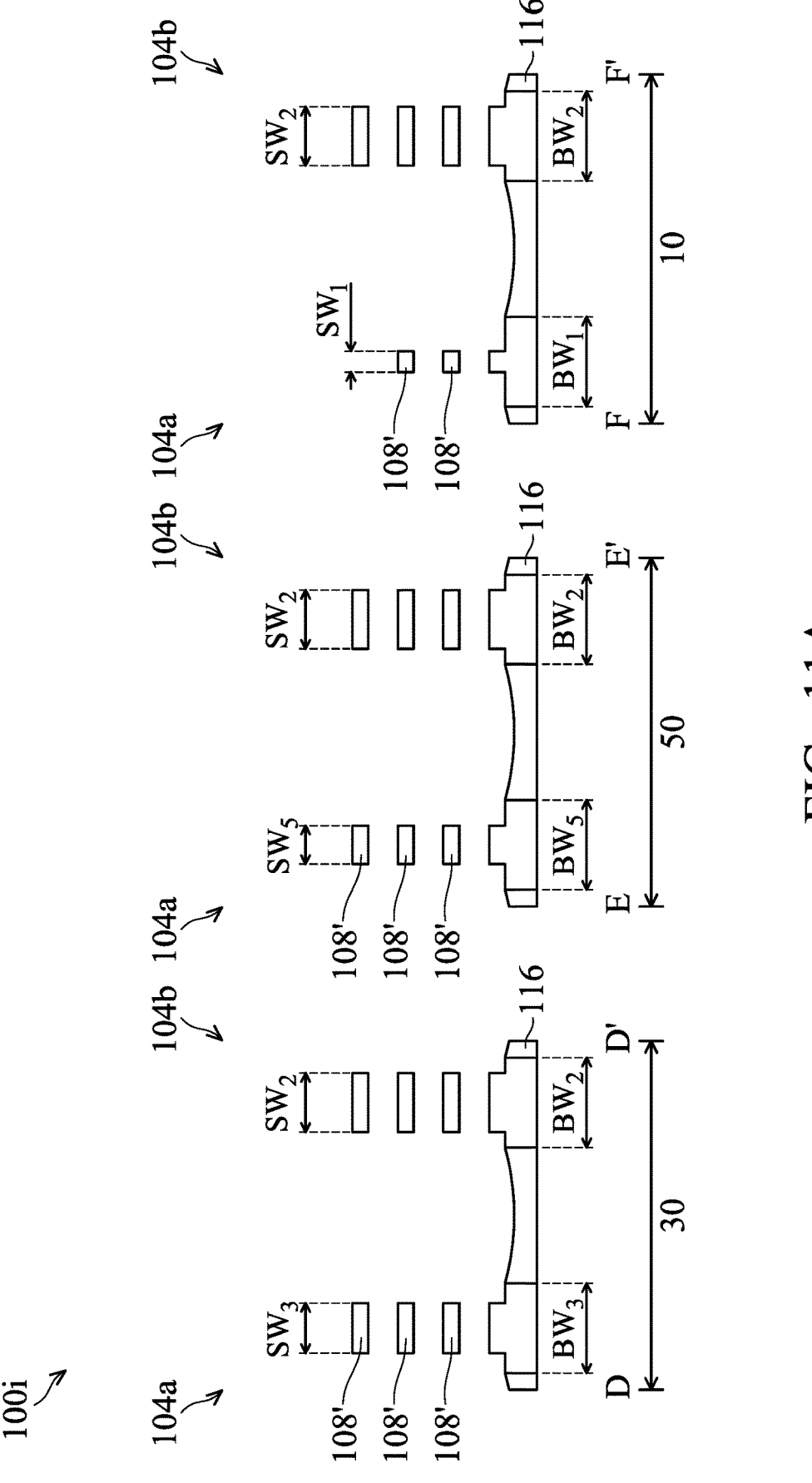
FIGS. 11A to 11B illustrate cross-sectional representations of various stages of manufacturing of a semiconductor shown along lines D-D', E-E' and F-F' in FIG. 8, in accordance with some embodiments.
Figure 11B:
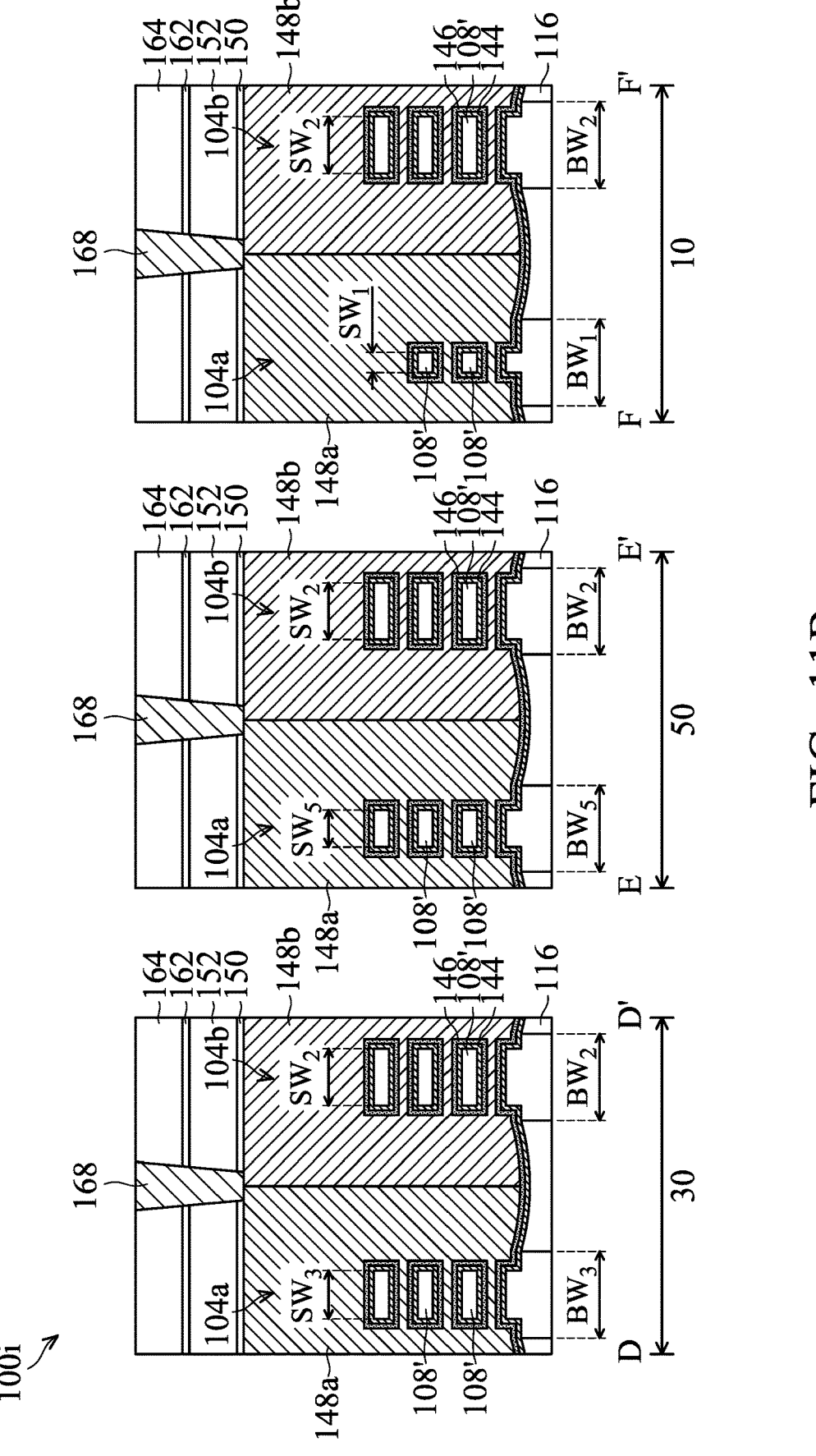

FIGS. 11A to 11B illustrate cross-sectional representations of various stages of manufacturing of a semiconductor 100i shown along lines D-D', E-E' and F-F' in FIG. 8, in accordance with some embodiments. The semiconductor structure 100i of FIG. 11A includes elements that are similar to, or the same as, elements of the semiconductor structure 100g of FIG. 9B.

The difference between the FIG. 11A and FIG. 9B is that in the first region 10, the number of nanostructures 108' of the first fin structure 104a directly below the first portion 142a-1 of the first gate structure 142 become two, and the number of nanostructures 108' of the second fin structure 104b directly below the second portion 142a-2 of the first gate structure 142 is still three. The processes described in FIGS. 7A-7C are performed on the semiconductor 100i.

Next, as shown in FIG. 11B, the first portion 142a-1 of the first gate structure 142a is formed over the nanostructures 108' of the first fin structure 104a, and the portion 142a-2 of the first gate structure 142a is formed over the nanostructures 108' of the second fin structure 104b.

Figures 12, 13:
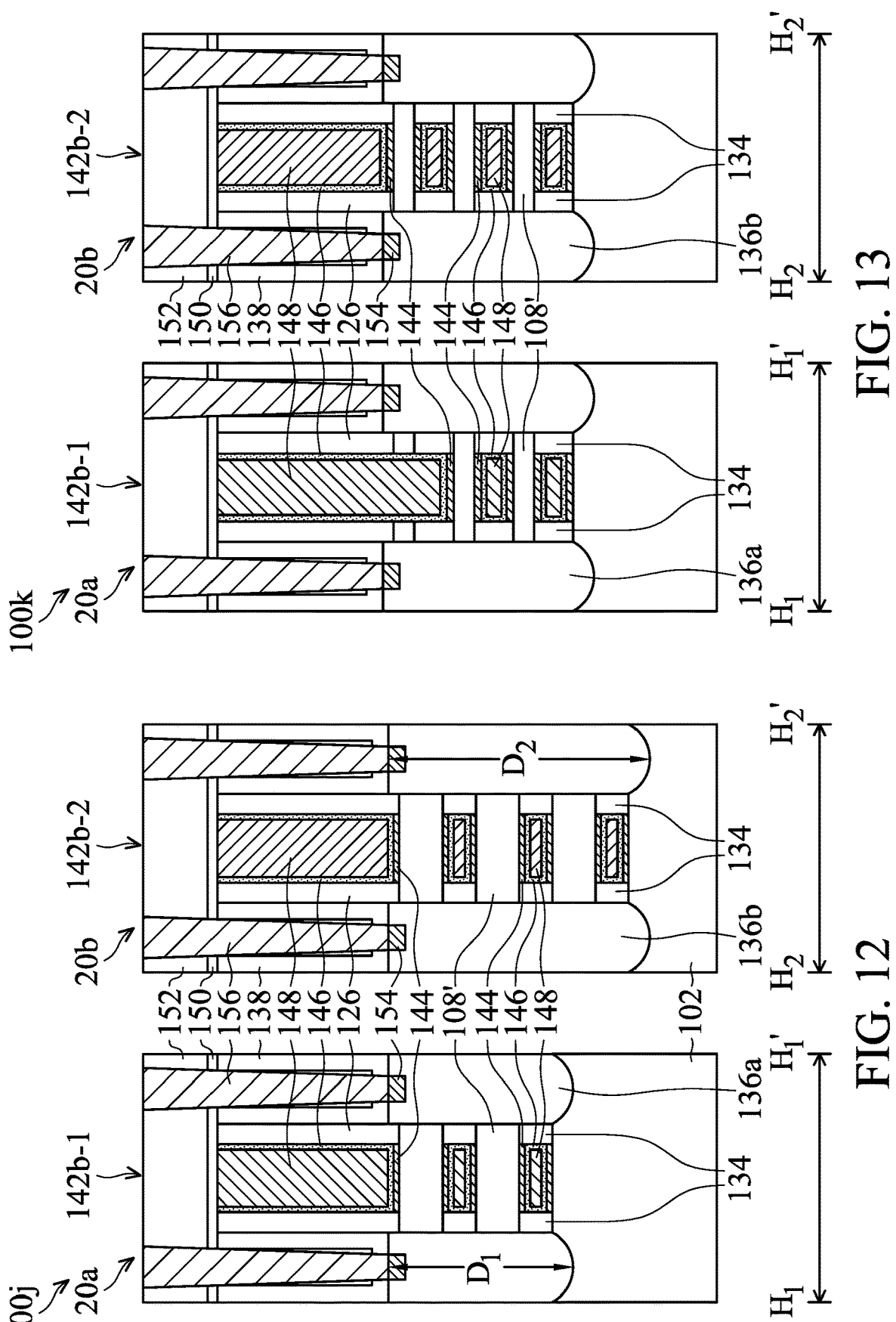
FIG. 12 illustrates a cross-sectional representation of various stages of manufacturing of a semiconductor shown along line $H_1$-$H_1'$ and line $H_2$-$H_2'$ in FIG. 8, in accordance with some embodiments.
FIG. 13 illustrates a cross-sectional representation of various stages of manufacturing of a semiconductor shown along line $H_1$-$H_1'$ and line $H_2$-$H_2'$ in FIG. 8, in accordance with some embodiments.

FIG. 12 illustrates a cross-sectional representation of various stages of manufacturing of a semiconductor 100j shown along line $H_1$-$H_1$' and line $H_2$-$H_2$' in FIG. 8, in accordance with some embodiments. The semiconductor structure 100j includes a first device 20a and a second device 20b.

As shown in FIG. 12, the number of nanostructures 108' of the first device 20a is smaller than the number of nanostructures 108' of the second device 20b. In some embodiments, the number of nanostructures 108' of the first device 20a is two, and the number of nanostructures 108' of the second device 20b is three. The number of channel layers 108' of the first device 20a is smaller than the number of channel layers 108' of the second device 20b.

Furthermore, the first S/D structure 136a in the first device 20a has a first depth $D_1$, and the second S/D structure 136$b$ in the second device 20$b$ has a second depth $D_2$. In some embodiments, the first depth $D_1$ is smaller than the second depth $D_2$.

More nanostructures (e.g. three nanostructures 108' in the second device 20$b$) can provide large effective width ($W_{eff}$) of the channel layer. The large effective width ($W_{eff}$) of the channel layer can provide high speed of the second device 20$b$. However, the larger effective width of the channel layer consumes more power. For high speed performance consideration, larger effective width ($W_{eff}$) is formed by having more nanostructures. For power efficiency, a smaller effective width ($W_{eff}$) is formed by having fewer nanostructures.

In order to fulfill different needs in a region, the first portion 142$b$-1 of the second gate structure 142$b$ in the first device 20$a$ is formed for power efficiency, and the second portion 142$b$-2 of the second gate structure 142$b$ in the second device 20$b$ is formed for high speed performance. The first portion 142$b$-1 of the second gate structure 142$b$ and second portion 142$b$-2 of the second gate structure 142$b$ co-exist to achieve multi-nanostructures for speed performance and power efficiency.

FIG. 13 illustrates a cross-sectional representation of various stages of manufacturing of a semiconductor 100$k$ shown along line $H_1$-$H_1$' and line $H_2$-$H_2$' in FIG. 8, in accordance with some embodiments.

As shown in FIG. 13, the number of nanostructures 108' (or channel layers 108') directly below in the first portion 142$b$-1 of the second gate structure 142$b$ becomes two, and the number of nanostructures 108' (or channel layers 108') directly below the second portion 142$b$-2 of the second gate structure 142$b$ is still three. More specifically, the number of nanostructures 108' (or channel layers 108') directly below the first portion 142$b$-1 of the second gate structure 142$b$ is two, and the number of nanostructures 108' (or channel layers 108') directly below the gate spacer layer 126 is three.

Furthermore, the number of nanostructures 108' (or channel layers 108') directly below in the second portion 142$b$-2 of the second gate structure 142$b$ is three. Therefore, the number of nanostructures 108' (or channel layers 108') directly below the first portion 142$b$-1 of the second gate structure 142$b$ is smaller than the number of nanostructures 108' (or channel layers 108') directly below in the second portion 142$b$-2 of the second gate structure 142$b$.

The first portion 142$b$-1 of the second gate structure 142$b$ has a continuous sidewall surface in direct contact with the gate spacer layer 126, and the bottom surface of the continuous sidewall surface of the first gate structure 142$a$ is lower than the bottom surface of the gate spacer layer 126. In addition, the continuous sidewall surface of the first portion 142$b$-1 of the second gate structure 142$b$ is in direct contact with the topmost nanostructure 108$a$'.

It should be noted that the topmost nanostructure 108' is divided into two portions by the first portion 142$b$-1 of the second gate structure 142$b$, and the two portions of the topmost nanostructure 108' are in direct contact with the gate spacer layer 126.

More nanostructures (e.g. three nanostructures 108' directly below the second gate structure 142$b$) can provide large effective width ($W_{eff}$) of the channel layer. The large effective width ($W_{eff}$) of the channel layer can provide high speed of the semiconductor structure 100$k$. However, the larger effective width of the channel layer consumes more power. For high speed performance consideration, larger effective width ($W_{eff}$) is formed by having more nanostructures. For power efficiency, a smaller effective width ($W_{eff}$) is formed by having fewer nanostructures.

In order to fulfill different needs in a region, the first portion 142$b$-1 of the second gate structure 142$b$ is formed for power efficiency, and the second portion 142$b$-2 of the second gate structure 142$b$ is formed for high speed performance. The first portion 142$b$-1 of the second gate structure 142$b$ and second portion 142$b$-2 of the second gate structure 142$b$ co-exist to achieve multi-nanostructures for speed performance and power efficiency.

Figure 14A:
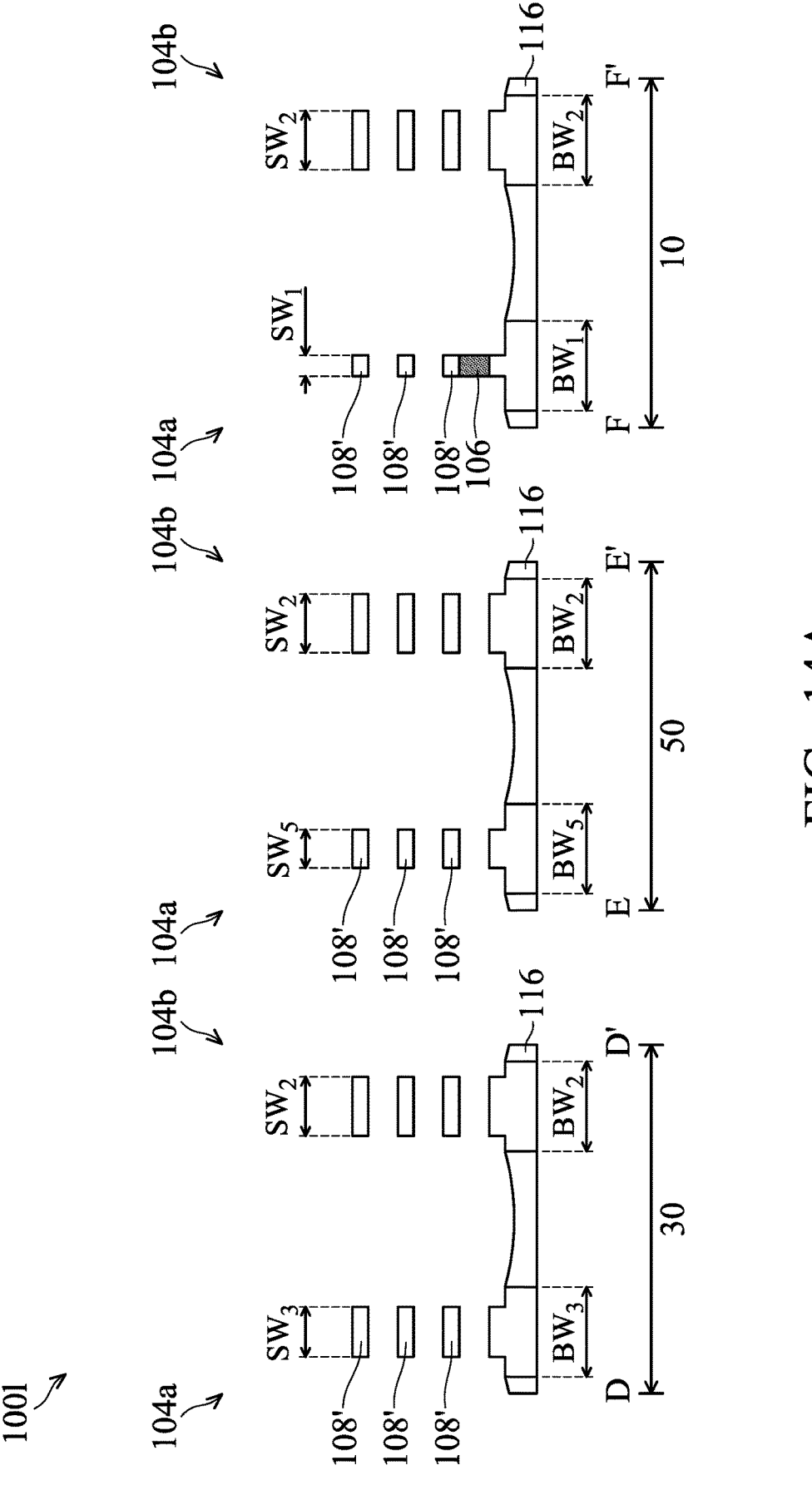
FIGS. 14A to 14B illustrate cross-sectional representations of various stages of manufacturing of a semiconductor shown along lines D-D', E-E' and F-F' in FIG. 8, in accordance with some embodiments.
Figure 14B:
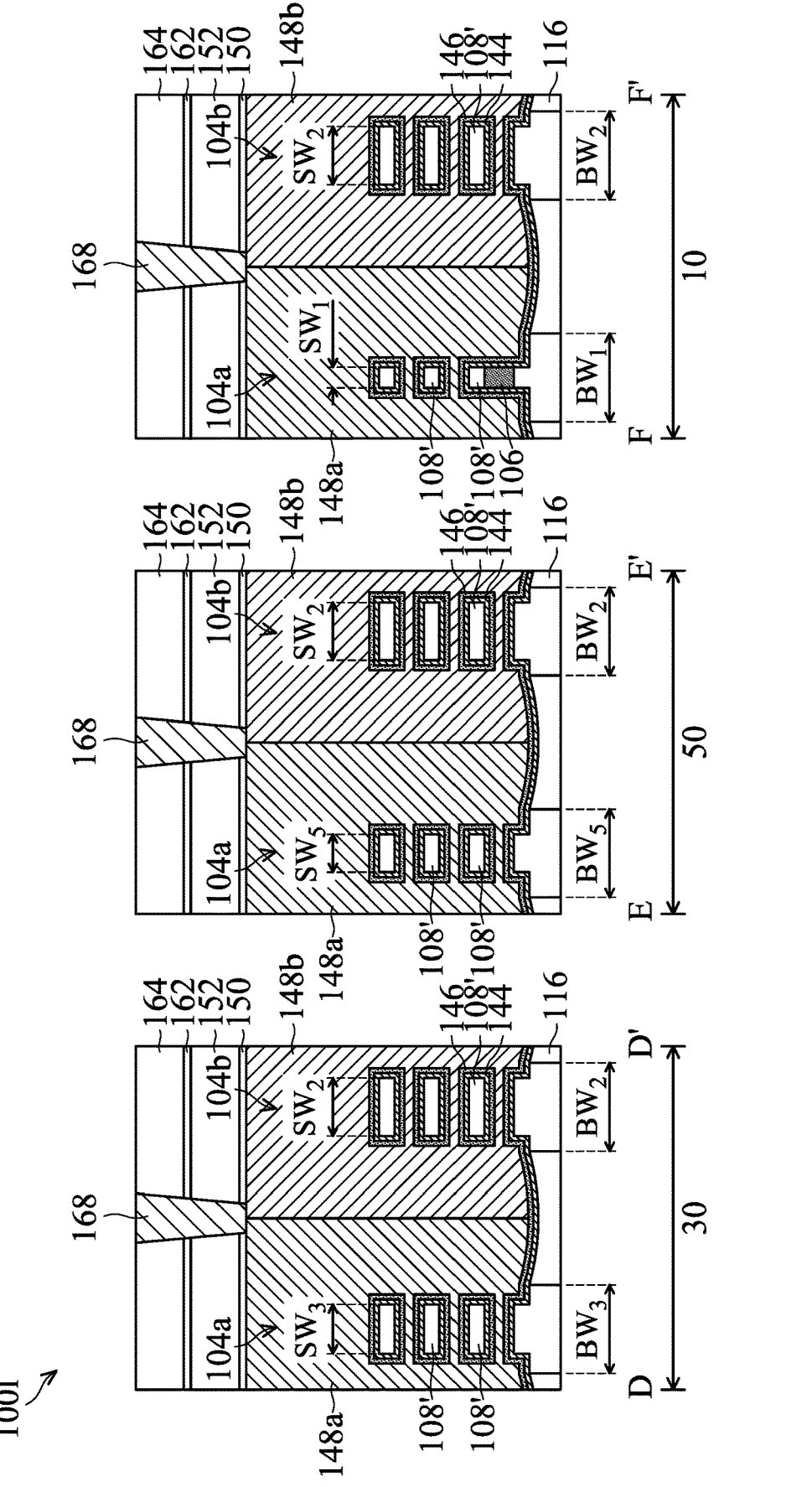

FIGS. 14A to 14B illustrate cross-sectional representations of various stages of manufacturing of a semiconductor 100$l$ shown along lines D-D', E-E' and F-F' in FIG. 8, in accordance with some embodiments. The semiconductor structure 100$l$ of FIG. 14A includes elements that are similar to, or the same as, elements of the semiconductor structure 100$g$ of FIG. 9B. The difference between FIG. 14A and FIG. 9B is that the bottommost first semiconductor layer 106 remains because it is not removed. In some embodiments, the bottommost first semiconductor layer 106 is made of silicon germanium (SiGe).

Next, as shown in FIG. 14B, the first portion 142$a$-1 of the gate structure 142$a$ is formed over the nanostructures 108' of the first fin structure 104$a$, and the second portion 142$a$-2 of the first gate structure 142$a$ is formed over the nanostructures 108' of the second fin structure 104$b$.

Figures 15, 16:
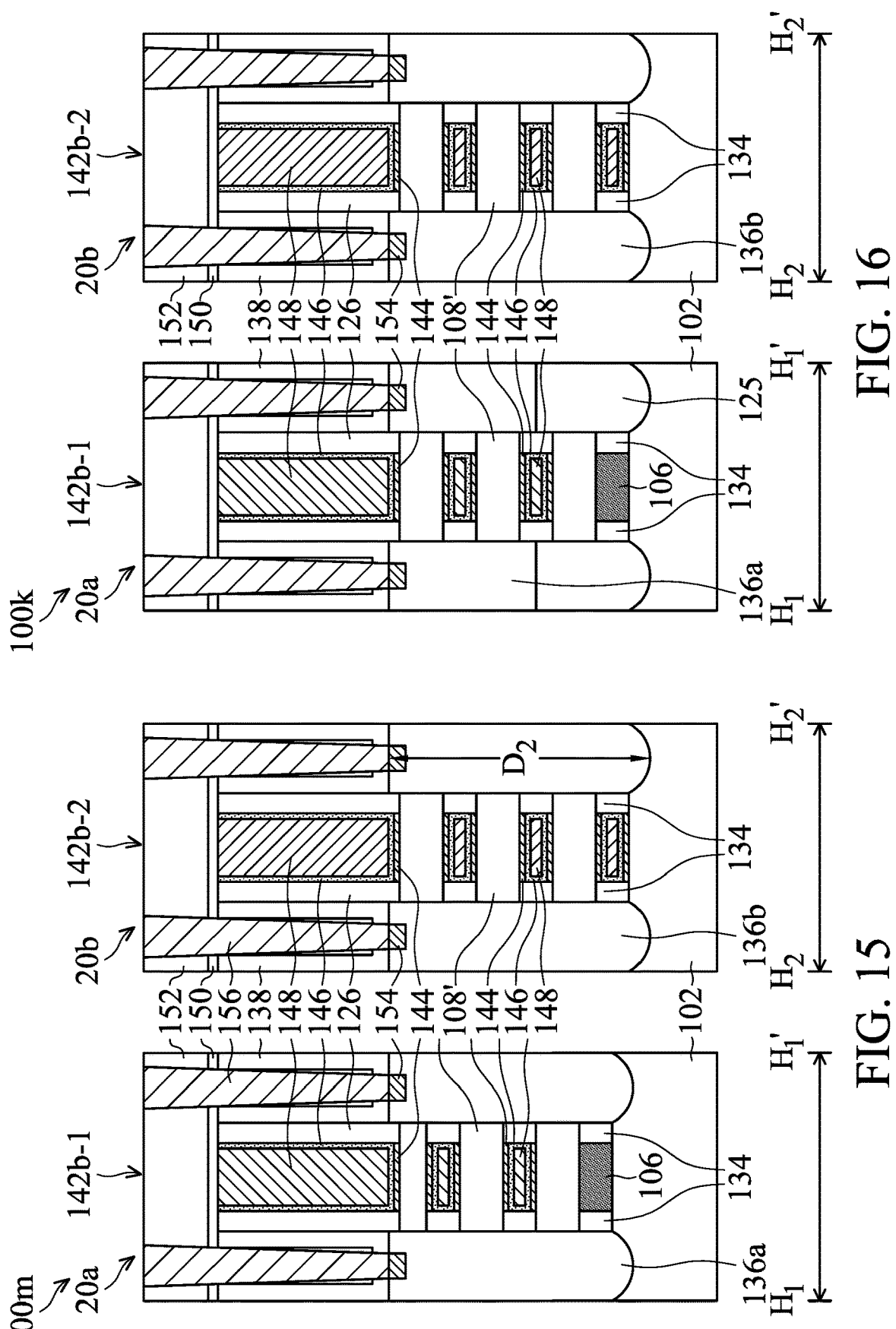
FIG. 15 illustrates a cross-sectional representation of various stages of manufacturing of a semiconductor shown along line $H_1$-$H_1'$ and line $H_2$-$H_2'$ in FIG. 8, in accordance with some embodiments.
FIG. 16 illustrates a cross-sectional representation of various stages of manufacturing of a semiconductor shown along line $H_1$-$H_1'$ and line $H_2$-$H_2'$ in FIG. 8, in accordance with some embodiments.

FIG. 15 illustrates a cross-sectional representation of various stages of manufacturing of a semiconductor 100$m$ shown along line $H_1$-$H_1$' and line $H_2$-$H_2$' in FIG. 8, in accordance with some embodiments.

As shown in FIG. 15, the bottommost first semiconductor material layer 106 of the first device 20$a$ is not removed, and therefore the effective number of nanostructures 108' in the first device 20$a$ is smaller than the effective number of nanostructures 108' in the second device 20$b$. It should be noted that the remaining bottommost first semiconductor material layer 106 of the first device 20$a$ and the nanostructures 108' are made of different materials. In some embodiments, the nanostructures 108' are made of Si, and the remaining bottommost first semiconductor material layer 106 is made of the SiGe.

FIG. 16 illustrates a cross-sectional representation of various stages of manufacturing of a semiconductor 100$n$ shown along line $H_1$-$H_1$' and line $H_2$-$H_2$' in FIG. 8, in accordance with some embodiments.

As shown in FIG. 16, the bottommost first semiconductor material layer 106 of the first device 20$a$ is not removed, and a lightly doped structure 125 is directly below the first S/D structure 136$a$ in the first device 20$a$.

Since the top surface of the lightly doped structure 125 is higher than the top surface of the bottommost nanostructure 108' in the first device 20$a$, the bottommost nanostructures 108' become inactive. The effective number of first device 20$a$ becomes two. Therefore, the effective number of nanostructures 108' in the first device 20$a$ is smaller than the effective number of nanostructures 108' in the second device 20$b$.

Figure 17A:
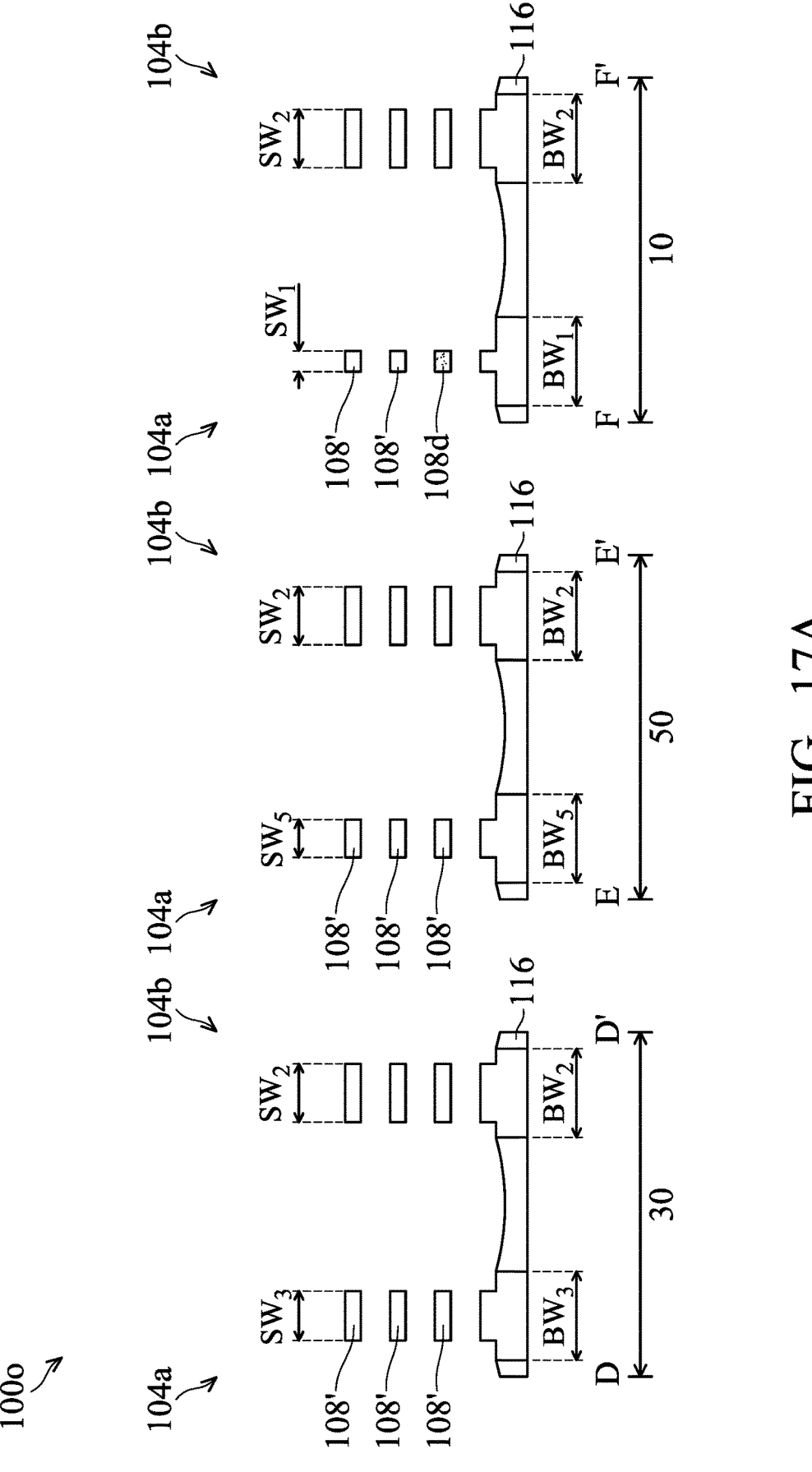
FIGS. 17A to 17B illustrate cross-sectional representations of various stages of manufacturing of a semiconductor shown along lines D-D', E-E' and F-F' in FIG. 8, in accordance with some embodiments.
Figure 17B:
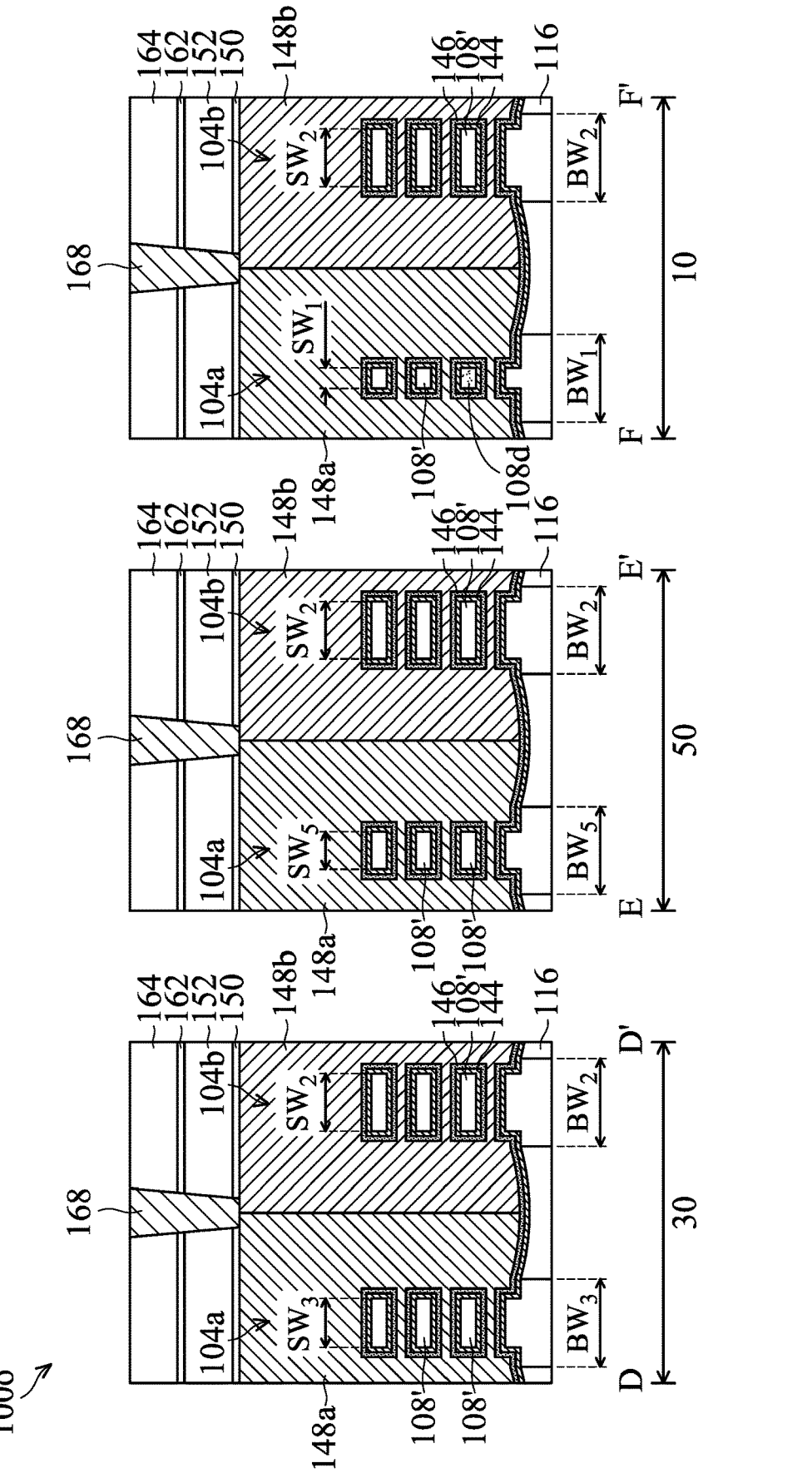

FIGS. 17A to 17B illustrate cross-sectional representations of various stages of manufacturing of a semiconductor 1000 shown along lines D-D', E-E' and F-F' in FIG. 8, in accordance with some embodiments. The semiconductor structure 1000 of FIG. 17A includes elements that are similar to, or the same as, elements of the semiconductor structure 100$g$ of FIG. 9B. The difference between FIG. 17A and FIG. 9B is that bottommost nanostructure 108$d$ of the first fin structure 104$a$ become inactive in the first region 10.

Next, as shown in FIG. 17B, the first portion 142$a$-1 of the first gate structure 142$a$ is formed over the nanostructures 108' of the first fin structure 104$a$, and the second portion 142*a*-2 of the first gate structure 142*a* is formed over the nanostructures 108' of the second fin structure 104*b*.

Figures 18, 19:
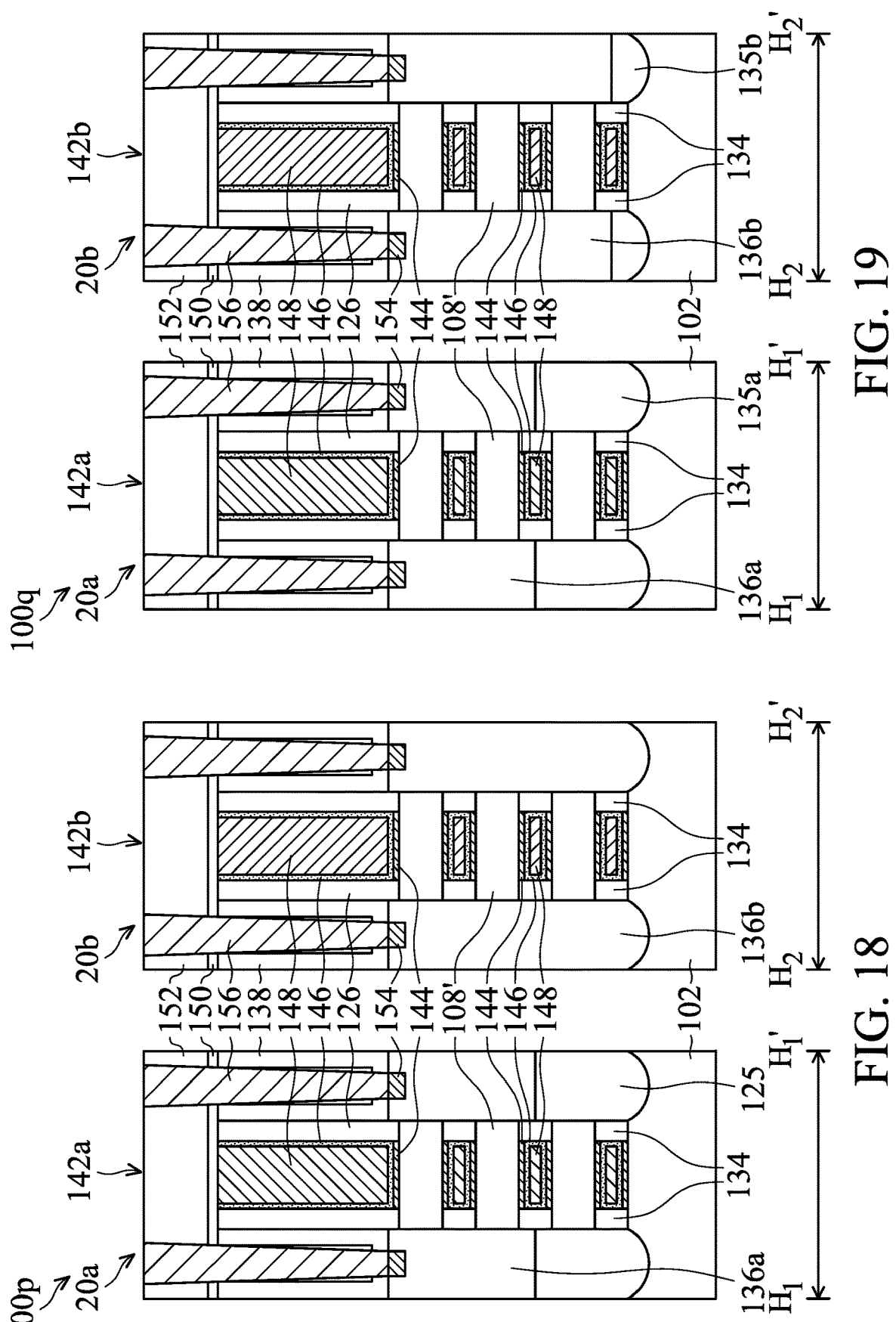
FIG. 18 illustrates a cross-sectional representation of various stages of manufacturing of a semiconductor shown along line $H_1$-$H_1'$ and line $H_2$-$H_2'$ in FIG. 8, in accordance with some embodiments.
FIG. 19 illustrates a cross-sectional representation of various stages of manufacturing of a semiconductor shown along line $H_1$-$H_1'$ and line $H_2$-$H_2'$ in FIG. 8, in accordance with some embodiments.

FIG. 18 illustrates a cross-sectional representation of various stages of manufacturing of a semiconductor 100*p* shown along line H₁-H₁' and line H₂-H₂' in FIG. 8, in accordance with some embodiments.

As shown in FIG. 18, the lightly doped structure 125 is directly below the first S/D structure 136*a* in the first device 20*a*. Since the top surface of the lightly doped structure 125 is higher than the top surface of the bottommost nanostructure 108' in the first device 20*a*, the bottommost nanostructures 108' become inactive. Therefore, the effective number of first device 20*a* becomes two. The effective number of nanostructures 108' in the first device 20*a* is smaller than the effective number of nanostructures 108' in the second device 20*b*.

FIG. 19 illustrates a cross-sectional representation of various stages of manufacturing of a semiconductor 100*q* shown along line H₁-H₁' and line H₂-H₂' in FIG. 8, in accordance with some embodiments.

As shown in FIG. 19, a first bottom isolation layer 135*a* is formed below the first source/drain (S/D) structure 136*a* and a second bottom isolation layer 135*b* is formed below the second S/D structure 136*b*. The first bottom isolation layer 135*a* and the second bottom isolation layer 135*b* are used to reduce the leakage of the semiconductor structure 100*h*. The top surface of the first bottom isolation layer 135*a* is higher than the top surface of the second bottom isolation layer 135*b*. The top surface of the first bottom isolation layer 135*a* is higher than the top surface of the bottommost nanostructure 108' in the first device 20*a*. The top surface of the second bottom isolation layer 135*b* is lower than the top surface of the bottommost nanostructure 108' in the second device 20*b*. Therefore, the effective number of nanostructures 108' in the first device 20*a* becomes two. The effective number of nanostructures 108' in the second device 20 is still three. The effective number of nanostructures 108' in the first device 20*a* is smaller than the effective number of nanostructures 108' in the second device 20*b*.

In some embodiments, the bottom isolation layer 135*a* or the second bottom isolation layer 135*b* includes un-doped Si, un-doped SiGe or a combination thereof. In some embodiments, the first bottom isolation layer 135*a* or the second bottom isolation layer 135*b* is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 20A:
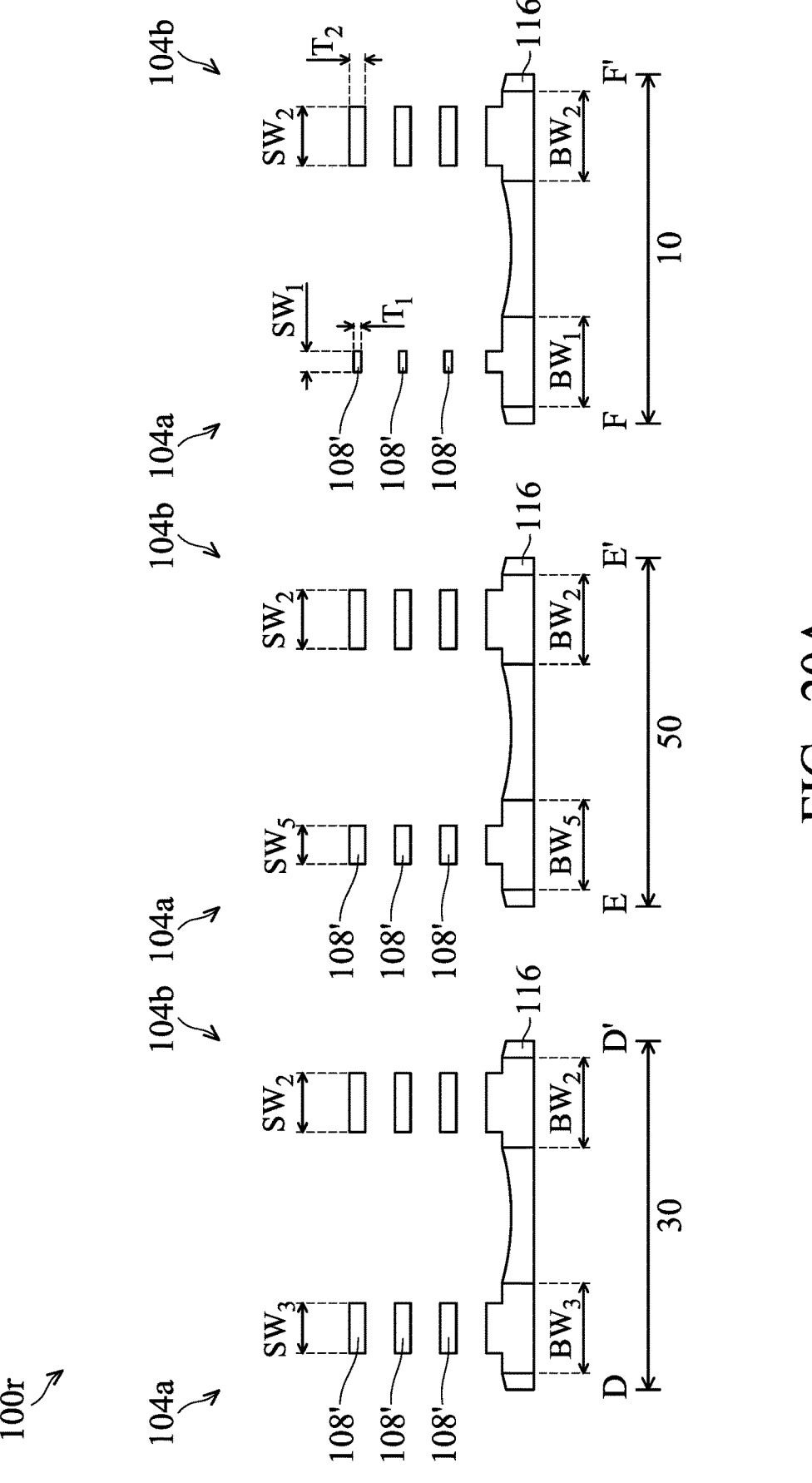
FIGS. 20A to 20B illustrate cross-sectional representations of various stages of manufacturing of a semiconductor shown along lines D-D', E-E' and F-F' in FIG. 8, in accordance with some embodiments.
Figure 20B:
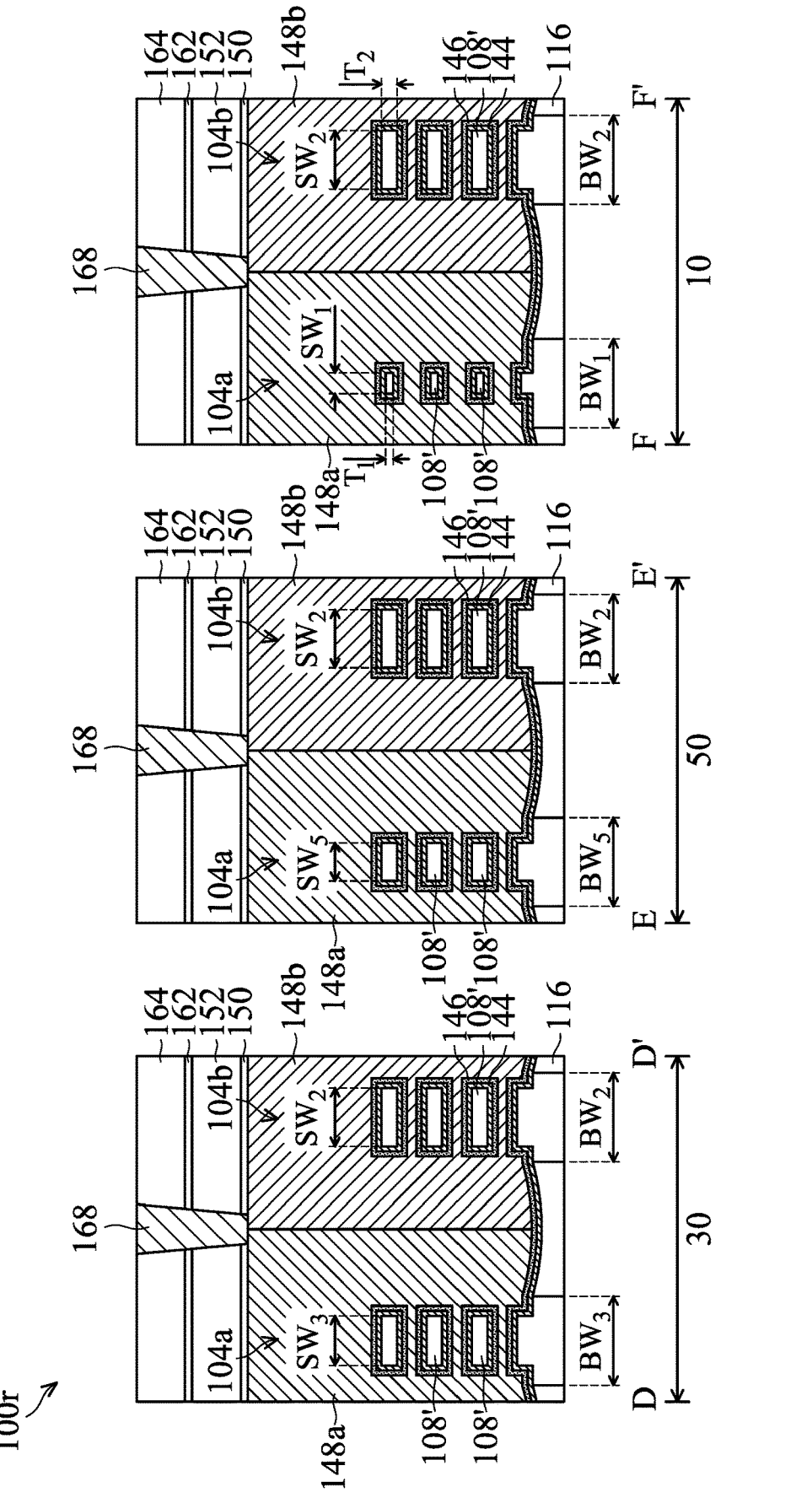

FIGS. 20A to 20B illustrate cross-sectional representations of various stages of manufacturing of a semiconductor 100*r* shown along lines D-D', E-E' and F-F' in FIG. 8, in accordance with some embodiments. The semiconductor structure 100*r* of FIG. 20A includes elements that are similar to, or the same as, elements of the semiconductor structure 100*g* of FIG. 9B. The difference between FIG. 20A and FIG. 9B is that the thickness of the nanostructures 108' of the first fin structure 104*a* is smaller than the thickness of the nanostructures 108' of the second fin structure 104*b*. In some embodiments, the nanostructures 108' of the first fin structure 104*a* has a first thickness T₁ along the vertical direction, and the nanostructures 108' of the second fin structure 104*b* has a second thickness T₂ along the vertical direction. In some embodiments, the first thickness T₁ is smaller than the second thickness T₂.

In some embodiments, a portion of the nanostructures 108' of the first fin structure 104*a* is removed by an etching process, such as a wet etching process or a dry etching process.

Next, as shown in FIG. 20B, the first portion 142*a*-1 of the first gate structure 142*a* is formed over the nanostructures 108' of the first fin structure 104*a*, and the second portion 142*a*-2 of the first gate structure 142*a* is formed over the nanostructures 108' of the second fin structure 104*b*.

Figure 21A:
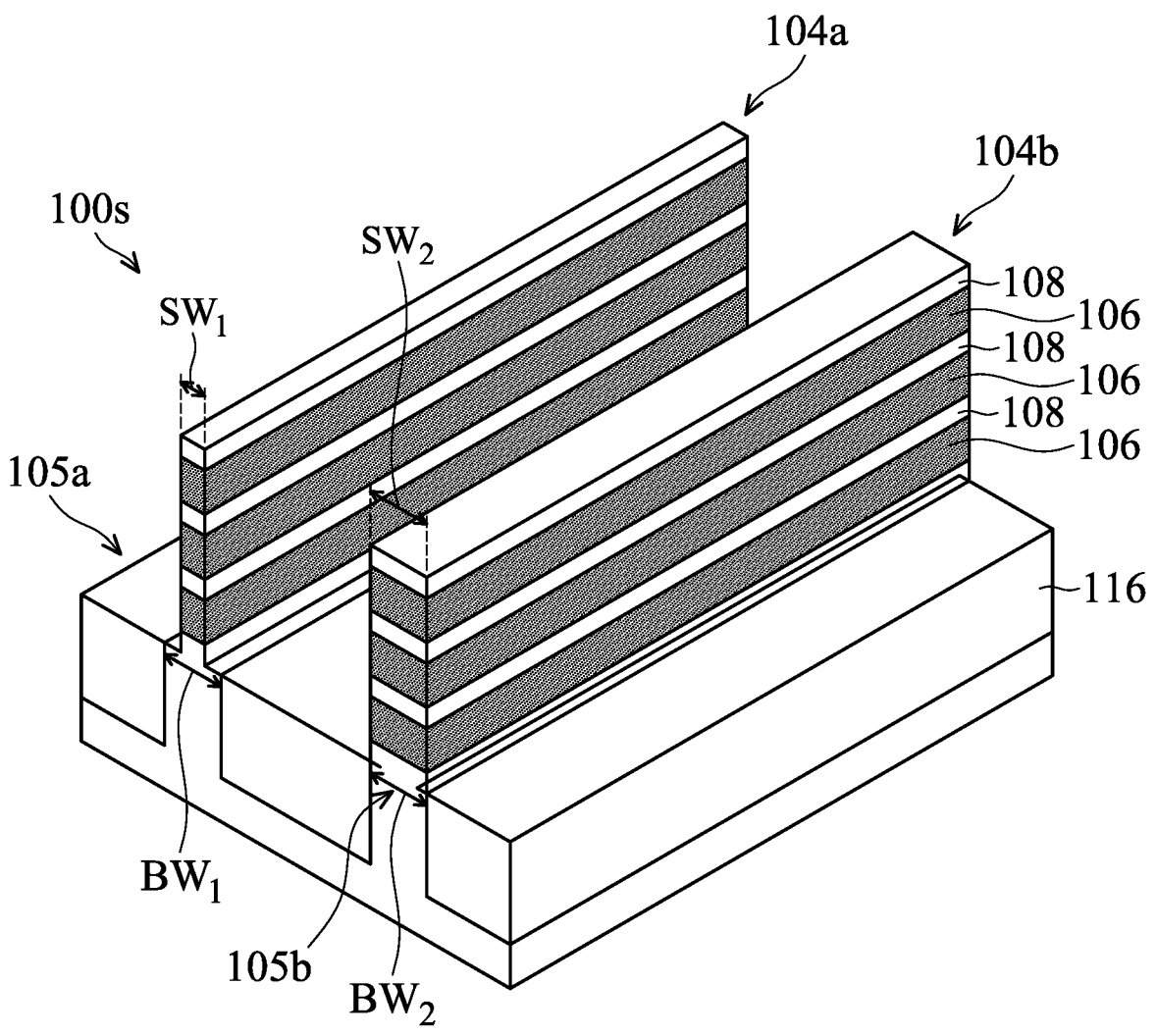
FIGS. 21A to 21C illustrate perspective views of intermediate stages of manufacturing a semiconductor structure, in accordance with some embodiments.
Figure 21B:
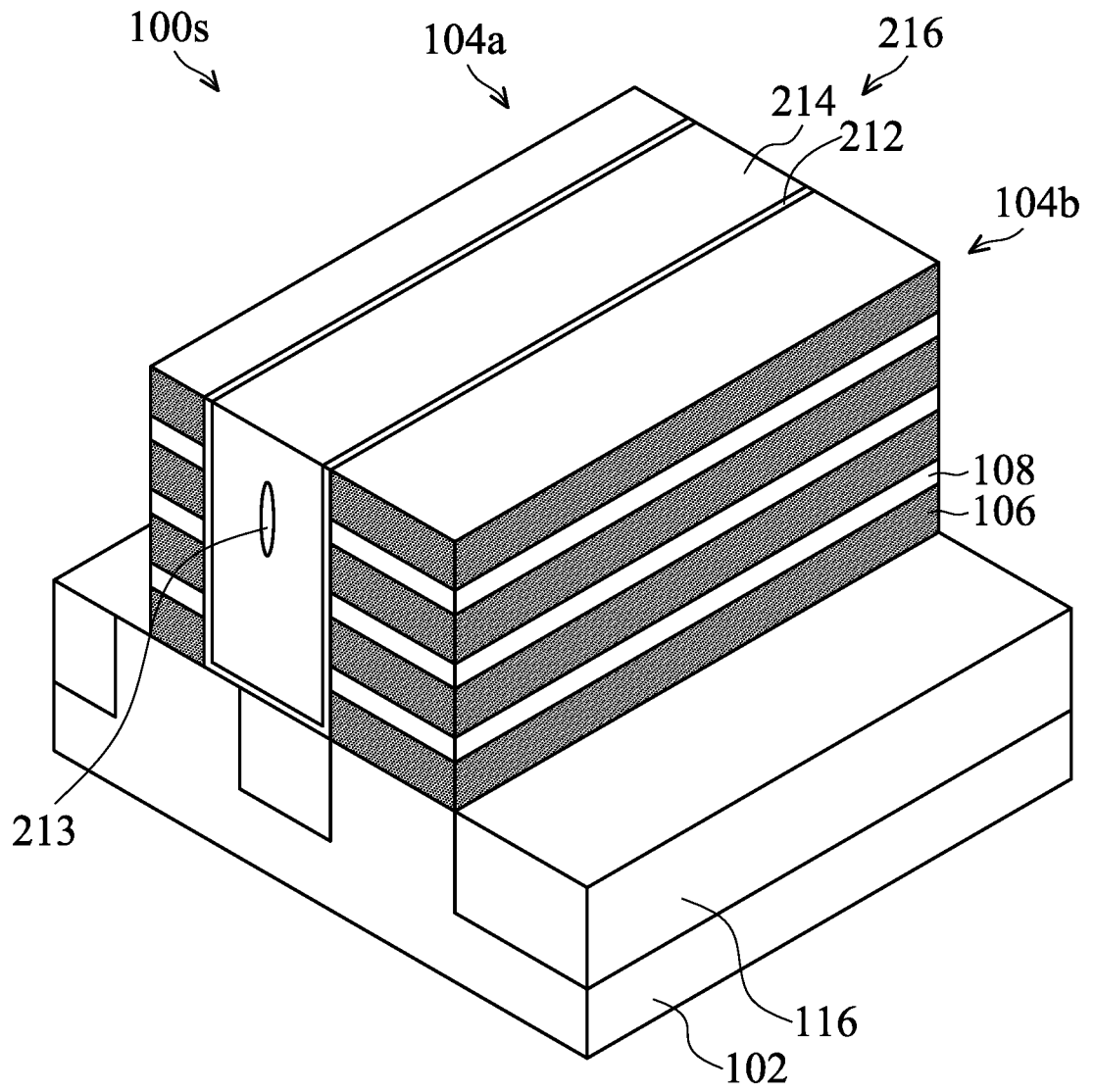
Figure 21C:
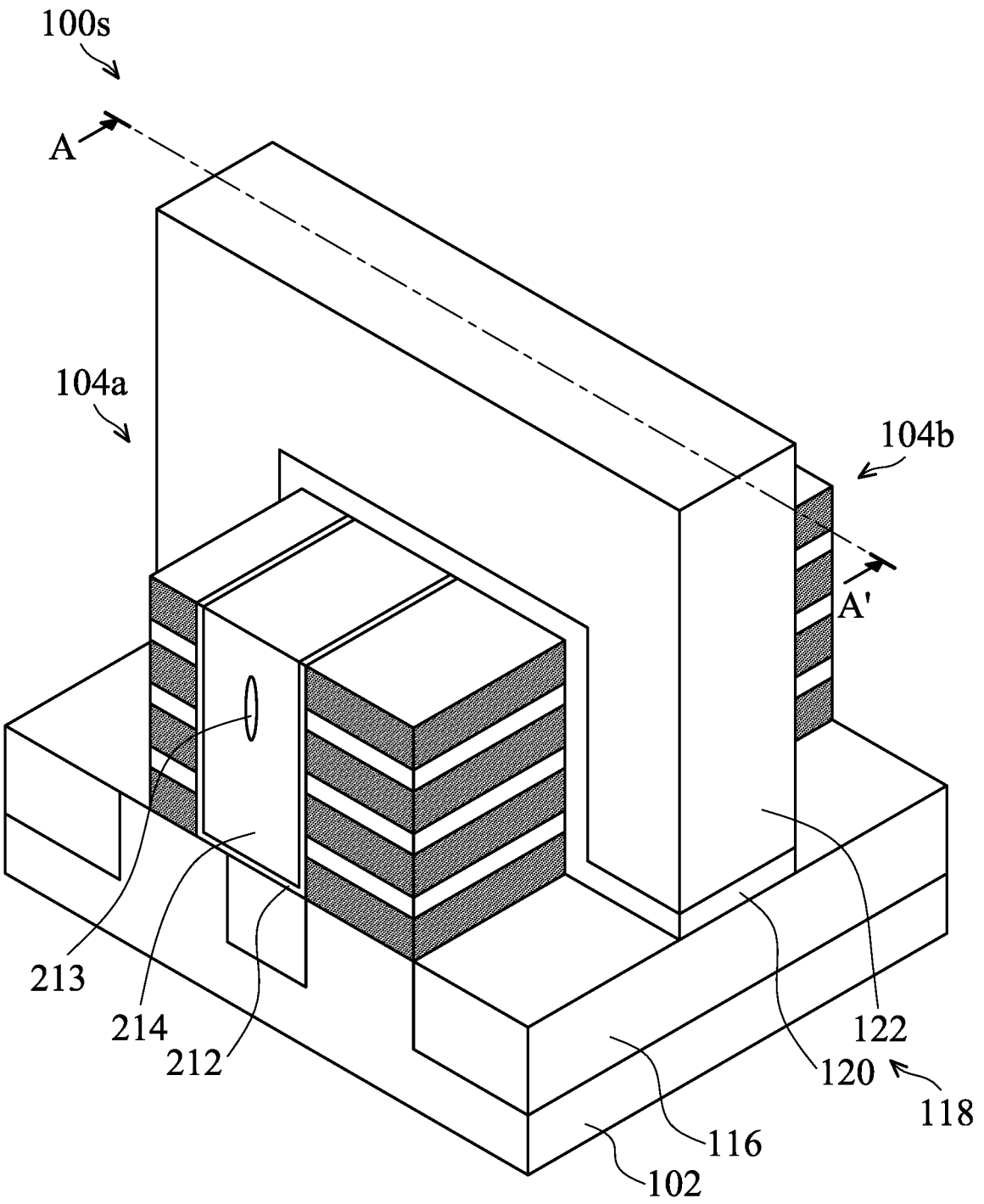

FIGS. 21A to 21C illustrate perspective views of intermediate stages of manufacturing a semiconductor structure 100*s*, in accordance with some embodiments.

The semiconductor structure 100*s* of FIG. 21A includes elements that are similar to, or the same as, elements of the semiconductor structure 100*a* of FIG. 1F.

The first base fin structure 105*a* has the first base width BW₁, and the first fin structure 104*a* has the first sheet width SW₁. The first sheet width SW₁ is greater than the first base width BW₁. The second base fin structure 105*b* has the base width BW₂, and the second fin structure 104*b* has the sheet width SW₂. The second sheet width SW₂ is greater than the second base width BW₂.

Afterwards, as shown in FIG. 21B, a liner dielectric layer 212 is formed over the first stack structure 104*a* and the second stack structure 104*b*, and a core dielectric layer 214 is formed over the liner dielectric layer 212, in accordance with some embodiments. The liner dielectric layer 212 is an adhesion layer to improve the adhesion between the core dielectric layer 214 and the first fin structure 104*a* and the second fin structure 104*b*. During formation of the core dielectric layer 214, a void 213 is formed in the core dielectric layer 214.

In some embodiments, the liner dielectric layer 212 is made of oxide, such as silicon oxide. In some embodiments, the liner dielectric layer 212 is formed by chemical vapor deposition (CVD), atomic vapor deposition (ALD), physical vapor deposition (PVD), another suitable method, or a combination thereof. In some embodiments, the core dielectric layer 214 is made of SiN, SiCN, SiOC, SiOCN or applicable material. In some embodiments, the core dielectric layer 214 is formed by chemical vapor deposition (CVD), atomic vapor deposition (ALD), physical vapor deposition (PVD), another suitable method, or a combination thereof.

Next, a portion of the liner dielectric layer 212 and a portion of the core dielectric layer 214 are removed to form a dielectric wall 216 between two adjacent first fin structure 104*a* and the second fin structure 104*b*. More specifically, the dielectric wall 216 is in direct contact with the first semiconductor layers 106 and the second semiconductor layers 108. The dielectric wall 216 is in direct contact with the isolation structure 116. The top surface of the core dielectric layer 214 is substantially level with the top surface of the topmost second semiconductor layer 108.

Afterwards, as shown in FIG. 21C, after the dielectric wall 216 is formed, a dummy gate structure 118 is formed across the first stack structure 104*a* and the second stack structure 104*b* and extends over the isolation structure 110, in accordance with some embodiments. In some embodiments, the dummy gate structure 118 includes a dummy gate dielectric layer 120 and a dummy gate electrode layer 122.

In some embodiments, the dummy gate dielectric layer 120 are made of one or more dielectric materials, such as silicon oxide, silicon nitride, silicon oxynitride (SiON), HfO₂, HfZrO, HfSiO, HfTiO, HfAlO, or a combination thereof. In some embodiments, the dummy gate dielectric layer 120 is formed using thermal oxidation, chemical vapor deposition (CVD), atomic vapor deposition (ALD), physical vapor deposition (PVD), another suitable method, or a combination thereof. In some embodiments, the dummy gate electrode layer 122 includes polycrystalline-silicon (poly-Si), poly-crystalline silicon-germanium (poly-SiGe), metal-lic nitrides, metallic silicides, metals, or a combination thereof. In some embodiments, the dummy gate electrode layer 122 is formed using chemical vapor deposition (CVD), physical vapor deposition (PVD), or a combination thereof.

Figure 22:
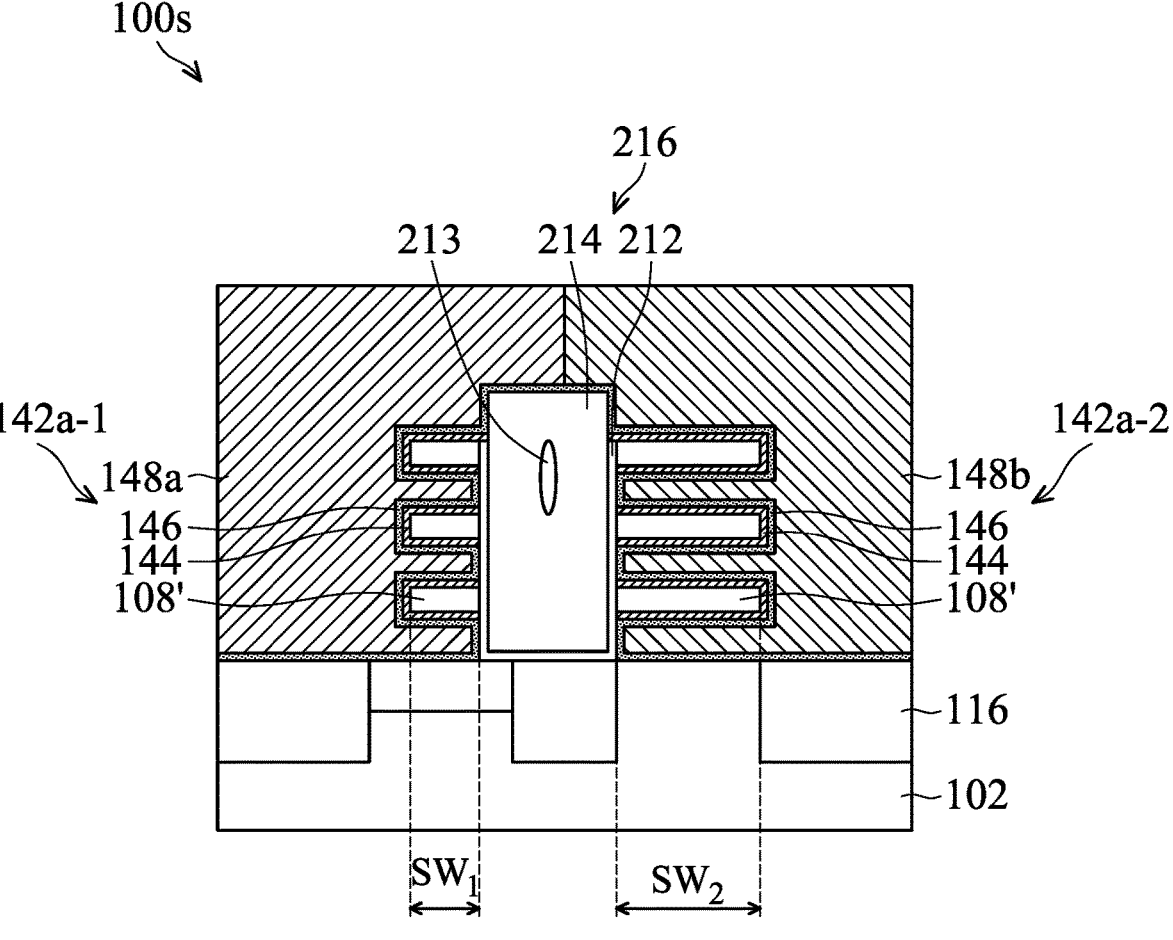
FIG. 22 shows a cross-sectional representation of the semiconductor structure 100s shown along line A-A' in FIG. 21C, in accordance with some embodiments.

FIG. 22 shows a cross-sectional representation of the semiconductor structure 100$s$ shown along line A-A' in FIG. 21C, in accordance with some embodiments.

As shown in FIG. 22, a first gate electrode layer 148$a$ is formed to surround the nanostructures 108', a second gate electrode layer 148$b$ is formed to surround the nanostruc-tures 108', in accordance with some embodiments. The dummy gate structure 118 is replaced with the first portion 142$a$-1 of the first gate structure 142$a$ and the second portion 142$a$-2 of the first gate structure 142$a$. The top surface of the dielectric wall 216 is higher than the topmost nanostructure 108'.

A first portion 142$a$-1 of the first gate structure 142$a$ is constructed by the interfacial layer 144, the gate dielectric layer 146, and the first gate electrode layer 148$a$. A second portion 142$a$-2 of the first gate structure 142$a$ is constructed by the interfacial layer 144, the gate dielectric layer 146, and the second gate electrode layer 148$b$. The material of the second gate electrode layer 148$b$ is different from that of the first gate electrode layer 148$a$. There is an interface between the first gate electrode layer 148$a$ and the second gate electrode layer 148$b$.

The first sheet width $SW_1$ of each of the nanostructures 108' of the first fin structure 104$a$ is smaller width than the second sheet width $SW_2$ of the nanostructures 108' of the second fin structure 104$b$. The reduced first sheet width $SW_1$ of the nanostructures 108' of the first fin structure 104$a$ can applied to low power device for power saving. In order to fulfill different needs in a region, the first portion 142$a$-1 of the first gate structure 142$a$ is formed for power efficiency, and the second portion 142$a$-2 of the first gate structure 142$a$ is formed for high speed performance. The first portion 142$a$-1 of the first gate structure 142$a$ and second portion 142$a$-2 of the first gate structure 142$a$ co-exist to achieve multi-nanostructures for speed performance and power effi-ciency. Therefore, the performance of the semiconductor structure is improved.

It should be appreciated that the semiconductor structures 100$a$ to 100$s$ having different number of nanostructures 108' (or channel layers) in different region for performing dif-ferent functions described above may also be applied to FinFET structures, although not shown in the figures.

It should be noted that same elements in FIGS. 1A to 22 may be designated by the same numerals and may include similar or the same materials and may be formed by similar or the same processes; therefore such redundant details are omitted in the interest of brevity. In addition, although FIGS. 1A to 22 are described in relation to the method, it will be appreciated that the structures disclosed in FIGS. 1A to 22 are not limited to the method but may stand alone as structures independent of the method. Similarly, although the methods shown in FIGS. 1A to 22 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illus-trated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approxi-mation.

Embodiments for forming semiconductor structures may be provided. The semiconductor structure includes a first fin structure and a second fin structure formed over a substrate. The first fin structure includes first nanostructures, and the second fin structure includes second nanostructures along a first direction (e.g. x-axis). A first gate structure formed over the first nanostructures and a first S/D structure adjacent to the first gate structure. For power saving or power efficiency, the portion of the first fin structure is removed to reduce the width of the first nanostructures. The width of each of the first nanostructures is smaller width than that of the second nanostructures. The reduced width of the first nanostructures can applied to low power device for power saving. In order to fulfill different needs in a region, the first gate structure is formed for power efficiency, and the second gate structure is formed for high speed performance. The first gate structure and second gate structure co-exist to achieve multi-nano-structures for speed performance and power efficiency. Therefore, the performance of the semiconductor structure is improved.

In some embodiments, a semiconductor structure is pro-vided. The semiconductor structure includes first nanostruc-tures formed over a substrate along a first direction, and second nanostructures formed over the substrate along the first direction. The semiconductor structure includes a first gate structure formed over the first nanostructures and the second nanostructures along a second direction. Each of the first nanostructures has a first width along the second direction, each of the second nanostructures has a second width along the second direction, and the first width is smaller than the second width. The semiconductor structure includes a first base fin structure below the first nanostruc-tures, and the first base fin structure has a first base width, and the first base width is greater than the first width.

In some embodiments, a semiconductor structure is pro-vided. The semiconductor structure includes first channel layers formed over a first base fin structure along a first direction, and second channel layers formed over a second base fin structure along the first direction. The semiconduc-tor structure includes a first gate structure formed over the first channel layers along a second direction, and a second gate structure formed over the second channel layers along the second direction. The semiconductor structure includes each of the first channel layers has a first width along the second direction, each of the second channels layers has a second width along the second direction, the first base fin structure has a first base width, and the first base width is greater than the first width, the second base fin structure has a second base width, and the second base width is greater than the second width, and a difference between the first base width and the first width is greater than a difference between the second base width and the second width.

In some embodiments, a method for forming a semiconductor structure is provided. The method includes forming a first fin structure and a second fin structure over a first region and a second region of a substrate, and the first fin structure includes first semiconductor material layers and second semiconductor material layers alternately stacked, and the second fin structure includes first semiconductor material layers and second semiconductor material layers alternately stacked. The method includes removing a portion of the first fin structure, such that a width of the first fin structure is reduced, and forming a first dummy gate structure over the first fin structure and the second fin structure along a second direction. The method includes removing the first dummy gate structure to expose the first fin structure and the second fin structure, and removing all of the second semiconductor material layers to expose the first semiconductor material layers. The method also includes forming a first gate structure to wrap around the first semiconductor material layers of the first fin structure and the first semiconductor material layers of the second fin structure, such that first nanostructures and second nanostructures are formed. Each of the first nanostructures has a first width along the second direction, and each of the second nanostructures has a second width along the second direction. The first width is smaller than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
first nanostructures formed over a substrate along a first direction;
second nanostructures formed over the substrate along the first direction;
an isolation structure formed over the substrate;
a first gate structure formed over the first nanostructures and the second nanostructures along a second direction, wherein each of the first nanostructures has a first width along the second direction, each of the second nanostructures has a second width along the second direction, and the first width is smaller than the second width; and
a first base fin structure below the first nanostructures, wherein the first base fin structure has a first base width, and the first base width is greater than the first width, and a top surface of the first base fin structure is higher than a top surface of the isolation structure.

2. The semiconductor structure as claimed in claim 1, further comprising:
a second base fin structure below the second nanostructures, wherein the second base fin structure has a second base width, and the second base width is greater than the second width.

3. The semiconductor structure as claimed in claim 1, wherein the first nanostructures has a curved sidewall surface.

4. The semiconductor structure as claimed in claim 1, wherein a first number of first nanostructures directly below the first gate structure is smaller than a second number of second nanostructures directly below the first gate structure.

5. The semiconductor structure as claimed in claim 1, further comprising:
a dielectric structure between the first nanostructures and the second nanostructures, wherein a bottom surface of the dielectric structure is lower than a bottommost first nanostructure.

6. The semiconductor structure as claimed in claim 1, further comprising:
a gate spacer layer adjacent to the first gate structure, wherein the first gate structure has a continuous sidewall surface in direct contact with the gate spacer layer, and a bottom surface of the continuous sidewall surface of the first gate structure is lower than a bottom surface of the gate spacer layer.

7. The semiconductor structure as claimed in claim 6, wherein the continuous sidewall surface of the first gate structure is in direct contact with a topmost nanostructure.

8. The semiconductor structure as claimed in claim 1, wherein each of the first nanostructures has a first thickness along a vertical direction, each of the second nanostructures has a second thickness along the vertical direction, and the first thickness is smaller than the second thickness.

9. The semiconductor structure as claimed in claim 1, further comprising:
a semiconductor material layer formed below a bottommost first nanostructure, wherein the semiconductor material layer and the bottommost first nanostructure are made of different materials.

10. The semiconductor structure as claimed in claim 1, further comprising:
a dielectric wall between the first nanostructures and the second nanostructures, wherein a top surface of the dielectric wall is higher than a topmost first nanostructures.

11. A semiconductor structure, comprising:
first channel layers formed over a first base fin structure along a first direction;
second channel layers formed over a second base fin structure along the first direction;
a first gate structure formed over the first channel layers along a second direction; and
a second gate structure formed over the second channel layers along the second direction,
wherein each of the first channel layers has a first width along the second direction, each of the second channels layers has a second width along the second direction, the first base fin structure has a first base width, and the first base width is greater than the first width, the second base fin structure has a second base width, and the second base width is greater than the second width, and a difference between the first base width and the first width is greater than a difference between the second base width and the second width.

12. The semiconductor structure as claimed in claim 11, further comprising:
a dielectric structure formed between the first gate structure and second gate structure, wherein a bottom surface of the dielectric structure is lower than a bottommost first channel layer.

13. The semiconductor structure as claimed in claim 11, further comprising:

a gate spacer layer adjacent to the first gate structure, wherein the first gate structure has a continuous sidewall surface in direct contact with the gate spacer layer, and a bottom surface of the continuous sidewall surface of the first gate structure is lower than a bottom surface of the gate spacer layer.

14. The semiconductor structure as claimed in claim 13, further comprising:

a first number of first channel layers is smaller than a second number of second channel layers.

15. The semiconductor structure as claimed in claim 11, further comprising:

a first S/D structure formed adjacent to the first channel layers; and a second S/D structure formed adjacent to the second channel layers, wherein a depth of the second S/D structure is greater than a depth of the first S/D structure.

16. The semiconductor structure as claimed in claim 11, further comprising:

a first S/D structure formed adjacent to the first channel layers; and a bottom isolation layer below the first S/D structure.

17. A method for forming a semiconductor structure, comprising:

forming a first fin structure and a second fin structure over a first region and a second region of a substrate, wherein the first fin structure comprises first semiconductor material layers and second semiconductor material layers alternately stacked, and the second fin structure comprises first semiconductor material layers and second semiconductor material layers alternately stacked;

removing a portion of the first fin structure, such that a width of the first fin structure is reduced;

forming a first dummy gate structure over the first fin structure and the second fin structure along a second direction;

removing the first dummy gate structure to expose the first fin structure and the second fin structure;

removing all of the second semiconductor material layers to expose the first semiconductor material layers; and forming a first gate structure to wrap around the first semiconductor material layers of the first fin structure and the first semiconductor material layers of the second fin structure, such that first nanostructures and second nanostructures are formed, wherein each of the first nanostructures has a first width along the second direction, each of the second nanostructures has a second width along the second direction, and the first width is smaller than the second width.

18. The method for forming the semiconductor structure as claimed in claim 17, further comprising:

forming a mask layer on the second fin structure; and removing sidewall surfaces of the first fin structure.

19. The method for forming the semiconductor structure as claimed in claim 17, further comprising:

removing a topmost second semiconductor material layer of the first fin structure, such that a first number of first nanostructures is smaller than a second number of second nanostructures.

20. The method for forming the semiconductor structure as claimed in claim 19, further comprising:

forming a dielectric wall between the first fin structure and the second fin structure, wherein a top surface of the dielectric wall is higher than a topmost first nanostructure.

* * * * *